United States Patent
Hosoda et al.

(10) Patent No.: US 9,978,766 B1
(45) Date of Patent: May 22, 2018

(54) THREE-DIMENSIONAL MEMORY DEVICE WITH ELECTRICALLY ISOLATED SUPPORT PILLAR STRUCTURES AND METHOD OF MAKING THEREOF

(71) Applicant: SANDISK TECHNOLOGIES LLC, Plano, TX (US)

(72) Inventors: Naohiro Hosoda, Yokkaichi (JP); Takeshi Kawamura, Yokkaichi (JP); Yoko Furihata, Yokkaichi (JP); Kota Funayama, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/347,101

(22) Filed: Nov. 9, 2016

(51) Int. Cl.
| | |
|---|---|
| *H01L 29/76* | (2006.01) |
| *H01L 27/11556* | (2017.01) |
| *H01L 27/11517* | (2017.01) |
| *H01L 27/11565* | (2017.01) |
| *H01L 27/11524* | (2017.01) |

(Continued)

(52) U.S. Cl.
CPC .... *H01L 27/11556* (2013.01); *H01L 27/1157* (2013.01); *H01L 27/11517* (2013.01); *H01L 27/11524* (2013.01); *H01L 27/11565* (2013.01); *H01L 27/11582* (2013.01)

(58) Field of Classification Search
CPC ................................................ H01L 27/11556
See application file for complete search history.

(56) References Cited

U.S. PATENT DOCUMENTS

| | | |
|---|---|---|
| 5,915,167 A | 6/1999 | Leedy |
| 8,884,357 B2 | 11/2014 | Wang et al. |
| 8,946,023 B2 | 2/2015 | Makala et al. |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Marc Armand
*Assistant Examiner* — Sarah Salerno
(74) *Attorney, Agent, or Firm* — The Marbury Law Group PLLC

(57) ABSTRACT

A first tier structure including a first alternating stack of first insulating layers and first sacrificial material layers is formed over a substrate. First support openings and first memory openings are formed through the first tier structure. A dielectric material portion providing electrical isolation from the substrate is formed in each first memory openings. A second tier structure including a second alternating stack of second insulating layers and second sacrificial material layers is formed the first tier structure. Second support openings and second memory openings are formed through the second tier structure above the first support openings and the first memory openings. Memory stack structures are formed in inter-tier openings formed by adjoining the first and second memory openings. The dielectric material portions provide electrical isolation between the substrate and the vertical semiconductor layers formed within support pillar structures to prevent or reduce electrical shorts to the substrate through the support pillar structures.

26 Claims, 48 Drawing Sheets

(51) Int. Cl.
    *H01L 27/1157*     (2017.01)
    *H01L 27/11582*     (2017.01)

(56) References Cited

U.S. PATENT DOCUMENTS

| | | |
|---|---|---|
| 9,023,719 B2 | 5/2015 | Pachamuthu et al. |
| 9,230,973 B2 | 1/2016 | Pachamuthu et al. |
| 9,230,979 B1 | 1/2016 | Pachamuthu et al. |
| 9,230,987 B2 | 1/2016 | Pachamuthu et al. |
| 9,455,263 B2 | 9/2016 | Zhang et al. |
| 9,530,790 B1 * | 12/2016 | Lu .................... H01L 27/11582 |
| 2013/0065386 A1 * | 3/2013 | Kim .................... H01L 29/7926 438/591 |
| 2015/0076580 A1 | 3/2015 | Pachamuthu et al. |
| 2015/0118811 A1 | 4/2015 | Makala et al. |
| 2015/0294978 A1 | 10/2015 | Lu et al. |
| 2016/0049423 A1 | 2/2016 | Yoo et al. |
| 2016/0268209 A1 | 9/2016 | Pachamuthu et al. |

OTHER PUBLICATIONS

Wong, M. et al., "Wafer Temperature Dependence of the Vapor-Phase HF Oxide Etch," J. Electrochem., Soc., vol. 140, No. 1, pp. 205-208, (1993).
U.S. Appl. No. 14/834,830, filed Aug. 25, 2015, SanDisk Technologies Inc.
U.S. Appl. No. 14/834,943, filed Aug. 25, 2015, SanDisk Technologies Inc.
U.S. Appl. No. 14/862,916, filed Sep. 23, 2015, SanDisk Technologies Inc.
U.S. Appl. No. 14/883,966, filed Oct. 15, 2015, SanDisk Technologies Inc.
U.S. Appl. No. 14/927,708, filed Oct. 30, 2015, SanDisk Technologies Inc.
U.S. Appl. No. 14/927,990, filed Oct. 30, 2015, SanDisk Technologies Inc.
U.S. Appl. No. 14/989,206, filed Jan. 6, 2016, SanDisk Technologies Inc.
U.S. Appl. No. 15/015,190, filed Feb. 4, 2016, SanDisk Technologies Inc.
U.S. Appl. No. 15/071,575, filed Mar. 16, 2016, SanDisk Technologies Inc.
U.S. Appl. No. 15/080,269, filed Mar. 24, 2016, SanDisk Technologies Inc.
U.S. Appl. No. 15/183,195, filed Jun. 15, 2016, SanDisk Technologies LLC.
U.S. Appl. No. 15/186,768, filed Jun. 20, 2016, SanDisk Technologies LLC.
U.S. Appl. No. 15/198,175, filed Jun. 30, 2016, SanDisk Technologies LLC.
U.S. Appl. No. 15/243,260, filed Aug. 22, 2016, SanDisk Technologies LLC.
U.S. Appl. No. 15/296,380, filed Oct. 18, 2016, SanDisk Technologies LLC.
U.S. Appl. No. 15/335,850, filed Oct. 27, 2016, SanDisk Technologies LLC.

\* cited by examiner

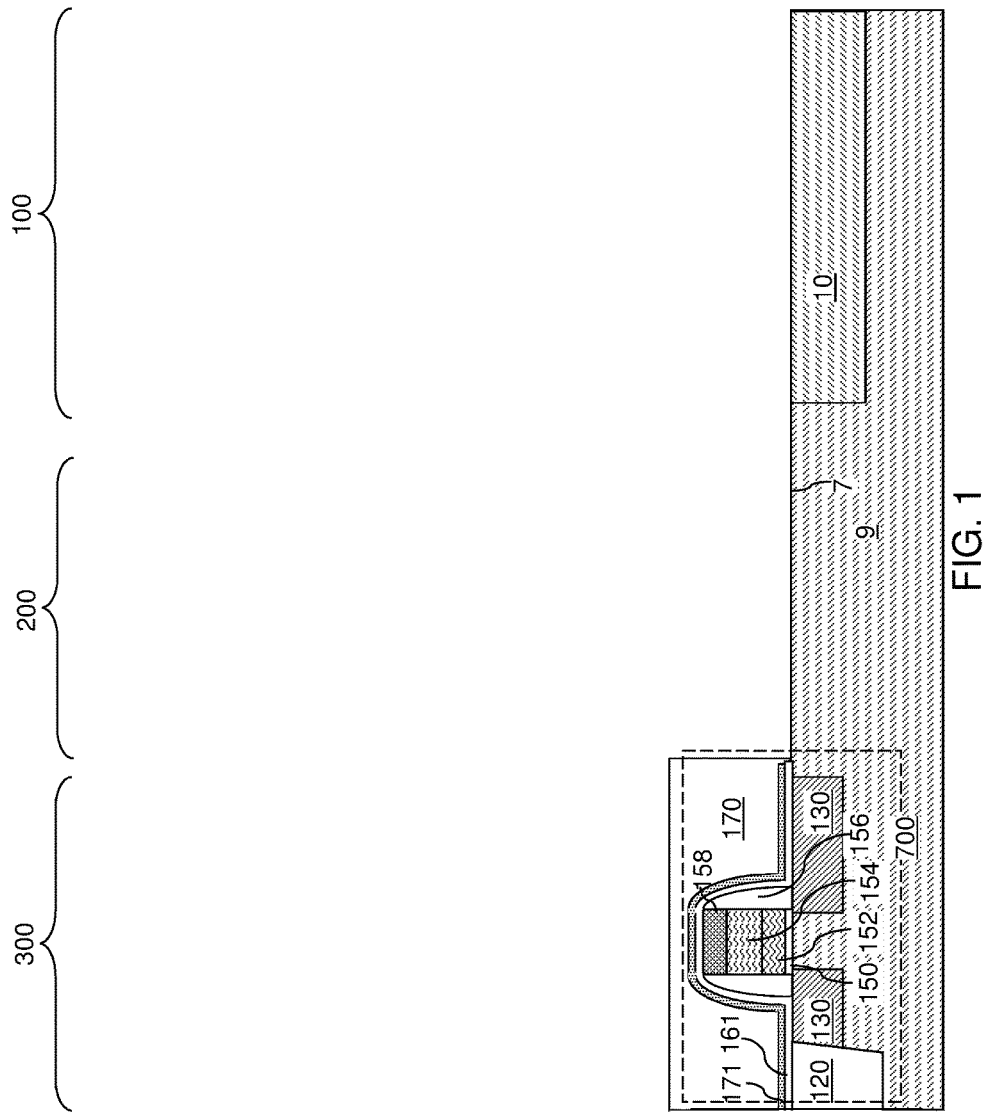

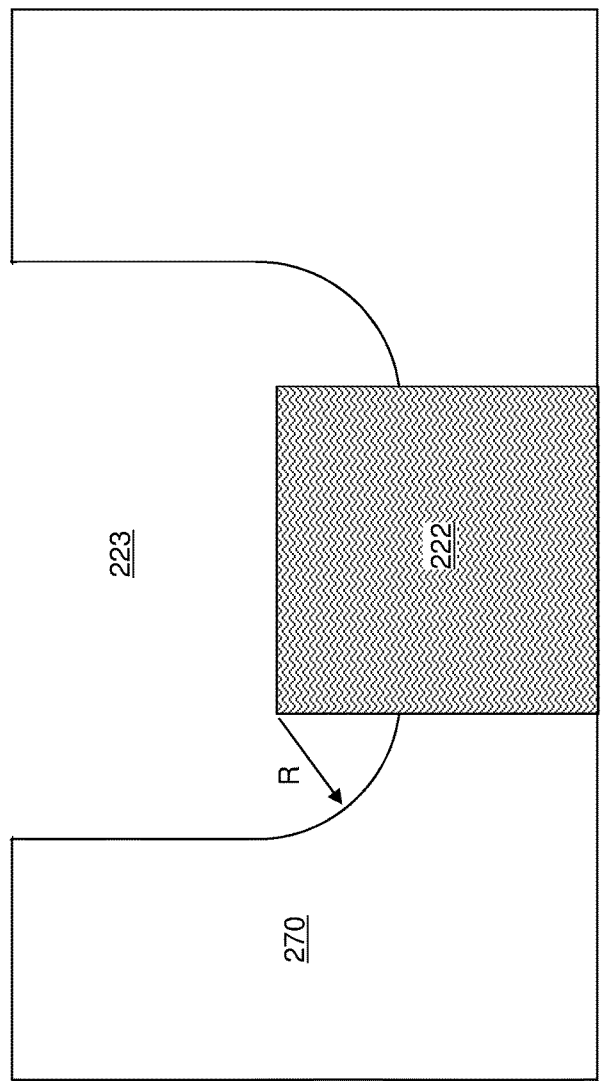

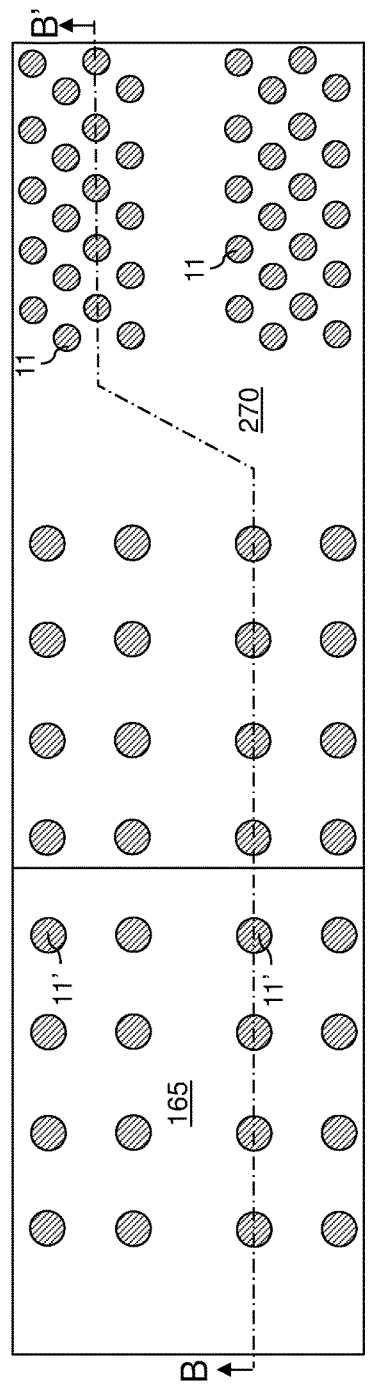
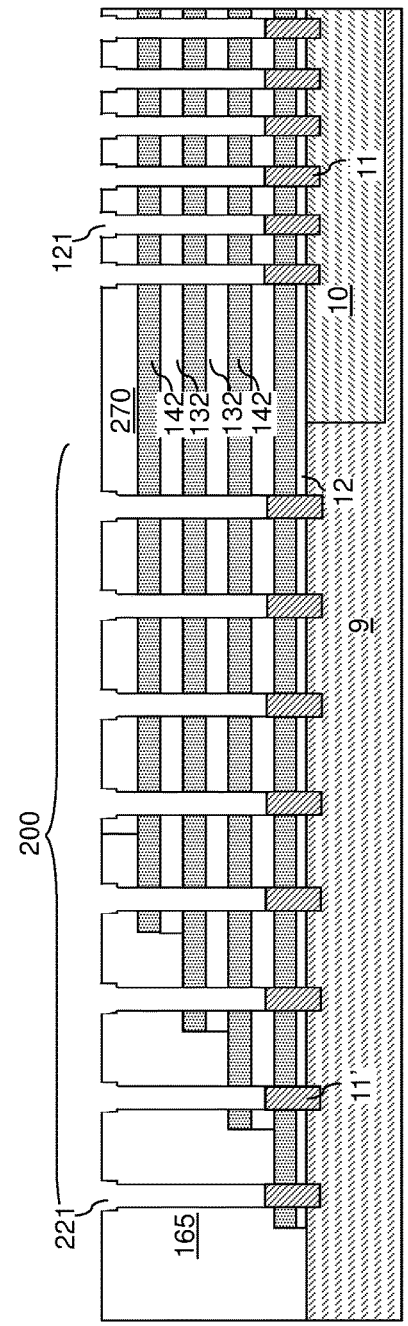
FIG. 8A
FIG. 8B

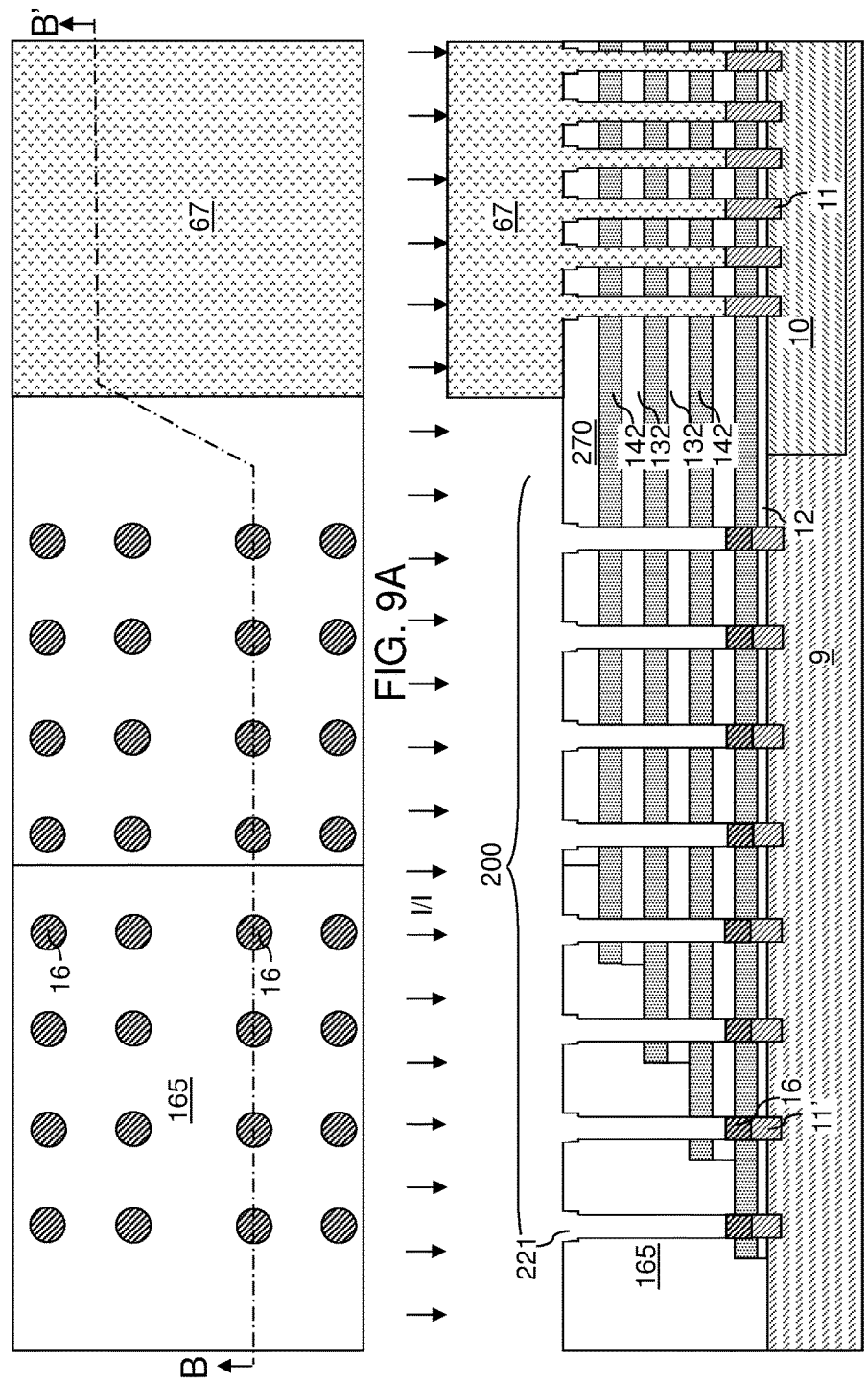

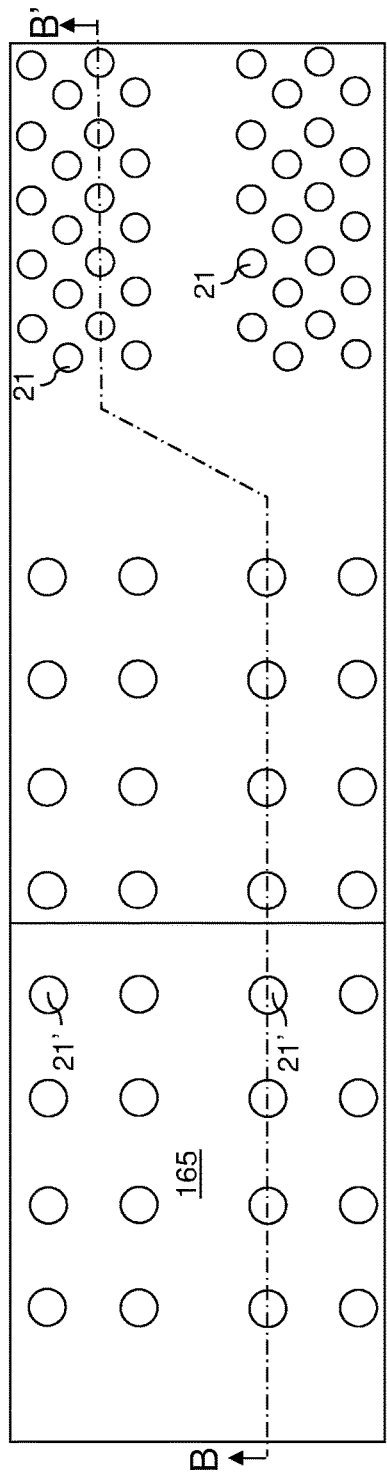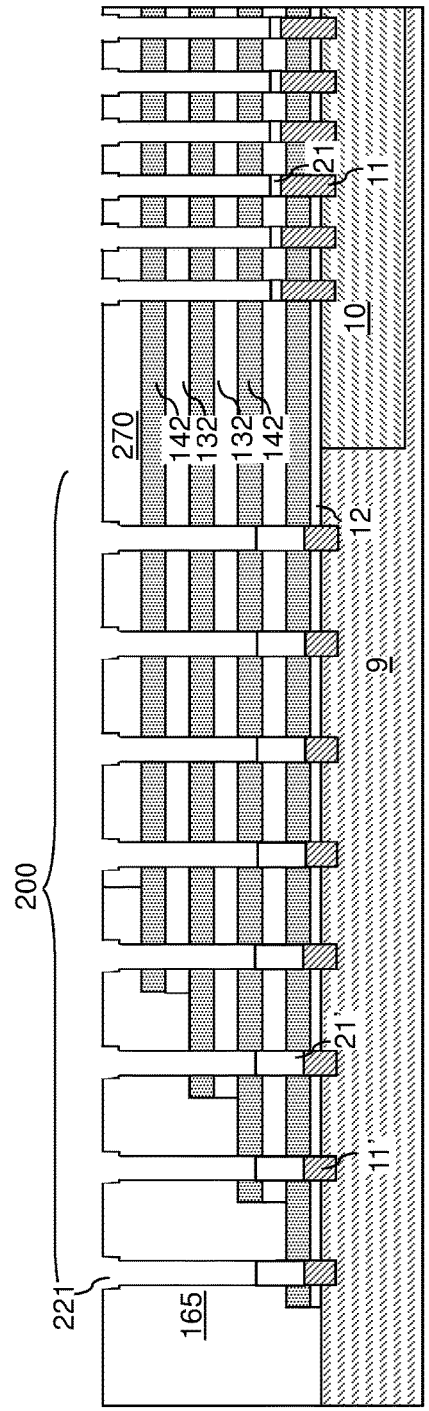
FIG. 10A
FIG. 10B

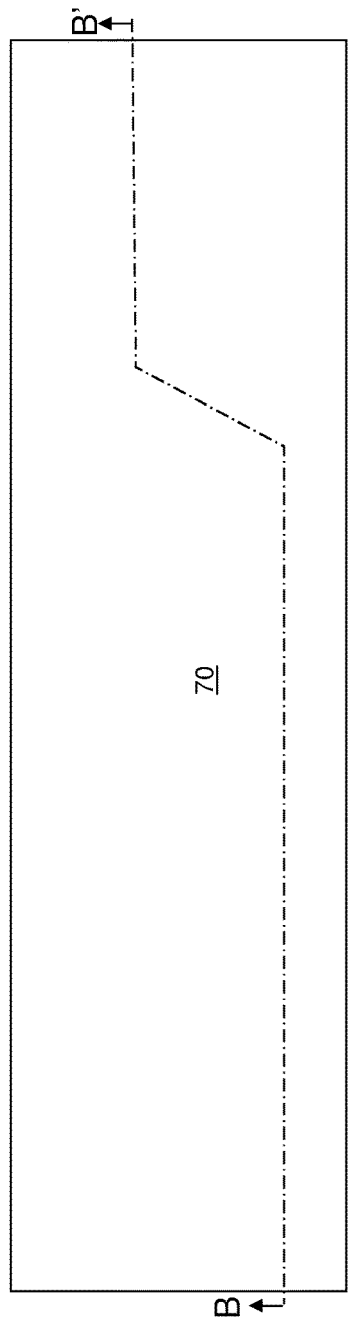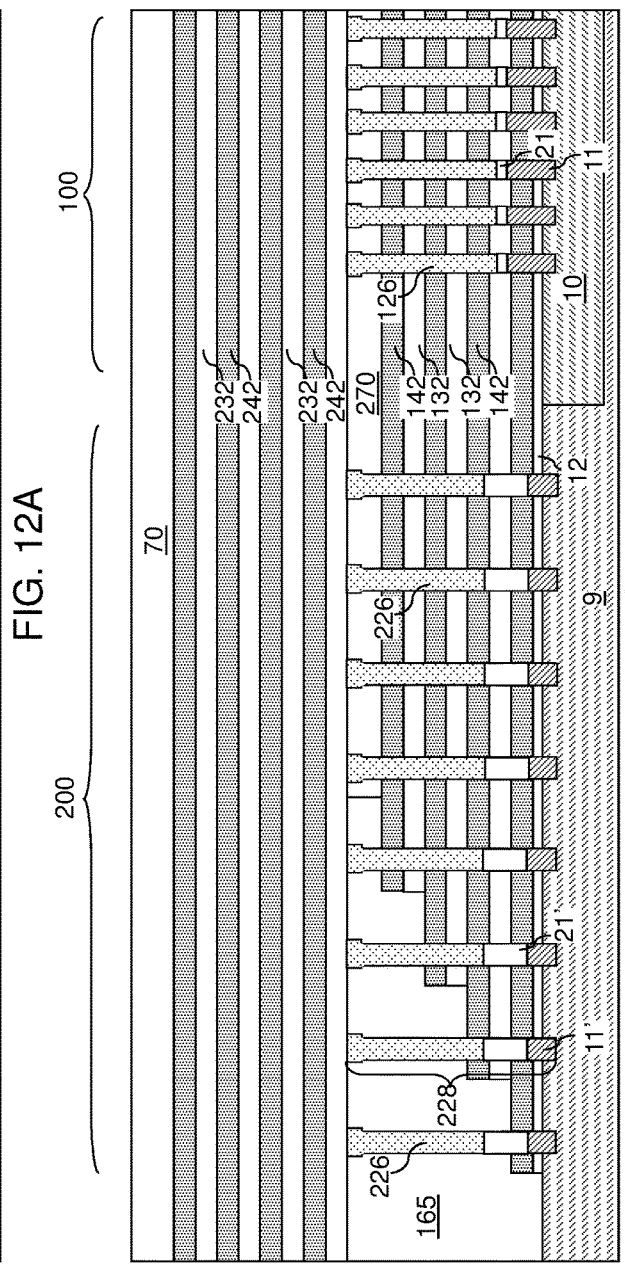

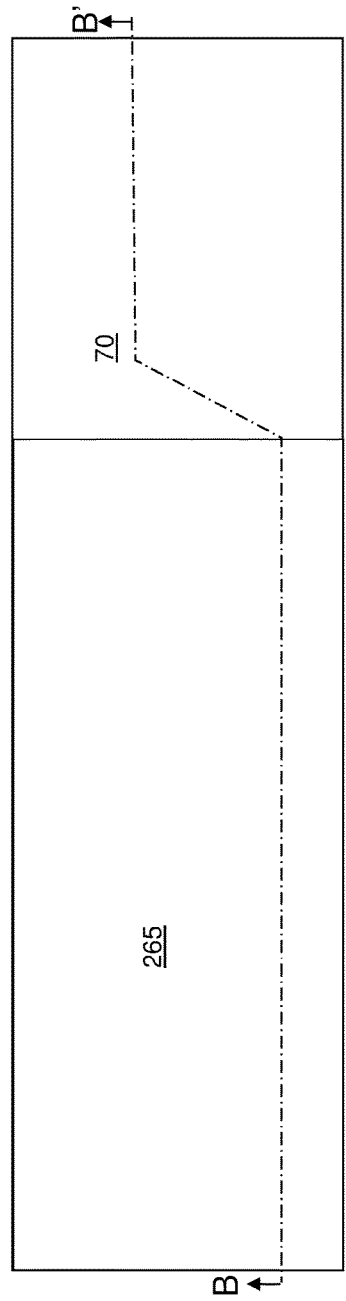
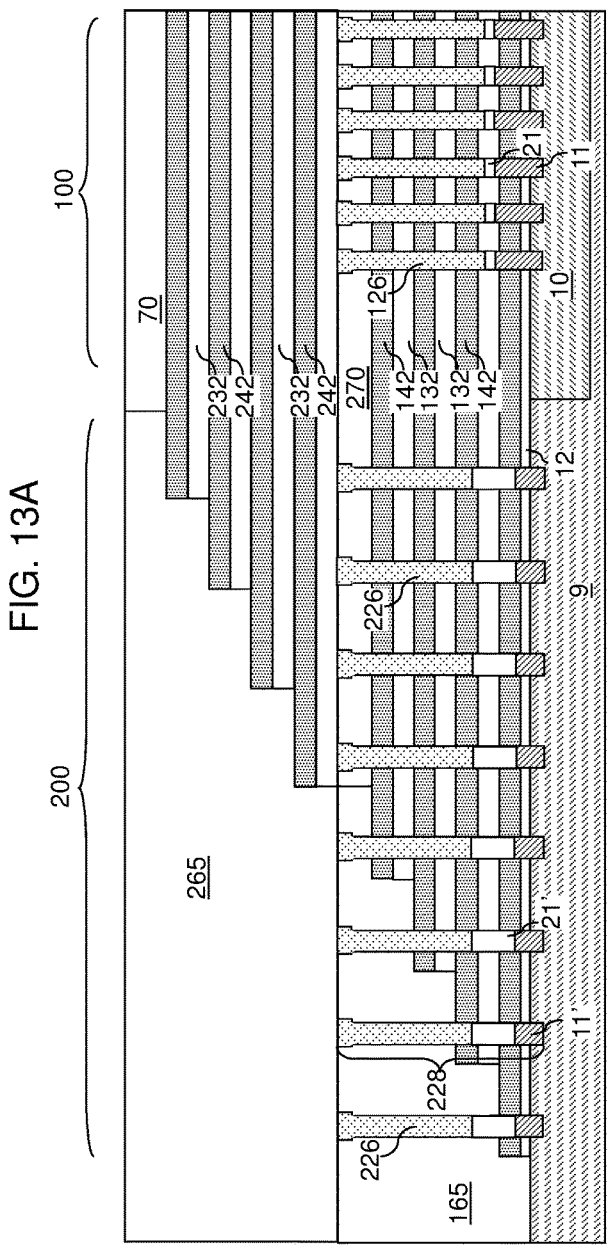
FIG. 13A
FIG. 13B

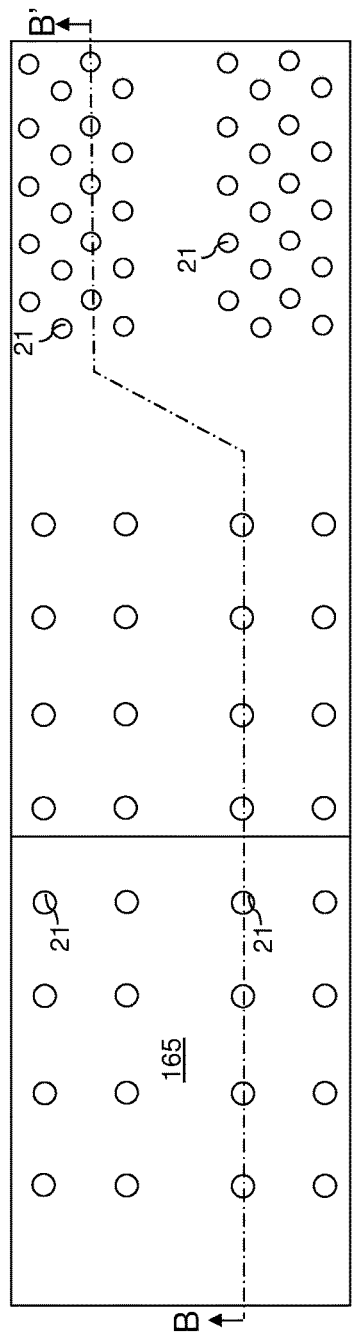
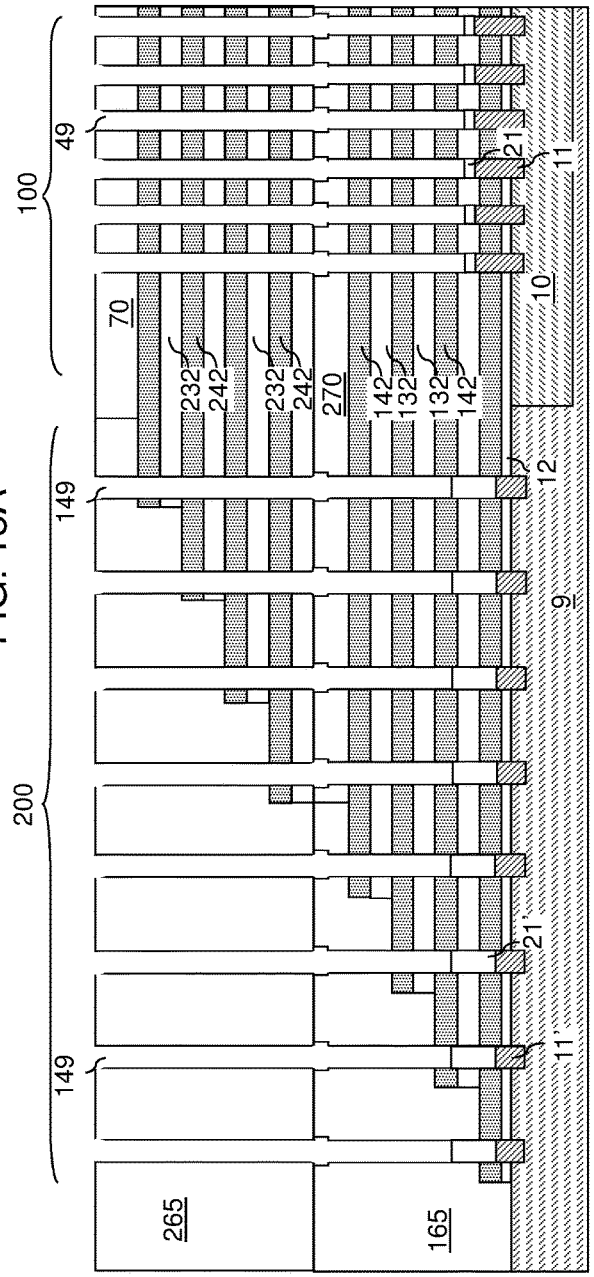
FIG. 15A
FIG. 15B

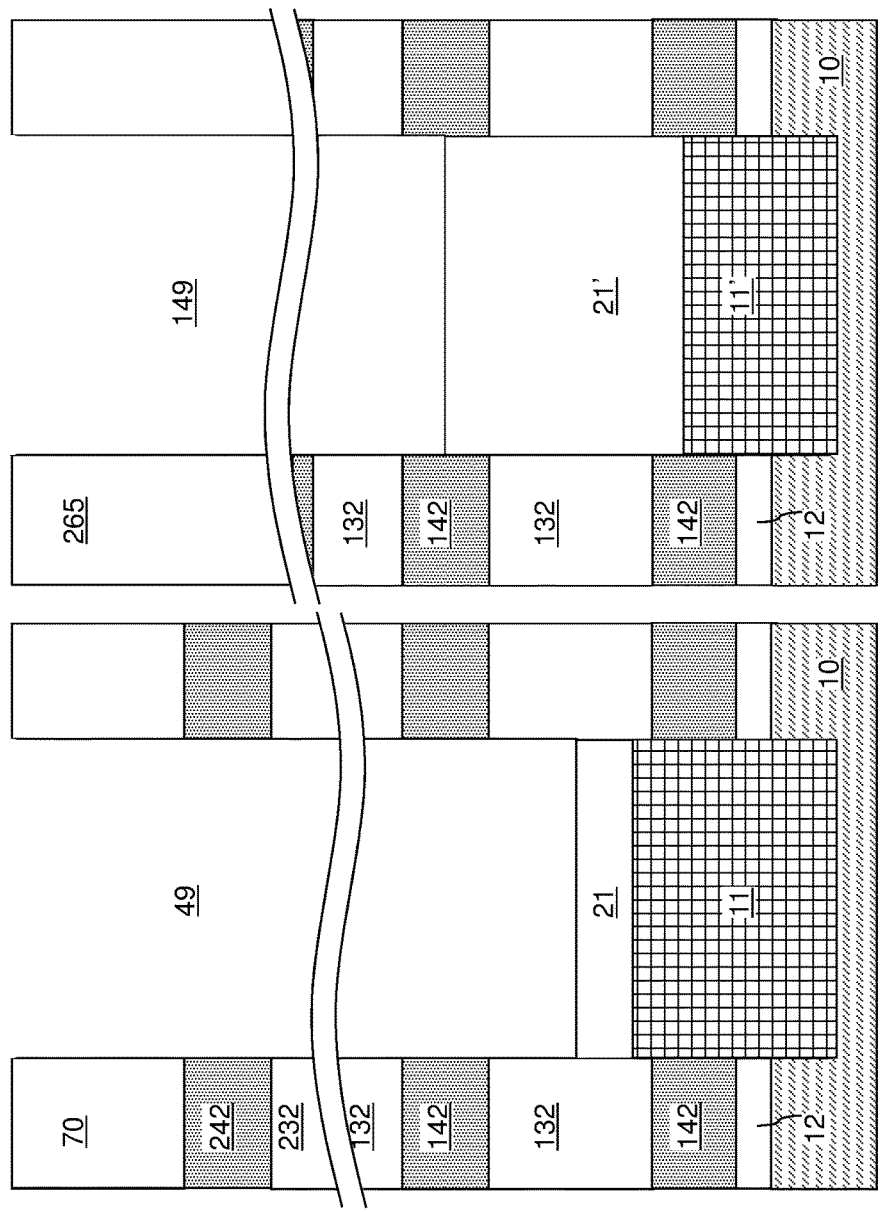

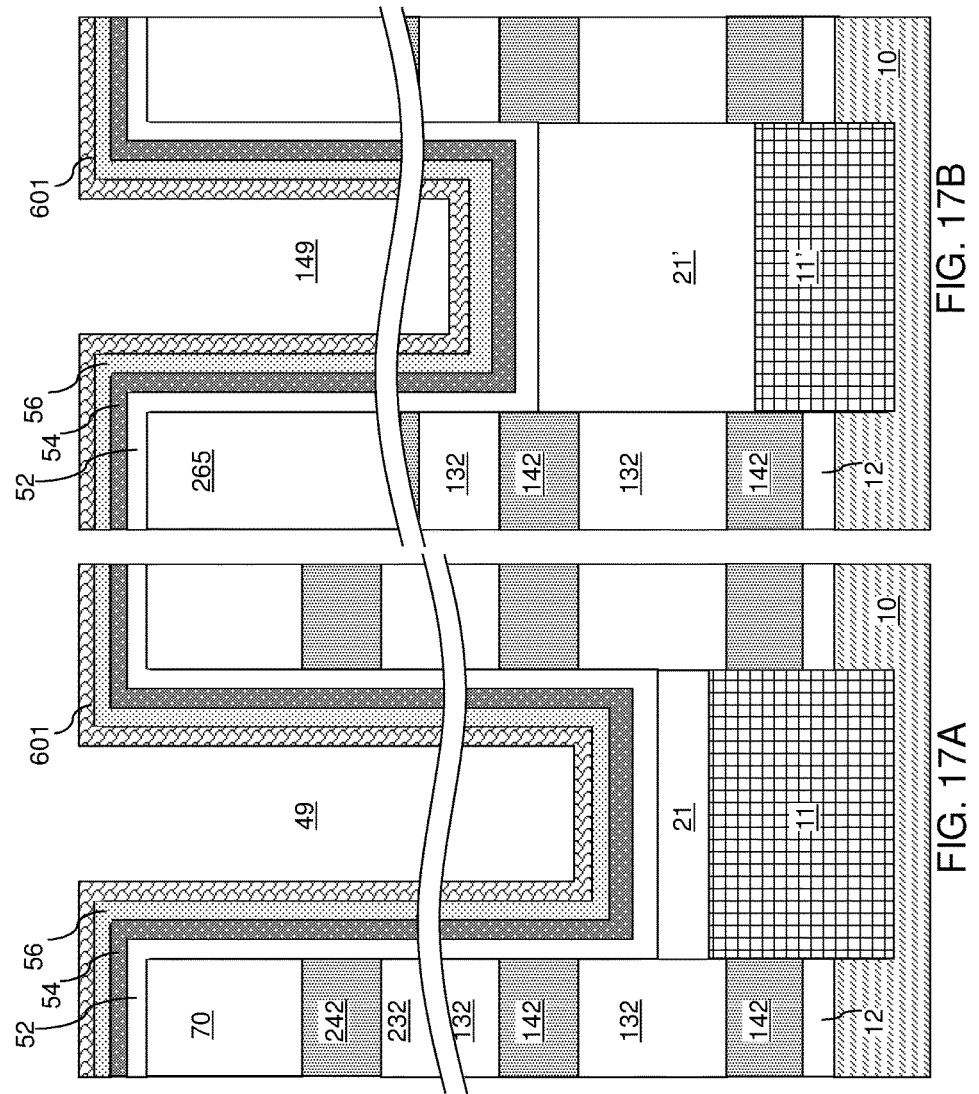

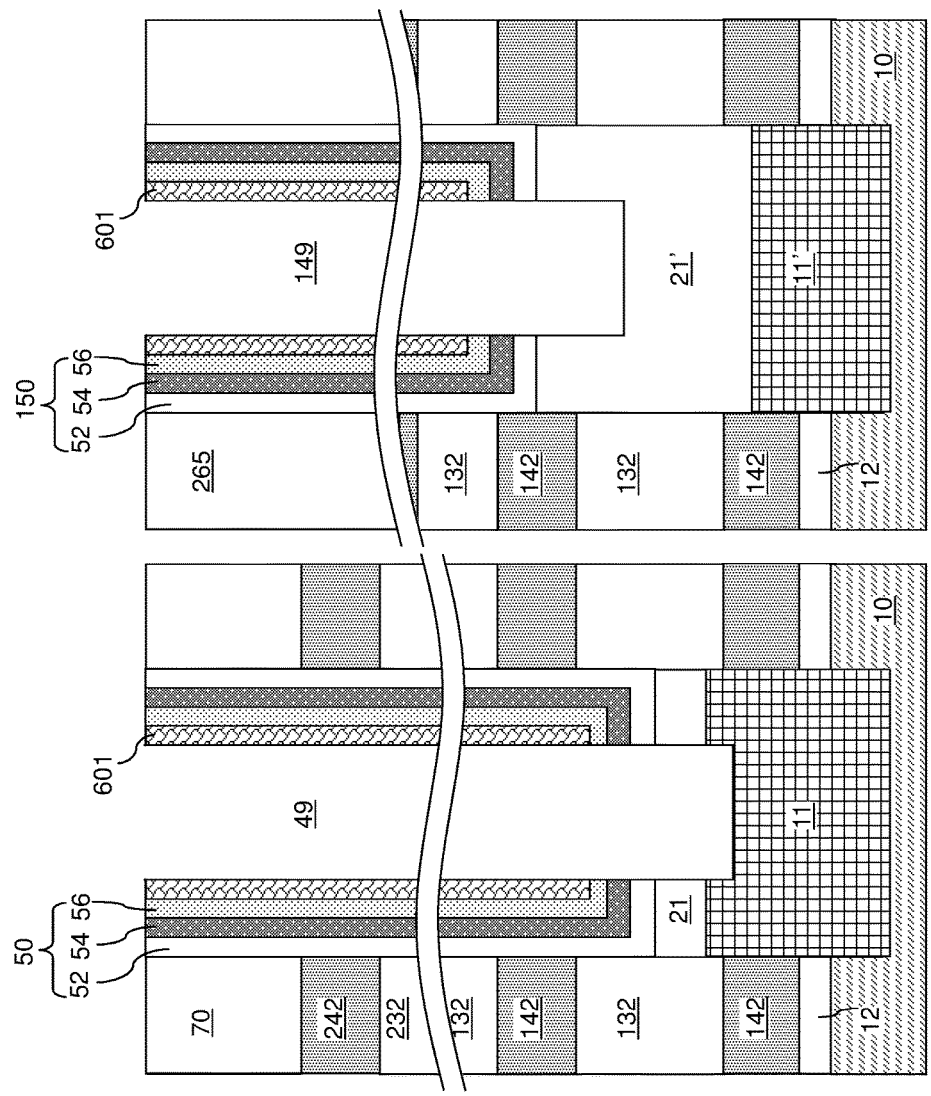

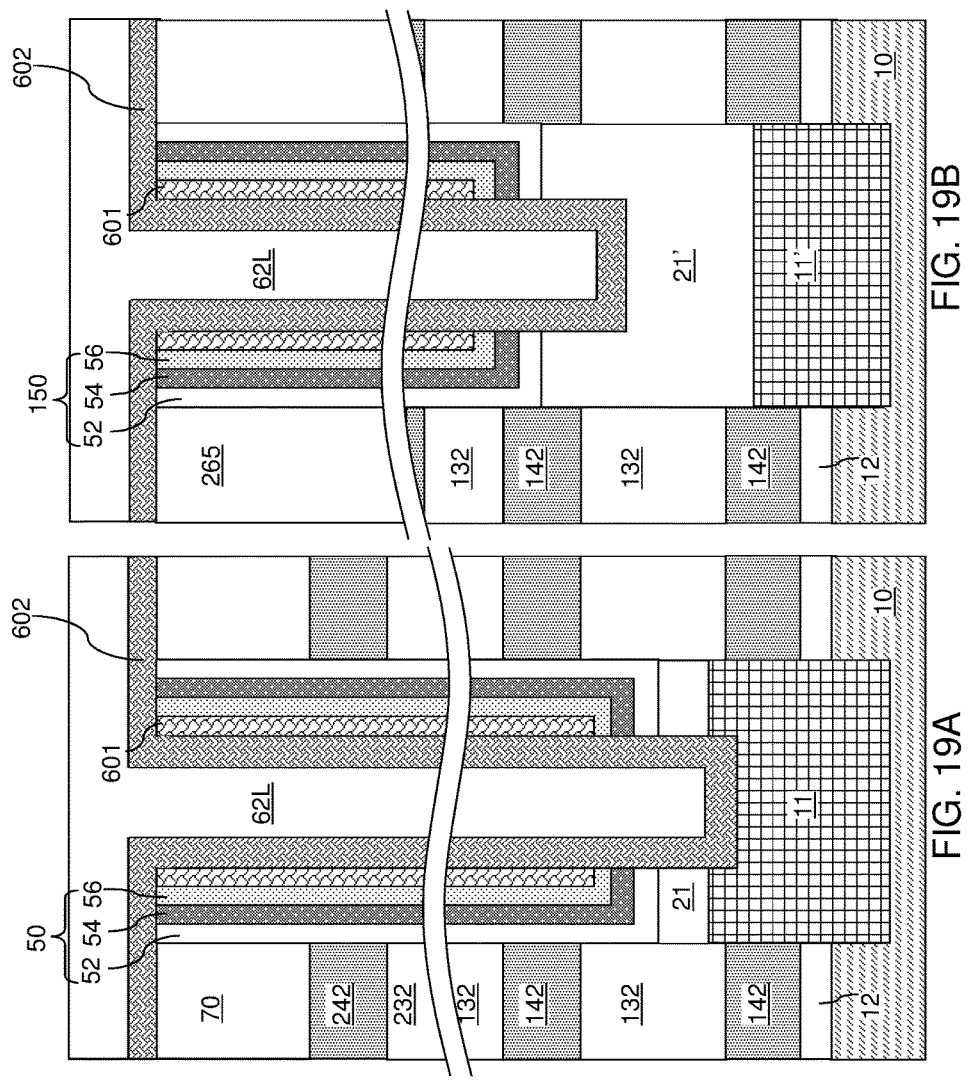

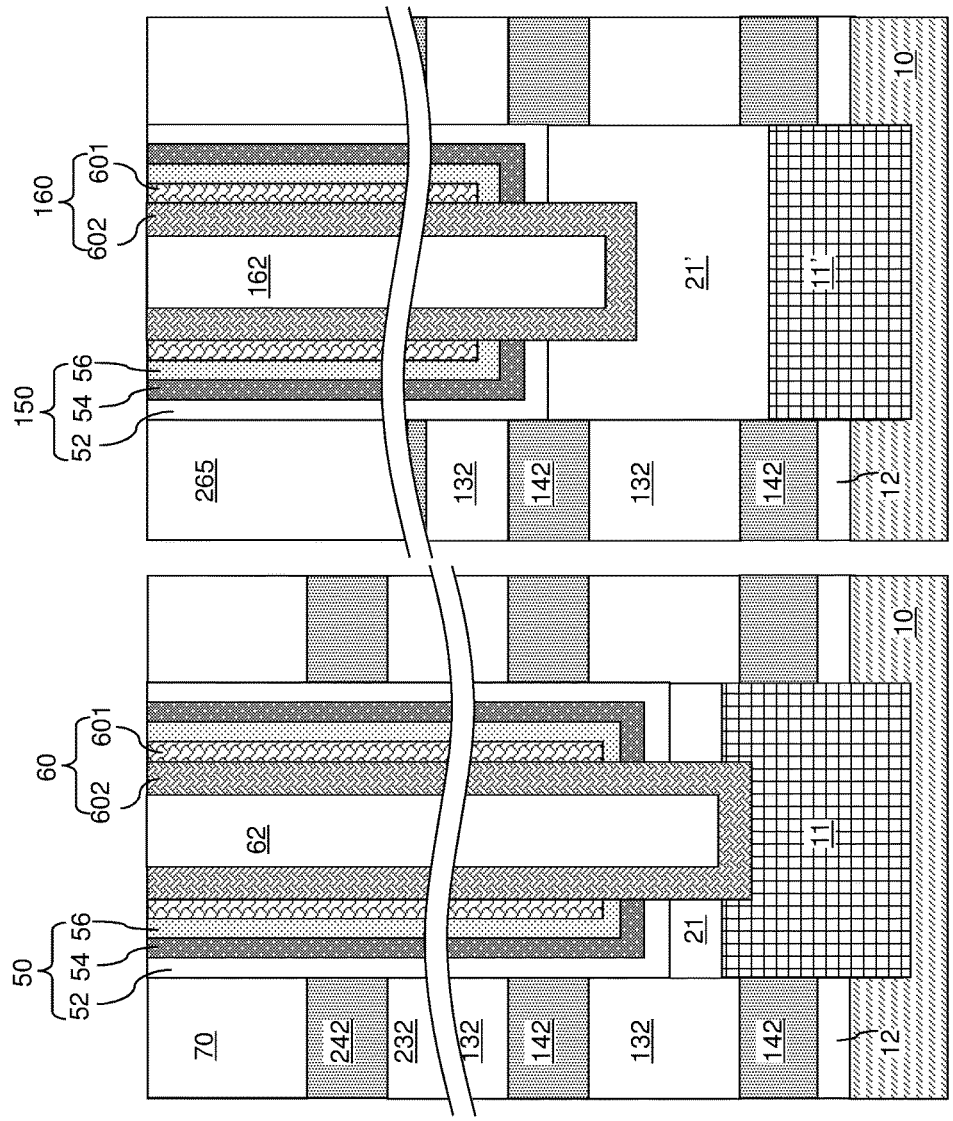

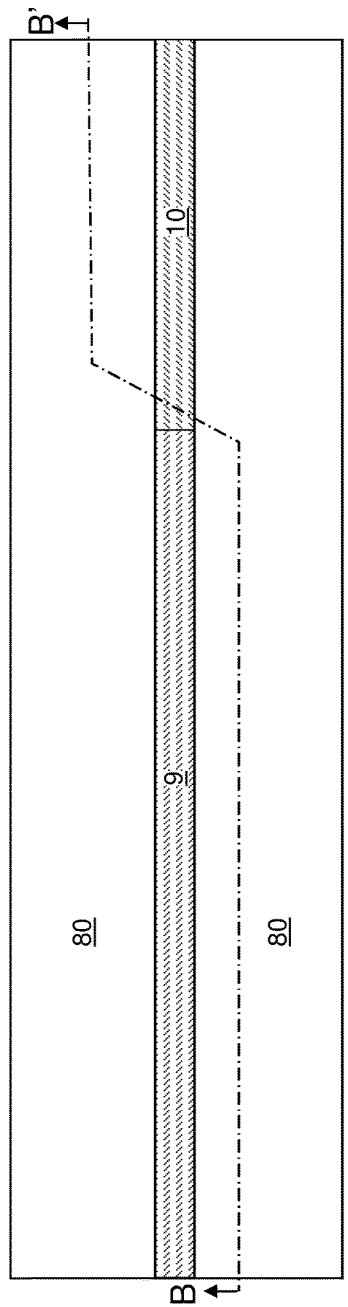
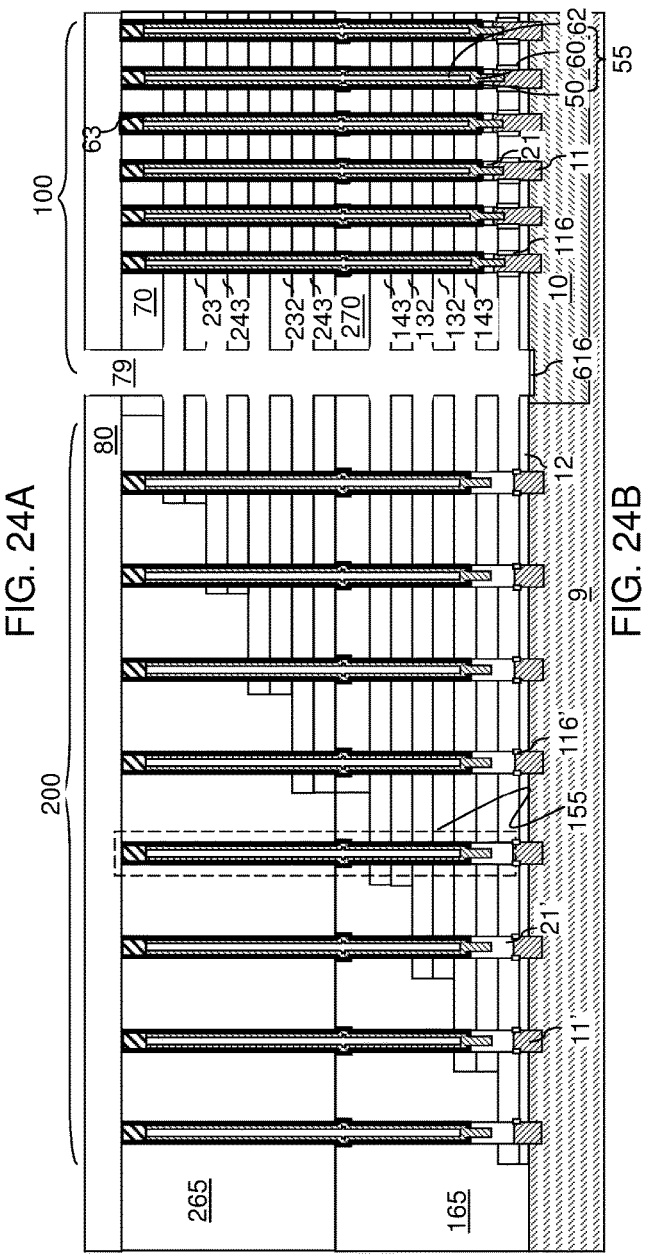
FIG. 24A
FIG. 24B

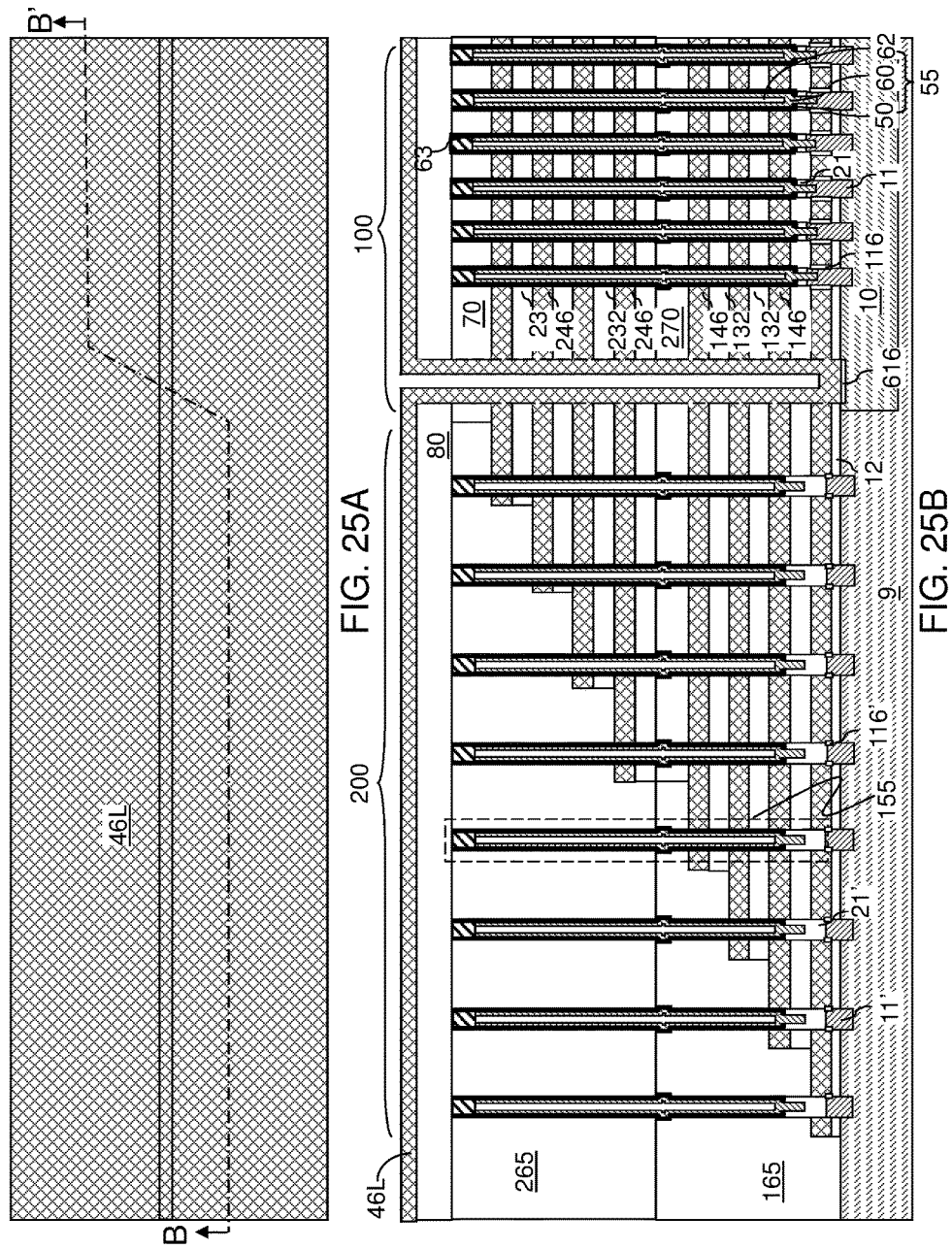

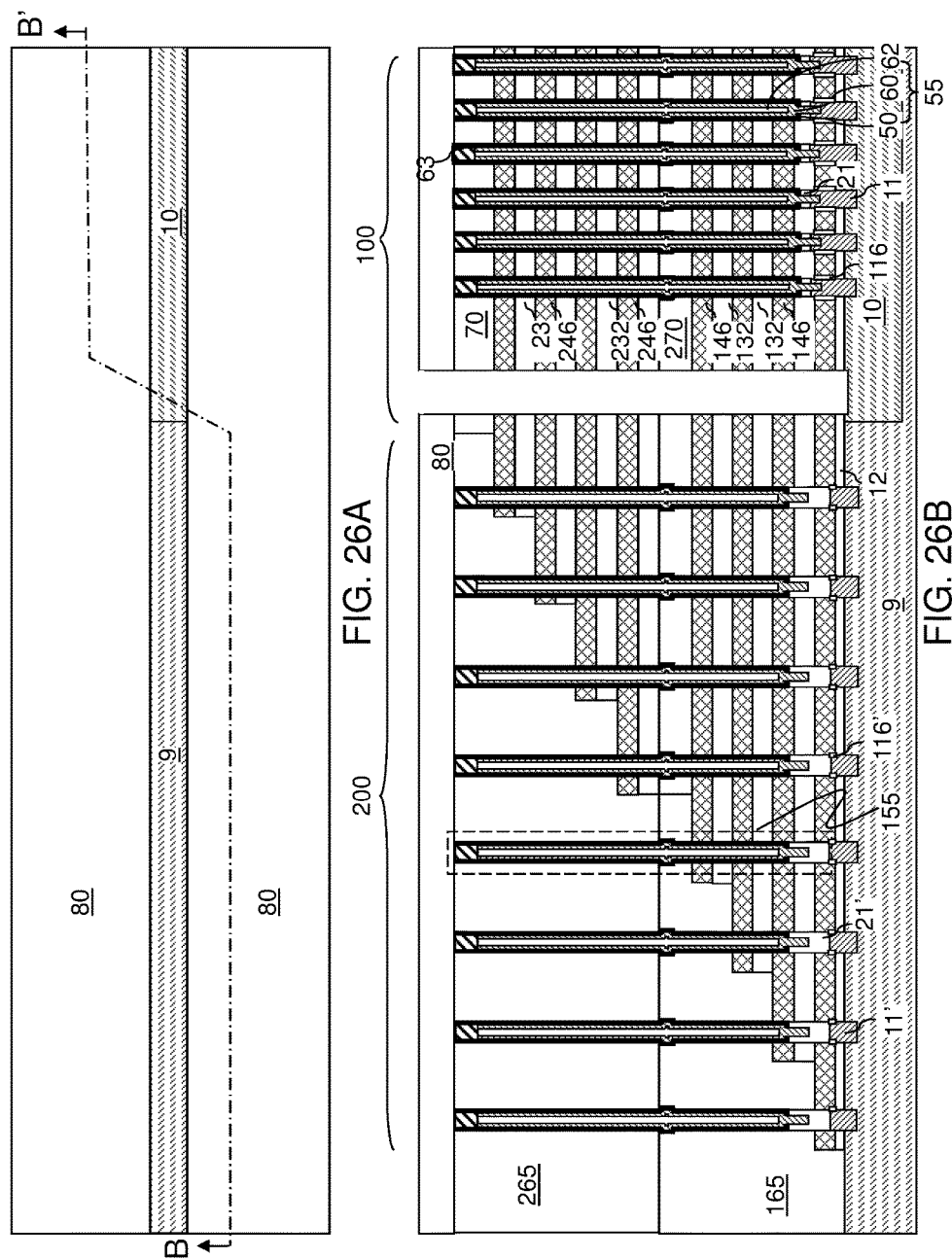

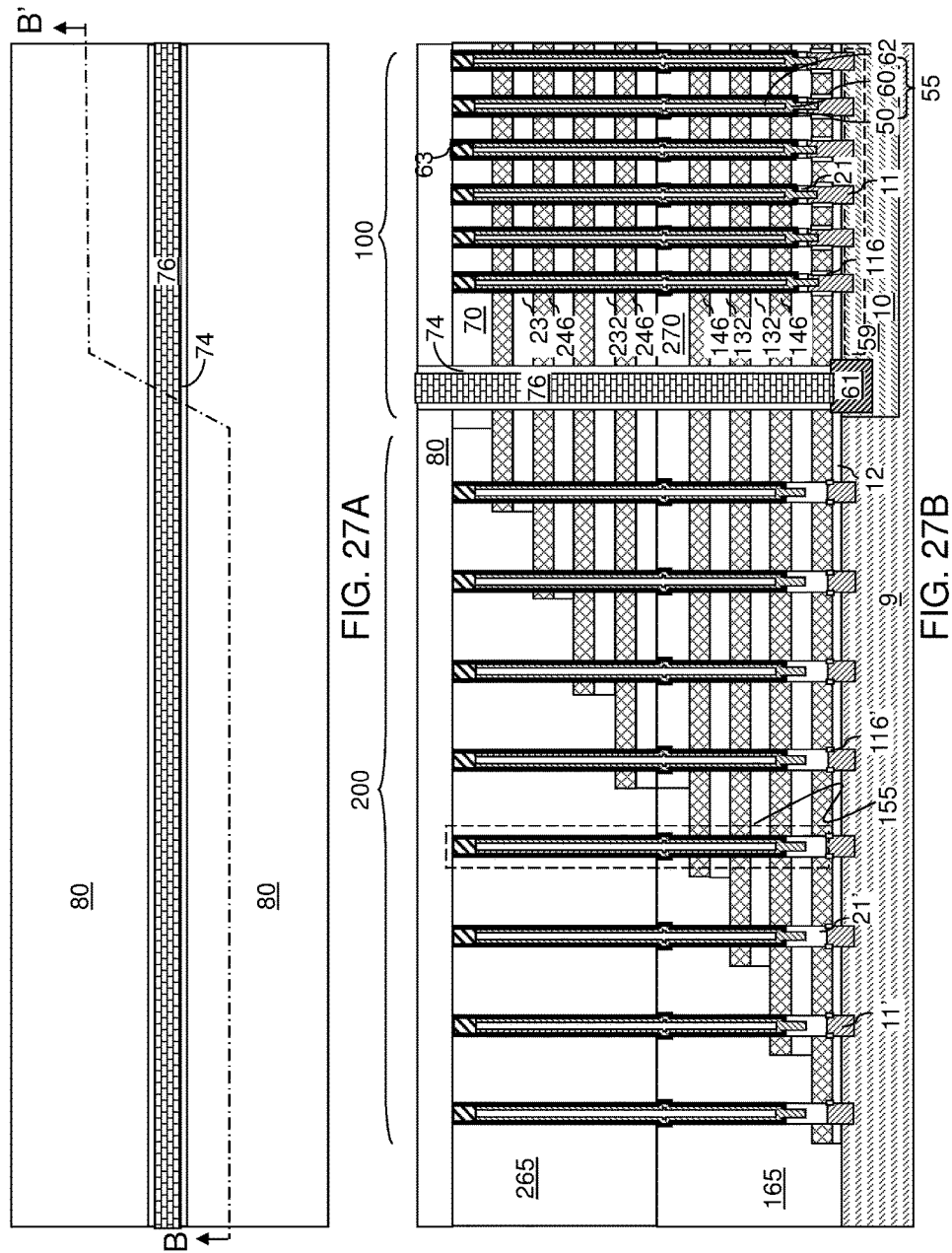

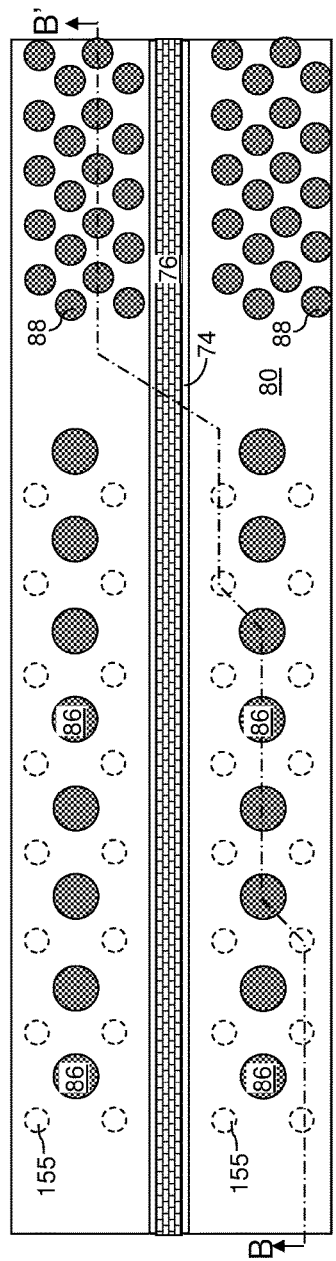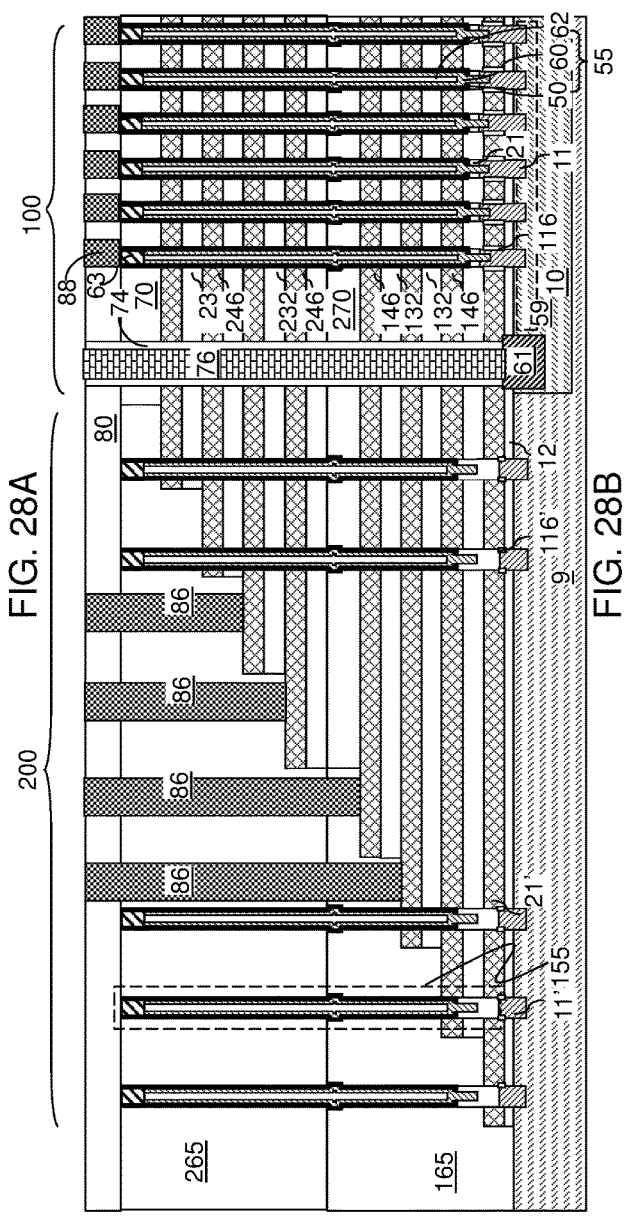
FIG. 28A
FIG. 28B

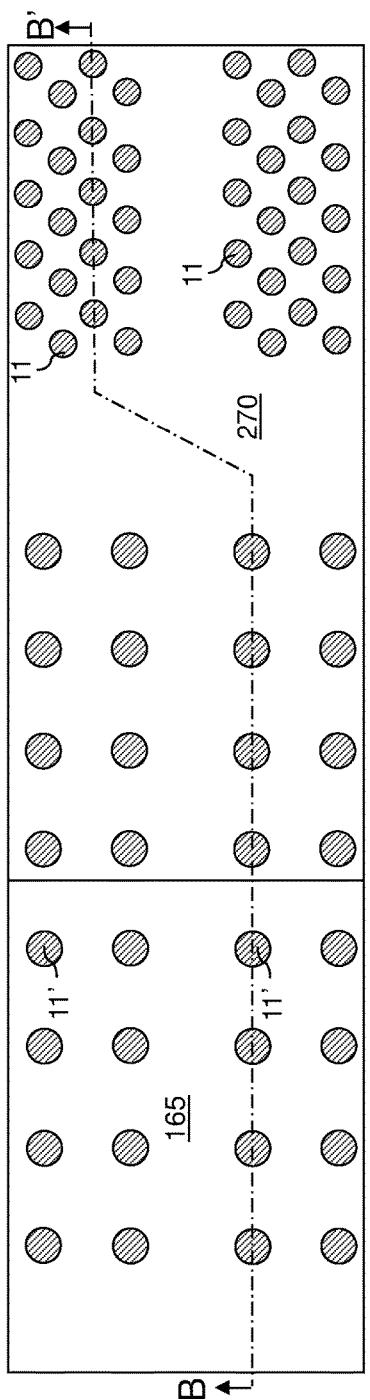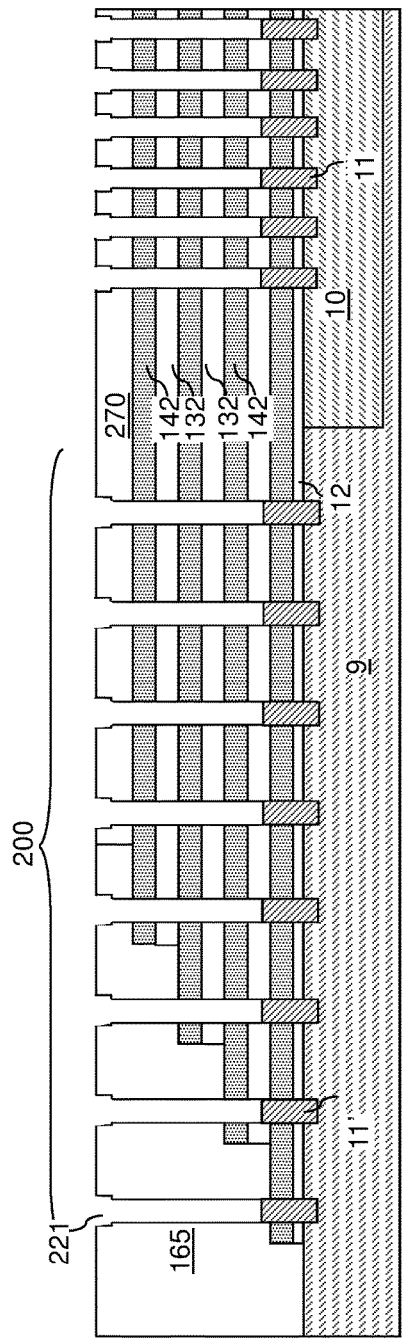
FIG. 29A
FIG. 29B

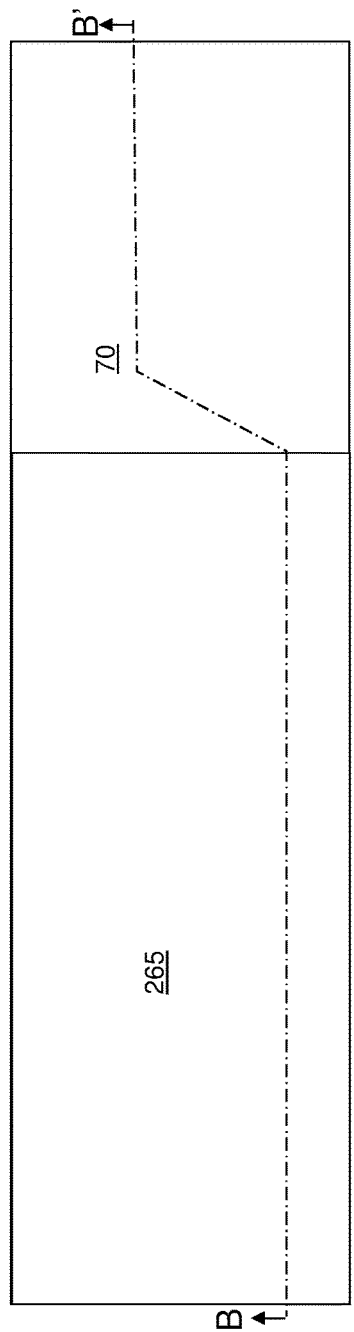
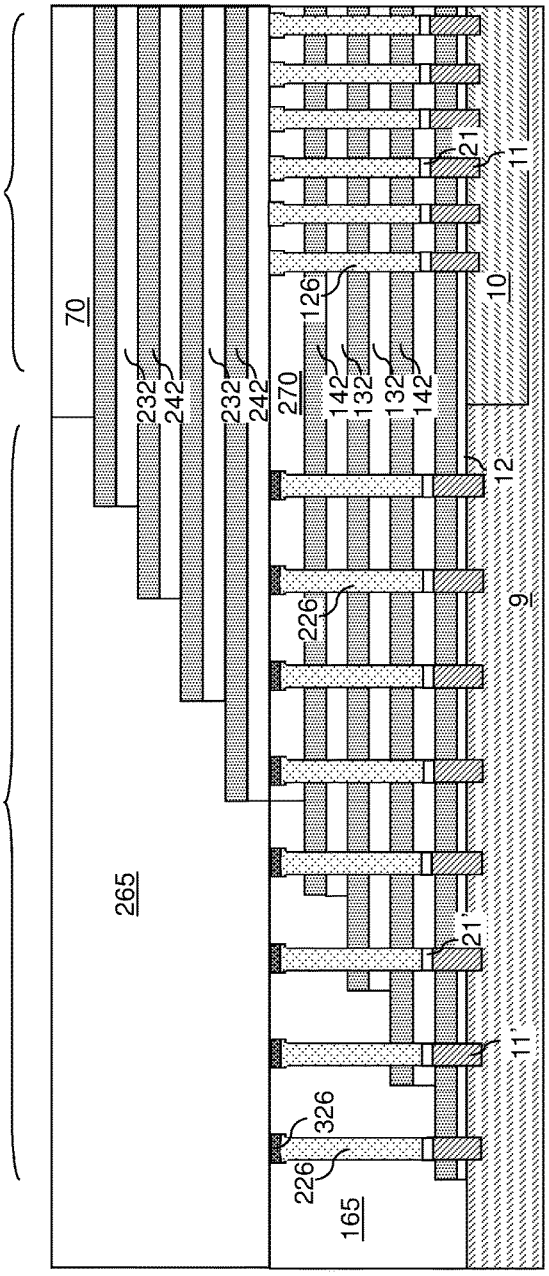
FIG. 35A
FIG. 35B

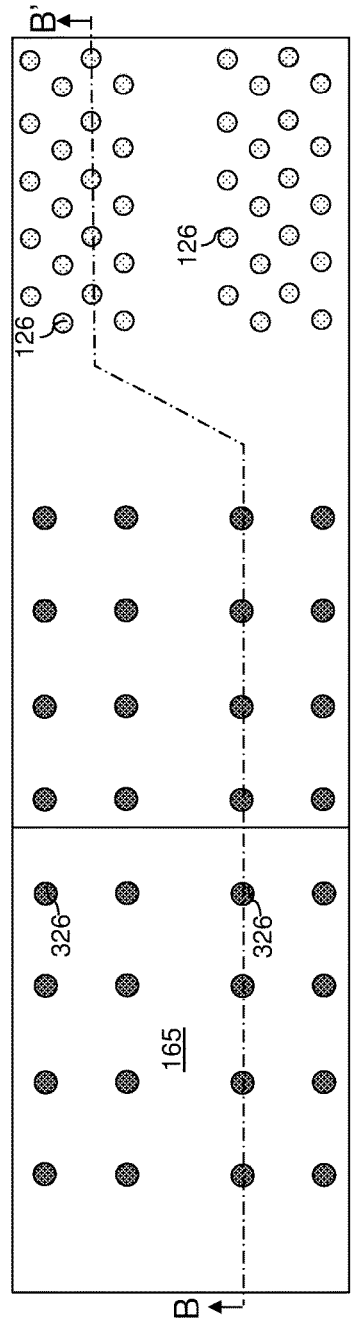
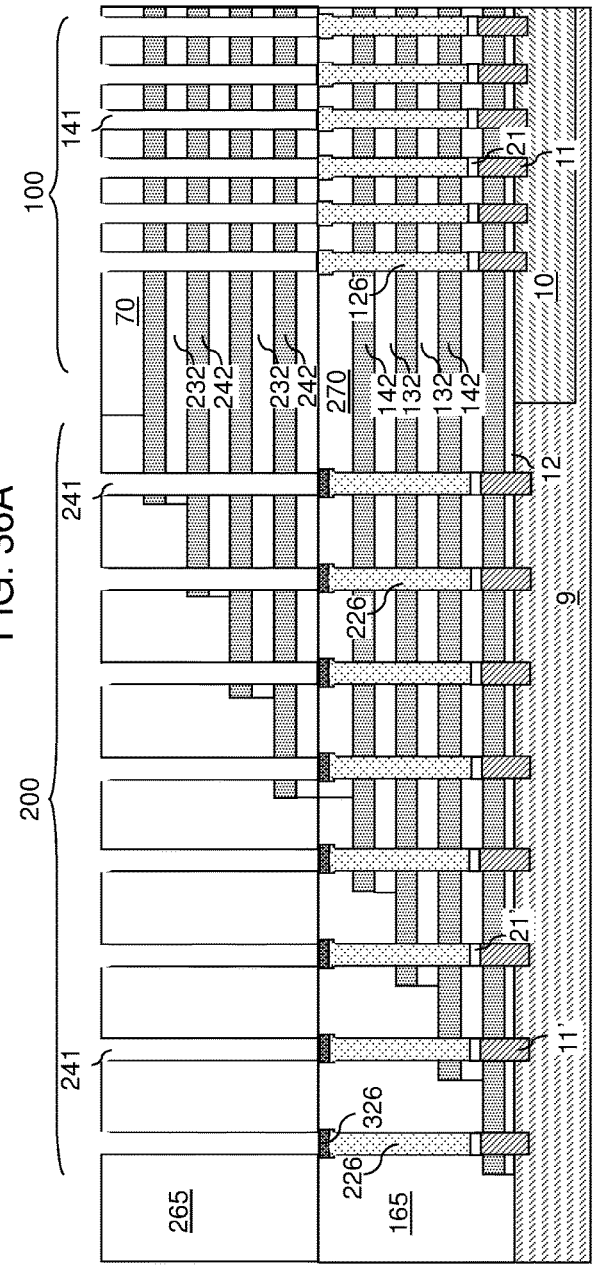
FIG. 36A
FIG. 36B

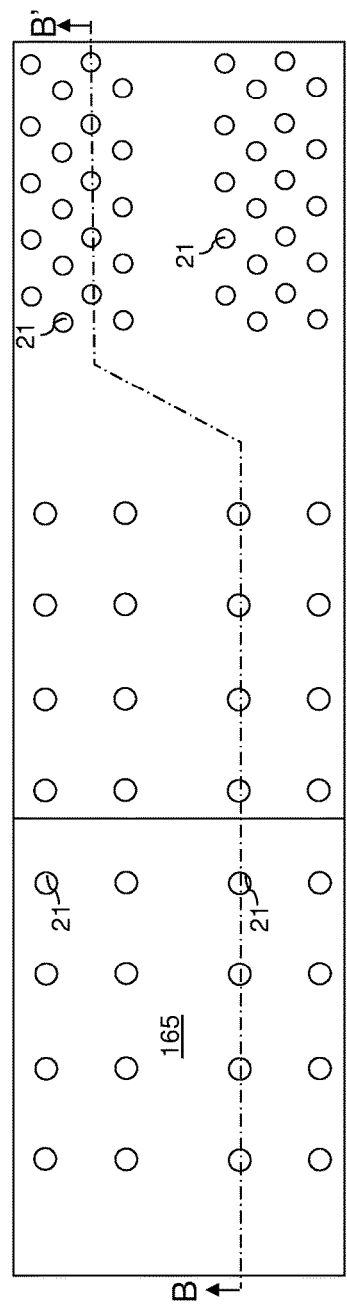
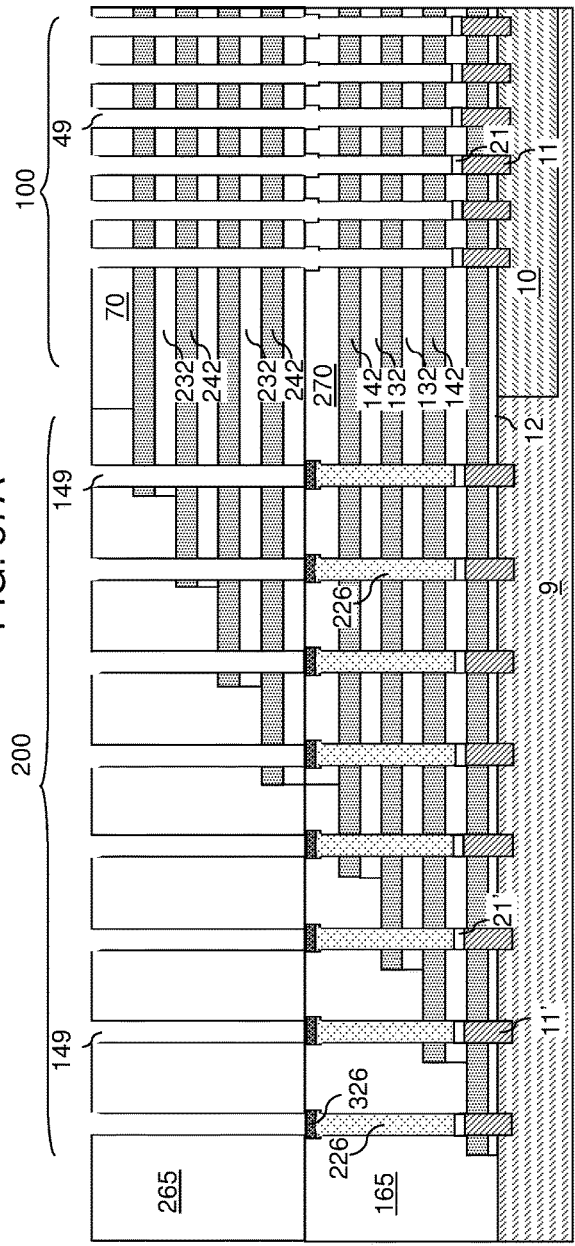
FIG. 37A
FIG. 37B

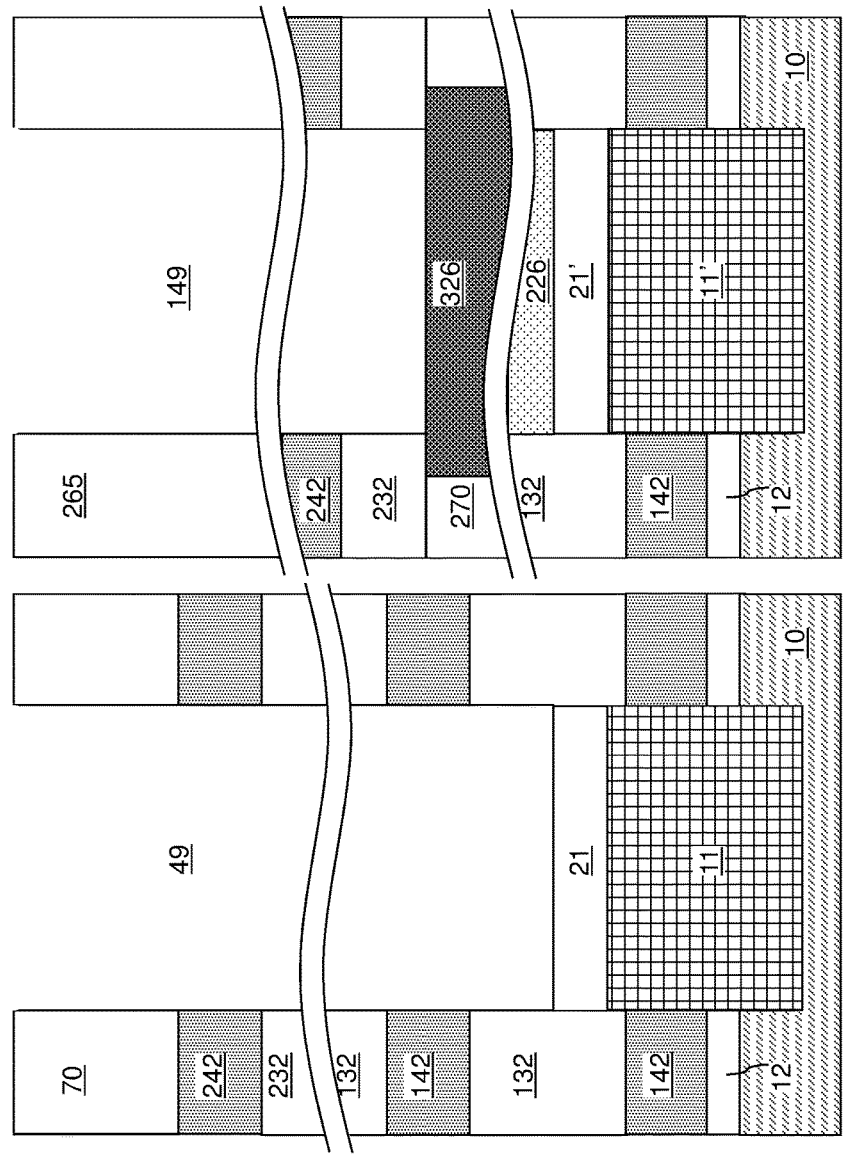

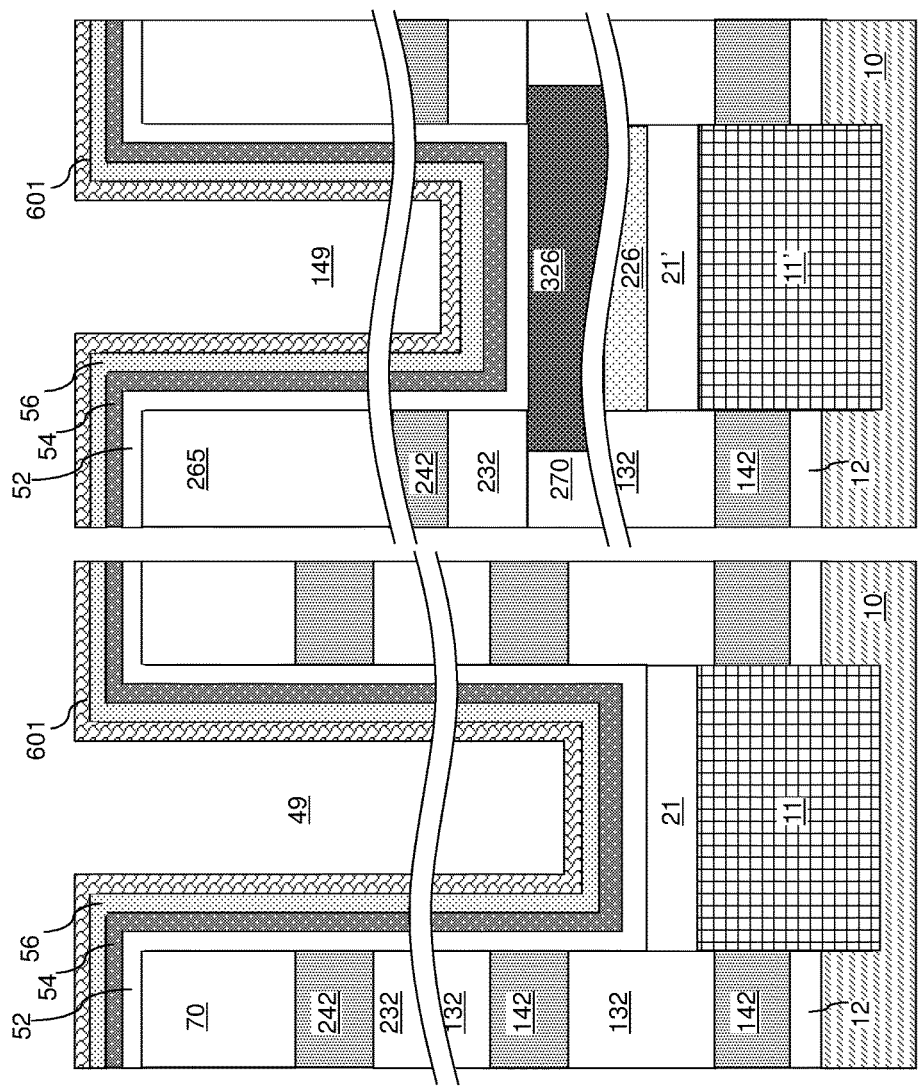

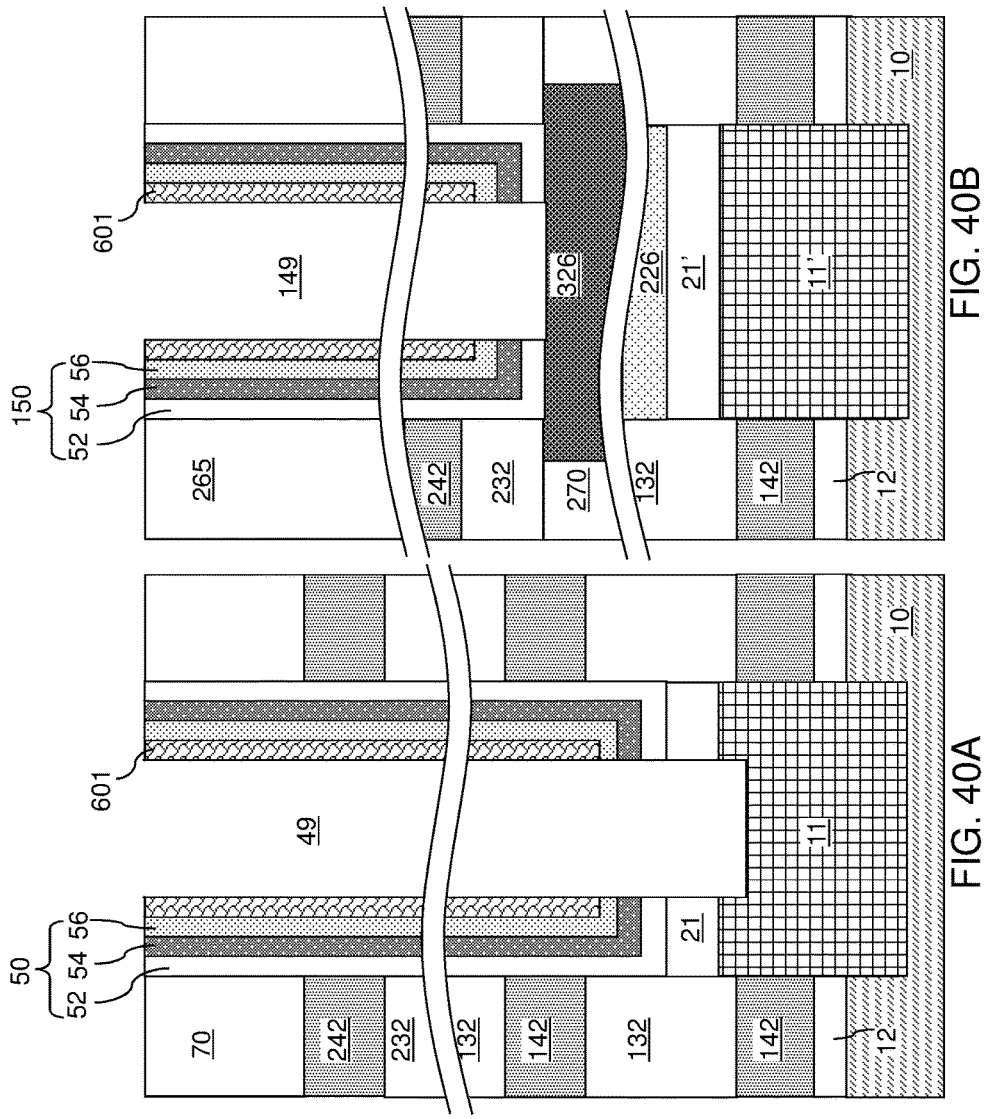

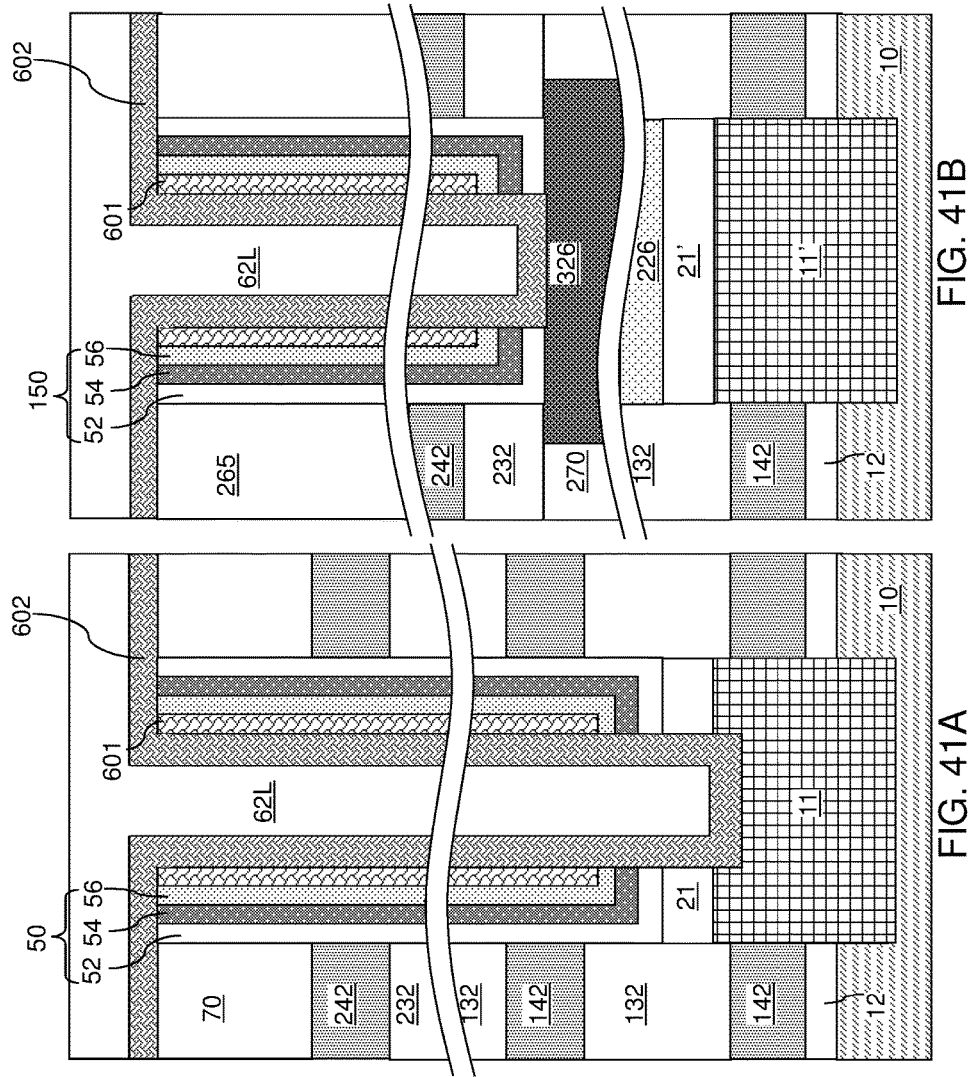

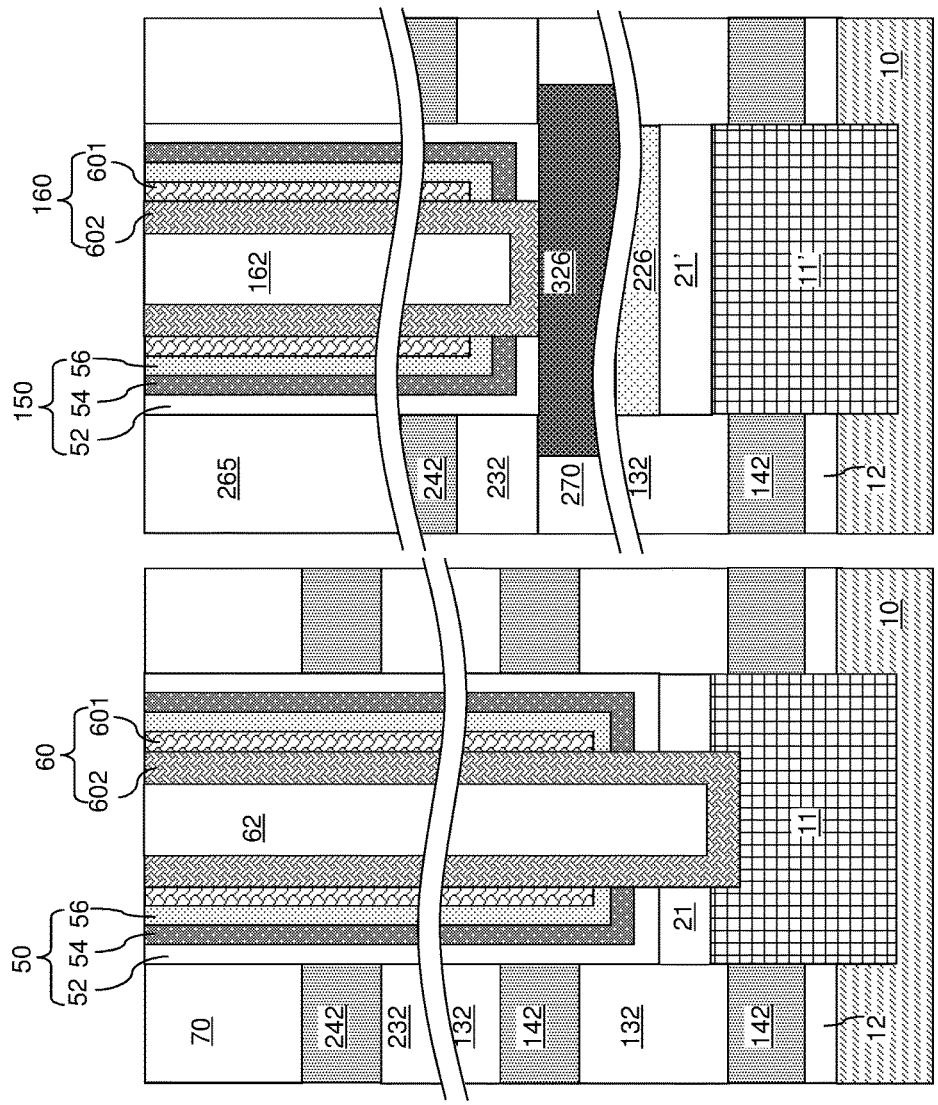

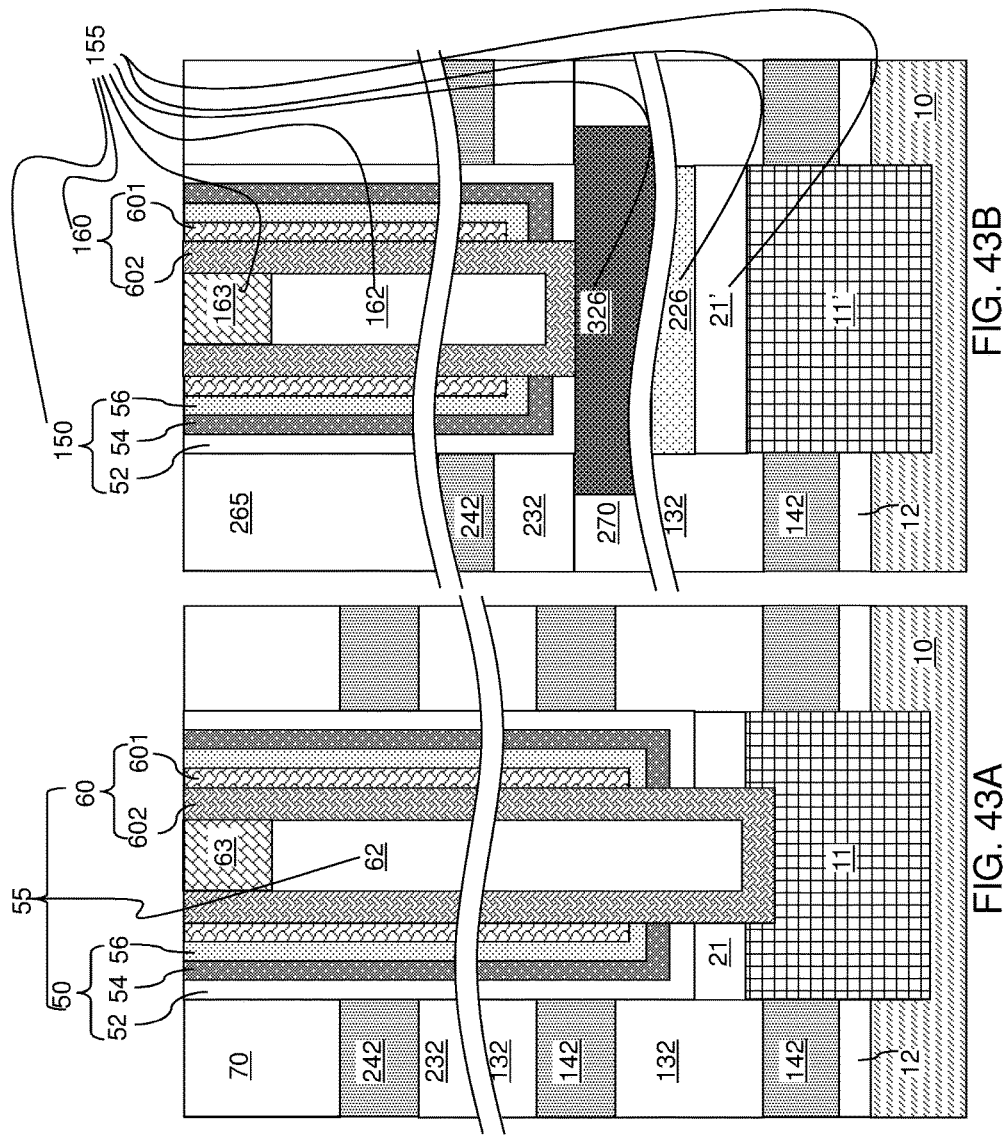

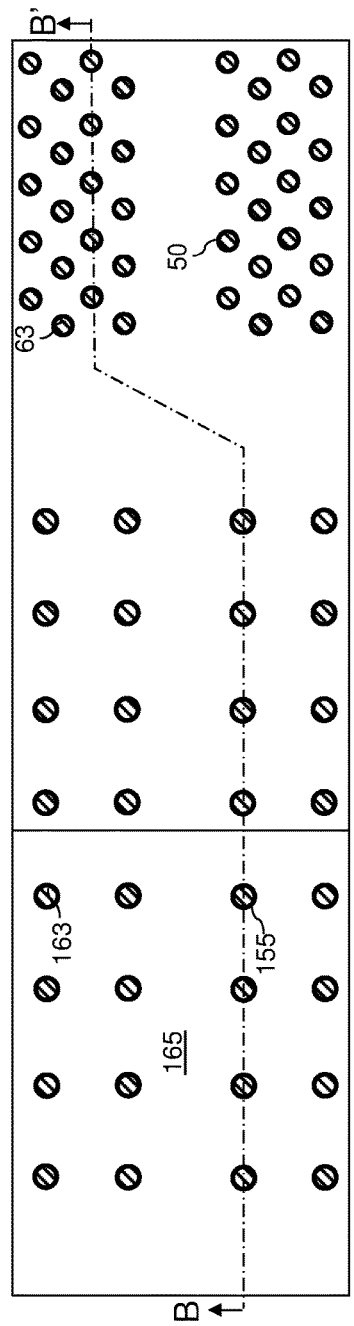
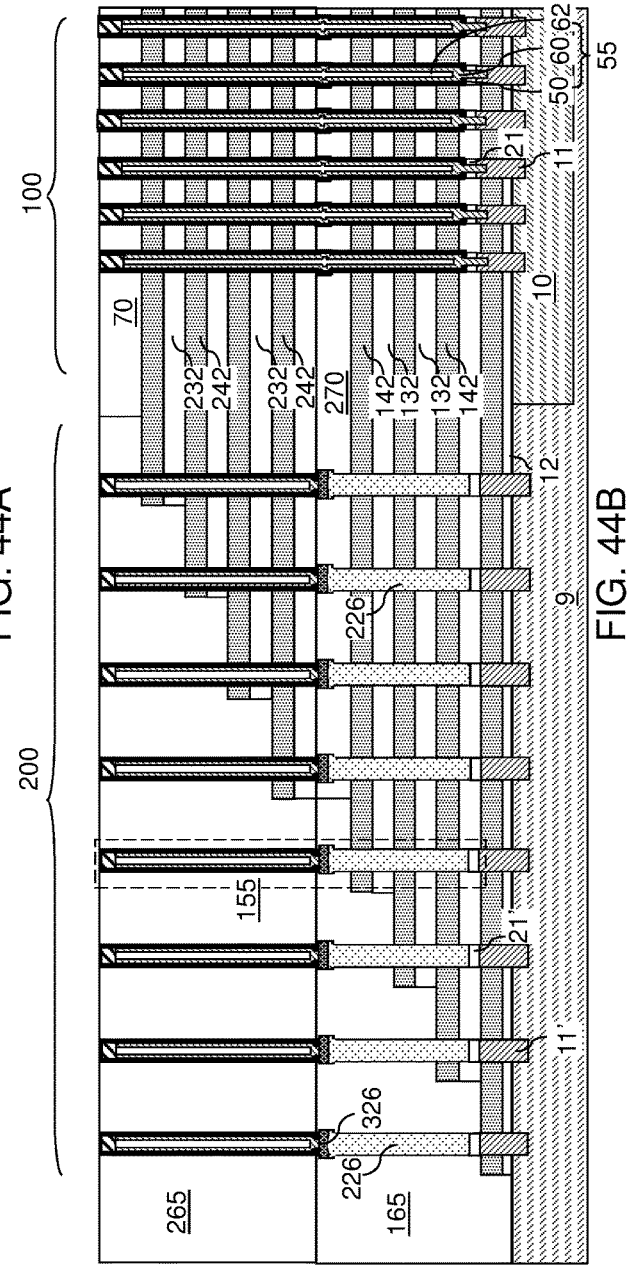
FIG. 44A
FIG. 44B

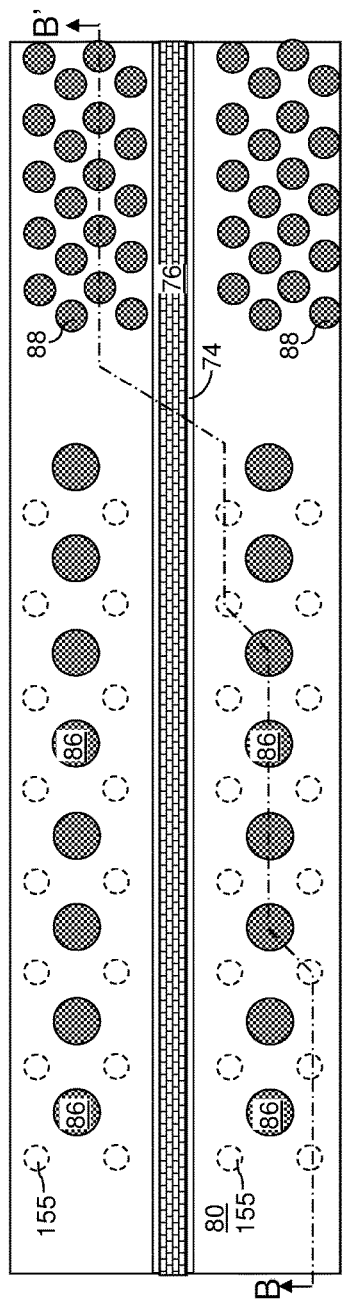
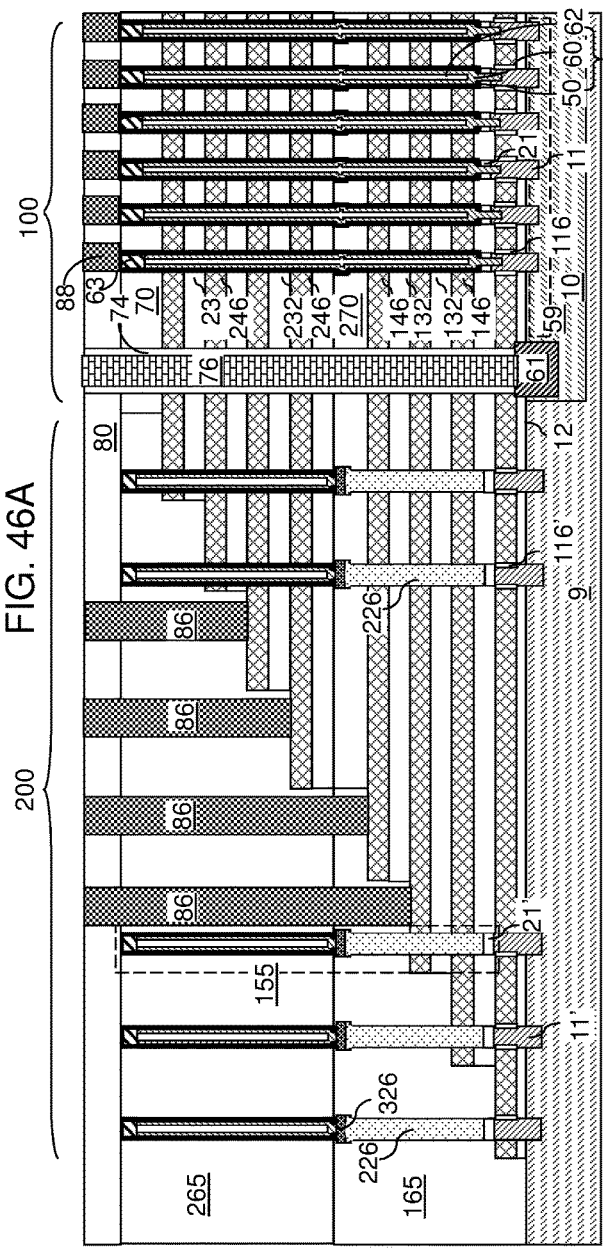
FIG. 46A
FIG. 46B

THREE-DIMENSIONAL MEMORY DEVICE WITH ELECTRICALLY ISOLATED SUPPORT PILLAR STRUCTURES AND METHOD OF MAKING THEREOF

FIELD

The present disclosure relates generally to the field of three-dimensional memory devices and specifically to three-dimensional memory devices including support pillar structure that are electrically isolated from a substrate and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a first tier structure comprising a first alternating stack of first insulating layers and first electrically conductive layers and located over a substrate; a second tier structure comprising a second alternating stack of second insulating layers and second electrically conductive layers and located over the first tier structure; a memory opening vertically extending through an entirety of the first tier structure and the second tier structure to a top surface of the substrate; a support opening vertically extending through the entirety of the first tier structure and the second tier structure to the top surface of the substrate and laterally offset from the memory openings; a memory stack structure located within the memory opening and comprising a vertical semiconductor channel that is electrically connected to a horizontal semiconductor channel located within the substrate; and a support pillar structure located within the support opening and comprising a vertical semiconductor layer comprising a same material as the vertical semiconductor channel and a dielectric material portion that electrically isolates the vertical semiconductor layer from the substrate.

According to another aspect of the present disclosure, a method of forming a three-dimensional memory device is provided. A first tier structure is formed over a substrate. The first tier structure comprises a first alternating stack of first insulating layers and first sacrificial material layers. A first support opening and a first memory opening are formed through the first tier structure. A dielectric material portion is formed within the first support opening. A second tier structure comprising a second alternating stack of second insulating layers and second sacrificial material layers is formed over the first tier structure. A second support opening and a second memory opening are formed through the second tier structure. The second support opening overlies the first support opening and the second memory opening overlies the first memory opening. A memory cavity extending through the second memory opening and an upper portion of the first memory opening is formed, while simultaneously forming a support cavity extending through the second support opening and bounded by a top surface of the dielectric material portion. A memory stack structure is formed in the memory cavity while forming a support pillar structure in the support cavity. The memory stack structure comprises a vertical semiconductor channel that is electrically connected to a horizontal semiconductor channel located within the substrate, and the support pillar structure comprises a vertical semiconductor layer comprising a same material as the vertical semiconductor channel electrically isolated from the substrate by the dielectric material portion.

BRIEF DESCRIPTION OF THE DRAWINGS

FIG. 1 is a vertical cross-sectional view of a first exemplary structure after formation of at least one peripheral device according to a first embodiment of the present disclosure.

FIG. 6C is a magnified vertical cross-sectional view of a top portion of a first support opening.

FIG. 8A is a top-down view of the first exemplary structure after formation of epitaxial pedestals at bottom portions of the first support openings and the first memory openings according to the first embodiment of the present disclosure.

FIG. 8B is a vertical cross-sectional view of the first exemplary structure of FIG. 8A along the vertical plane B-B'.

FIG. 9A is a top-down view of the first exemplary structure after formation of a patterned implantation mask layer and during implantation of dopant atoms into a subset of the epitaxial pedestals in the first support openings according to the first embodiment of the present disclosure.

FIG. 9B is a vertical cross-sectional view of the first exemplary structure of FIG. 9A along the vertical plane B-B'.

FIG. 10A is a top-down view of the first exemplary structure after formation of semiconductor oxide portions according to the first embodiment of the present disclosure.

FIG. 10B is a vertical cross-sectional view of the first exemplary structure of FIG. 10A along the vertical plane B-B'.

FIG. 12A is a top-down view of the first exemplary structure after formation of a second alternating stack of second insulating layers and second sacrificial material layers according to the first embodiment of the present disclosure.

FIG. 12B is a vertical cross-sectional view of the first exemplary structure of FIG. 12A along the vertical plane B-B'.

FIG. 13A is a top-down view of the first exemplary structure after formation of second stepped surfaces and a second retro-stepped dielectric material portion according to the first embodiment of the present disclosure.

FIG. 13B is a vertical cross-sectional view of the first exemplary structure of FIG. 13A along the vertical plane B-B'.

FIG. 15A is a top-down view of the first exemplary structure after formation of inter-tier memory openings and inter-tier support openings according to the first embodiment of the present disclosure.

FIG. 15B is a vertical cross-sectional view of the first exemplary structure of FIG. 15A along the vertical plane B-B'.

FIG. 16A is a vertical cross-sectional view of an inter-tier memory opening upon formation thereof according to the first embodiment of the present disclosure.

FIG. 16B is a vertical cross-sectional view of an inter-tier support opening at the processing step of FIG. 16A.

FIG. 17A is a vertical cross-sectional view of the inter-tier memory opening after formation of material layers for forming a memory film and a first semiconductor channel layer according to the first embodiment of the present disclosure.

FIG. 17B is a vertical cross-sectional view of the inter-tier support opening at the processing step of FIG. 17A.

FIG. 18A is a vertical cross-sectional view of the inter-tier memory opening after formation of a memory film by an anisotropic etch according to the first embodiment of the present disclosure.

FIG. 18B is a vertical cross-sectional view of the inter-tier support opening at the processing step of FIG. 18A.

FIG. 19A is a vertical cross-sectional view of the inter-tier memory opening after formation of a second semiconductor channel layer and a dielectric core material layer according to the first embodiment of the present disclosure.

FIG. 19B is a vertical cross-sectional view of the inter-tier support opening at the processing step of FIG. 19A.

FIG. 20A is a vertical cross-sectional view of the inter-tier memory opening after formation of a dielectric core according to the first embodiment of the present disclosure.

FIG. 20B is a vertical cross-sectional view of the inter-tier support opening at the processing step of FIG. 20A.

FIG. 24A is a top-down view of the first exemplary structure after formation of backside recesses according to the first embodiment of the present disclosure.

FIG. 24B is a vertical cross-sectional view of the first exemplary structure of FIG. 24A along the vertical plane B-B'.

FIG. 25A is a top-down view of the first exemplary structure after formation of first and second electrically conductive layers and a continuous conductive material layer according to the first embodiment of the present disclosure.

FIG. 25B is a vertical cross-sectional view of the first exemplary structure of FIG. 25A along the vertical plane B-B'.

FIG. 26A is a top-down view of the first exemplary structure after removal of the continuous conductive material layer according to the first embodiment of the present disclosure.

FIG. 26B is a vertical cross-sectional view of the first exemplary structure of FIG. 26A along the vertical plane B-B'.

FIG. 27A is a top-down view of the first exemplary structure after formation of an insulating spacer, a source region, and a backside contact via structure according to the first embodiment of the present disclosure.

FIG. 27B is a vertical cross-sectional view of the first exemplary structure of FIG. 27A along the vertical plane B-B'.

FIG. 28A is a top-down view of the first exemplary structure after formation of additional contact via structures according to the first embodiment of the present disclosure.

FIG. 28B is a vertical cross-sectional view of the first exemplary structure of FIG. 28A along the vertical plane B-B'.

FIG. 29A is a top-down view of a second exemplary structure after formation of epitaxial pedestals according to a second embodiment of the present disclosure.

FIG. 29B is a vertical cross-sectional view of the first exemplary structure of FIG. 29A along the vertical plane B-B'.

FIG. 35A is a top-down view of the second exemplary structure after formation of second stepped surfaces and a second retro-stepped dielectric material portion according to the second embodiment of the present disclosure.

FIG. 35B is a vertical cross-sectional view of the second exemplary structure of FIG. 35A along the vertical plane B-B'.

FIG. 36A is a top-down view of the second exemplary structure after formation of second memory openings and second support openings according to the second embodiment of the present disclosure.

FIG. 36B is a vertical cross-sectional view of the second exemplary structure of FIG. 36A along the vertical plane B-B'.

FIG. 37A is a top-down view of the second exemplary structure after formation of inter-tier memory openings according to the second embodiment of the present disclosure.

FIG. 37B is a vertical cross-sectional view of the second exemplary structure of FIG. 37A along the vertical plane B-B'.

FIG. 38A is a vertical cross-sectional view of an inter-tier memory opening upon formation thereof according to the second embodiment of the present disclosure.

FIG. 38B is a vertical cross-sectional view of a second support opening and an underlying first support opening at the processing step of FIG. 16A.

FIG. 39A is a vertical cross-sectional view of the inter-tier memory opening after formation of material layers for forming a memory film and a first semiconductor channel layer according to the second embodiment of the present disclosure.

FIG. 39B is a vertical cross-sectional view of the second support opening and the underlying first support opening at the processing step of FIG. 39A.

FIG. 40A is a vertical cross-sectional view of the inter-tier memory opening after formation of a memory film by an anisotropic etch according to the second embodiment of the present disclosure.

FIG. 40B is a vertical cross-sectional view of the second support opening and the underlying first support opening at the processing step of FIG. 40A.

FIG. 41A is a vertical cross-sectional view of the inter-tier memory opening after formation of a second semiconductor channel layer and a dielectric core material layer according to the second embodiment of the present disclosure.

FIG. 41B is a vertical cross-sectional view of the second support opening and the underlying first support opening at the processing step of FIG. 41A.

FIG. 42A is a vertical cross-sectional view of the inter-tier memory opening after formation of a dielectric core according to the second embodiment of the present disclosure.

FIG. 42B is a vertical cross-sectional view of the second support opening and the underlying first support opening at the processing step of FIG. 42A.

FIG. 43A is a vertical cross-sectional view of the inter-tier memory opening after formation of a drain region according to the second embodiment of the present disclosure.

FIG. 43B is a vertical cross-sectional view of the second support opening and the underlying first support opening at the processing step of FIG. 43A.

FIG. 44A is a top-down view of the second exemplary structure after formation of memory stack structures, support pillar structures, drain regions, and dummy drain regions according to the second embodiment of the present disclosure.

FIG. 44B is a vertical cross-sectional view of the second exemplary structure of FIG. 44A along the vertical plane B-B'.

FIG. 46A is a top-down view of the second exemplary structure after formation of additional contact via structures according to the second embodiment of the present disclosure.

FIG. 46B is a vertical cross-sectional view of the second exemplary structure of FIG. 46A along the vertical plane B-B'.

DETAILED DESCRIPTION

Figure 2A:
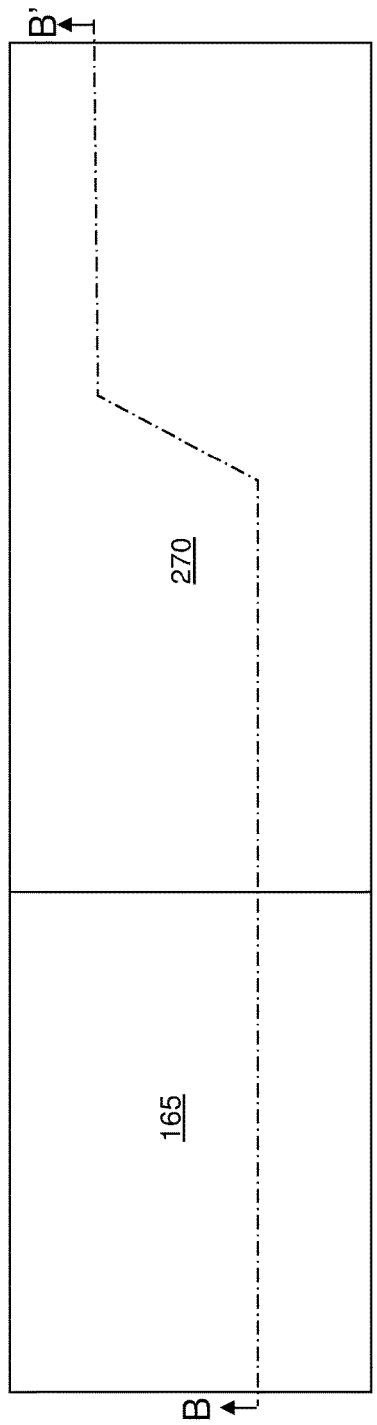
FIG. 2A is a top-down view of the first exemplary structure after formation of a first alternating stack of first insulating layers and first sacrificial material layers, first stepped surfaces, and a first retro-stepped dielectric material portion according to the first embodiment of the present disclosure.

As discussed above, the present disclosure is directed to three-dimensional memory devices including support pillar structure that are electrically isolated from a substrate and methods of making the same, the various aspects of which are described below. An embodiment of the disclosure can be employed to form semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. Elements with the same reference numeral refer to a same element or a similar element, and are presumed to have the same composition unless explicitly noted otherwise.

As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to an electrically conductive material including at least one metal element therein. All measurements for electrical conductivities are made at the standard condition.

At least one semiconductor device 700 for a peripheral circuitry can be formed on a portion of the substrate semiconductor layer 9. Optionally, a portion of the substrate semiconductor layer 9 can be vertically recessed to provide a recessed region, and the at least one semiconductor device 700 may be formed in the recessed region. Alternatively, an additional semiconductor material may be added to the substrate semiconductor layer 9 outside a region of the at least one semiconductor device 700, for example, by selective epitaxy after formation of the at least one semiconductor device.

The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed.

The active region 130 can include source regions and drain regions of field effect transistors. A first dielectric liner 161 and a second dielectric liner 171 can be optionally formed. Each of the first and second dielectric liners (161, 171) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 171 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 171). Subsequently, the planarization dielectric layer 170 and the dielectric liners (161, 171) can be removed from an area to physically expose a top surface of the substrate semiconductor layer 9 in regions that do not include the at least one semiconductor device 700.

An optional semiconductor material layer 10 may be formed within, or on top of, the substrate semiconductor layer 9 by ion implantation of electrical dopants (such as p-type dopants or n-type dopants) and/or by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 300. The region in which a memory array is subsequently formed is herein referred to as a memory array region 100. A contact region 200 for subsequently forming stepped terraces of electrically conductive layers can be provided between the memory array region 100 and the peripheral device region 300.

Figure 2B:
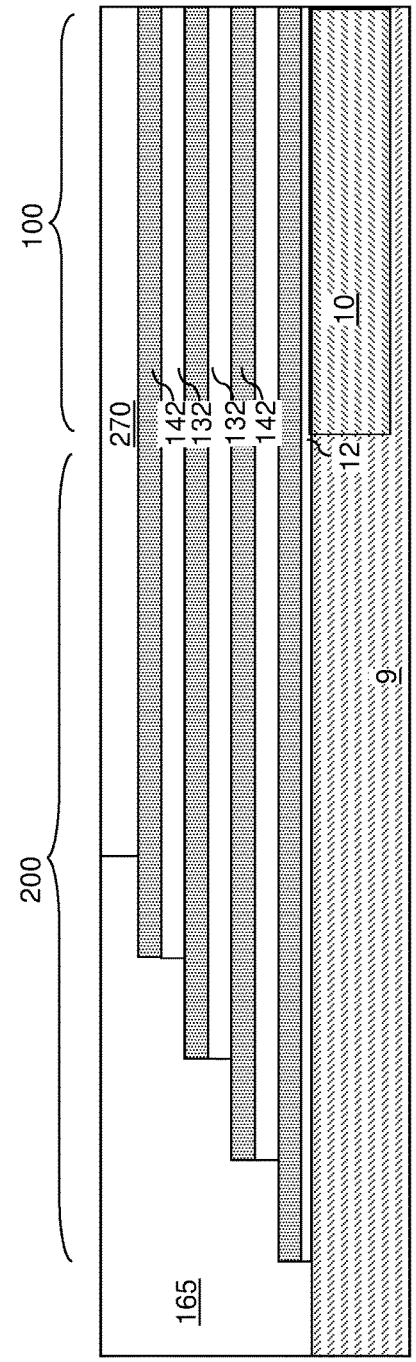
FIG. 2B is a vertical cross-sectional view of the first exemplary structure of FIG. 2A along the vertical plane B-B'.

Referring to FIGS. 2A and 2B, a gate dielectric layer 12 can be optionally formed above the semiconductor material layer 10 and the planarization dielectric layer 170. The gate dielectric layer 12 can include, for example, a silicon oxide layer and/or a dielectric metal oxide layer (such as an aluminum oxide layer and/or a hafnium oxide layer). The thickness of the gate dielectric layer 12 can be in a range from 3 nm to 30 nm, although lesser and greater thicknesses can also be employed.

An alternating stack of first material layers and second material layers is subsequently formed. Each first material layer can include a first material, and each second material layer can include a second material that is different from the first material. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A first-tier dielectric cap layer 270 can be subsequently formed over the first alternating stack (132, 142). The first-tier dielectric cap layer 270 includes a dielectric material that is different from the material of the first sacrificial material layers 142. The first-tier dielectric cap layer 270 includes a dielectric material that may be the same as, or different from, the material of the first insulating layers 132. In one embodiment, the first-tier dielectric cap layer 270 can include silicon oxide. In one embodiment, the thickness of the first-tier dielectric cap layer 270 can be in a range from 20 nm to 100 nm, although lesser and greater thicknesses can also be employed. The first alternating stack (132, 142) and the first dielectric cap layer 270 collectively constitutes a first tier structure (132, 142, 270).

The first tier structure (132, 142, 270) can be patterned to form first stepped surfaces. The first stepped surfaces form a first terrace region, which is located within an area of the contact region 200. The contact region 200 includes a first stepped area in which the first stepped surfaces are formed, and a second stepped area in which additional stepped surfaces are to be subsequently formed in an second tier structure (to be subsequently formed over the first tier structure). The memory array region 100 is provided adjacent to the contact region 200. Memory devices including memory stack structures can be subsequently formed in the memory array region 100. The first stepped surfaces can be formed, for example, by forming a mask layer with an opening therein, etching a cavity within the levels of the topmost first sacrificial material layer 142 and the topmost first insulating layer 132, and iteratively expanding the etched area and vertically recessing the cavity by etching each pair of a first insulating layer 132 and a first sacrificial material layer 142 located directly underneath the bottom surface of the etched cavity within the etched area. The first-tier dielectric cap layer 270 and the first alternating stack (132, 142) are patterned such that each underlying first sacrificial material layer 142 laterally protrudes farther than any overlying first sacrificial material layer 142 in the etched region, and each underlying first insulating layer 132 laterally protrudes farther than any overlying first insulating layer 132 in the etched region. The contact region can be a contact region of the first alternating stack (132, 142). The cavity is herein referred to as a first stepped cavity.

A dielectric material is deposited to fill the first stepped cavity. Excess portions of the dielectric material overlying the topmost surface of the first alternating stack (132, 142), are removed for example, by chemical mechanical planarization. The remaining portion of the deposited dielectric material forms a first dielectric material portion, which is herein referred to as a first retro-stepped dielectric material portion 165. The first retro-stepped dielectric material portion 165 is formed on the first stepped surfaces. The first dielectric material portion 165 is retro-stepped. As used herein, a "retro-stepped" element refers to an element that has stepped surfaces and a horizontal cross-sectional area that increases monotonically as a function of a vertical distance from a top surface of a substrate on which the element is present. The first tier structure, which is also referred to as a first stack structure, comprises the first alternating stack (132, 142) and the first retro-stepped dielectric material portion 165. The first retro-stepped dielectric material portion 165 is incorporated into the first tier structure (132, 142, 270, 165).

Figure 3A:
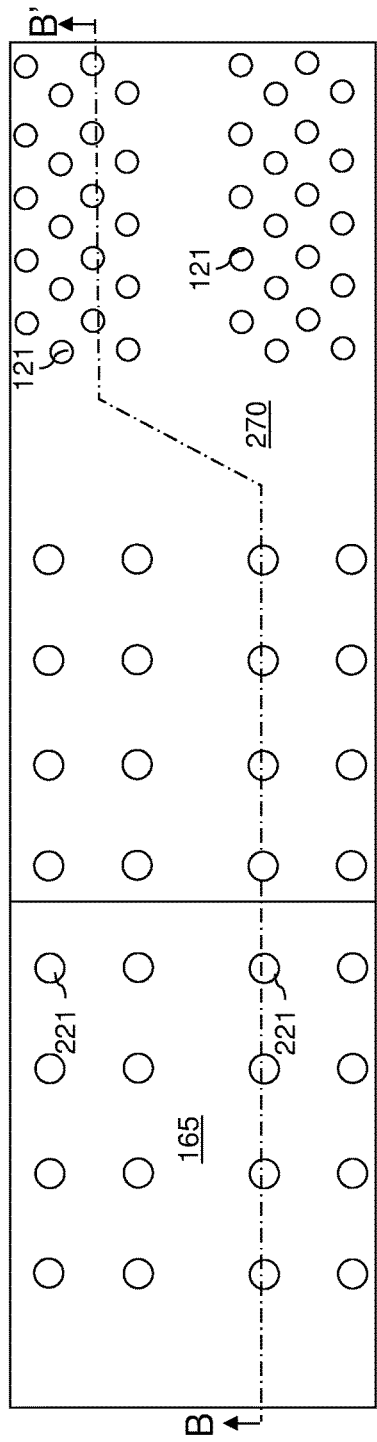
FIG. 3A is a top-down view of the first exemplary structure after formation of first memory openings in a memory array region and first support openings in a contact region according to the first embodiment of the present disclosure.
Figure 3B:
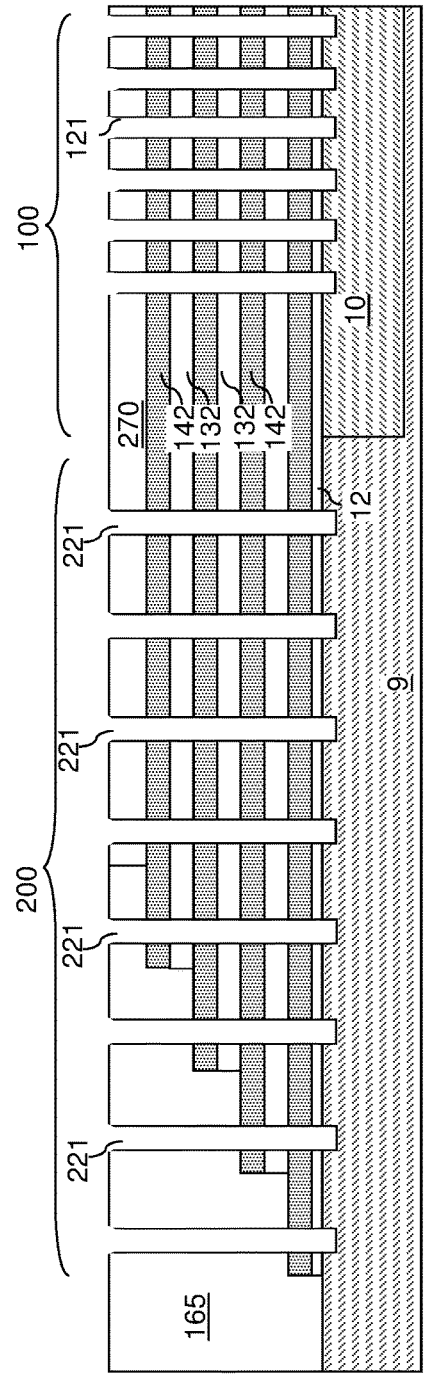
FIG. 3B is a vertical cross-sectional view of the first exemplary structure of FIG. 3A along the vertical plane B-B'.

Referring to FIGS. 3A and 3B, first openings (121, 221) extending to a top surface of the substrate (9, 10) are formed through the first tier structure (132, 142, 270, 165). The first openings (121, 221) include first memory openings 121 that are formed in the memory array region 100 and first support openings 221 that are formed in the contact region 200. The first memory openings 121 and the first support openings 221 can be formed concurrently by a patterning process. To form the first openings (121, 221), a lithographic material stack (not shown) including at least a photoresist layer can be formed over the first tier structure (132, 142, 270, 165), and can be lithographically patterned to form openings within the lithographic material stack. The pattern in the lithographic material stack can be transferred through the entirety of the first tier structure (132, 142, 270, 165) by at least one anisotropic etch that employs the patterned lithographic material stack as an etch mask. Portions of the first tier structure (132, 142, 270, 165) underlying the openings in the patterned lithographic material stack are etched to form the first openings (121, 221). In other words, transfer of the pattern in the patterned lithographic material stack through the first tier structure (132, 142, 270, 165) forms the first openings (121, 221).

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first dielectric material portion 165. The anisotropic etch can be, for example, a series of reactive ion etches. The sidewalls of the first openings (121, 221) can be substantially vertical, or can be tapered. Subsequently, the patterned lithographic material stack can be subsequently removed, for example, by ashing. The first memory openings 121 and the first support openings 221 can be formed concurrently employing the same set of anisotropic etch processes.

In one embodiment, the substrate (9, 10) can be employed as a stopping layer for the anisotropic etch process. In one embodiment, the first openings (121, 221) may extend below the top surface of the substrate (9, 10) by an overetch. The lateral dimensions (e.g., a diameter) of the first openings (121, 221) can be from about 20 nm to 200 nm at an upper portion of each first opening (121, 221), and can be about 10 nm to 150 nm at a lower portion of each first opening (121, 221).

In one embodiment, the first memory openings 121 can be formed as an array of openings, which can be a periodic two-dimensional array of openings. The first support openings 221 can be formed as discrete openings that are mutually separated from one another, and may, or may not, form a periodic two-dimensional array pattern. In one embodiment, the first support openings 221 may form a plurality of periodic one-dimensional array patterns that are parallel among one another.

A dielectric liner (not shown) can be optionally formed within the first memory openings 121 and the first support openings 221. For example, a thermal oxidation process, a thermal nitridation process, a plasma oxidation process, and/or a plasma nitridation process can be performed to convert surface portions of the semiconductor material layer 10 and/or the substrate semiconductor layer 9 at the bottom of each first memory opening 121 and each first support opening 221 to form the dielectric liner. Alternatively, a thin dielectric material layer can be conformally deposited to provide the dielectric liner. The thickness of the dielectric liner can be in a range from 1 nm to 3 nm, although lesser and greater thicknesses can also be employed.

Figure 4A:
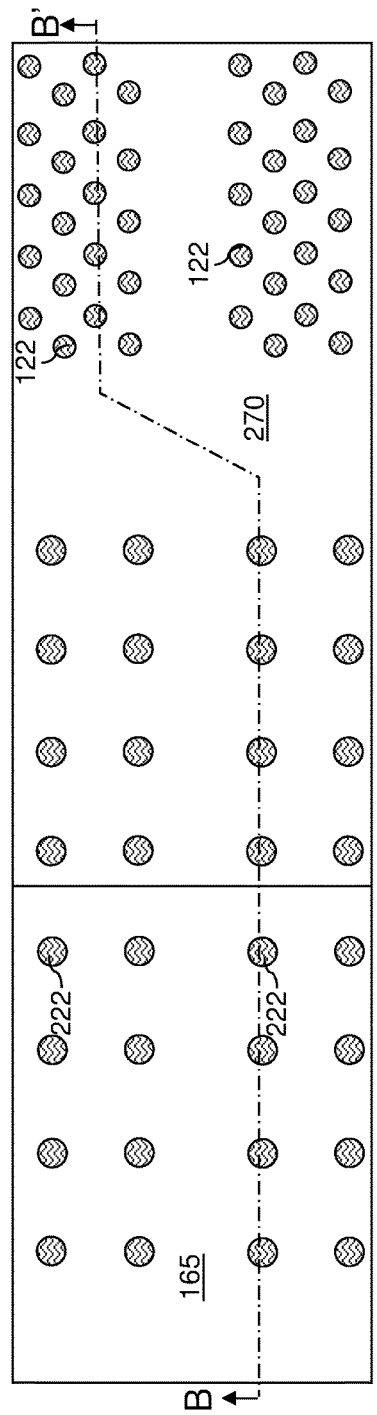
FIG. 4A is a top-down view of the first exemplary structure after formation of sacrificial fill material portions in the first support openings and in the first memory openings according to the first embodiment of the present disclosure.
Figure 4B:
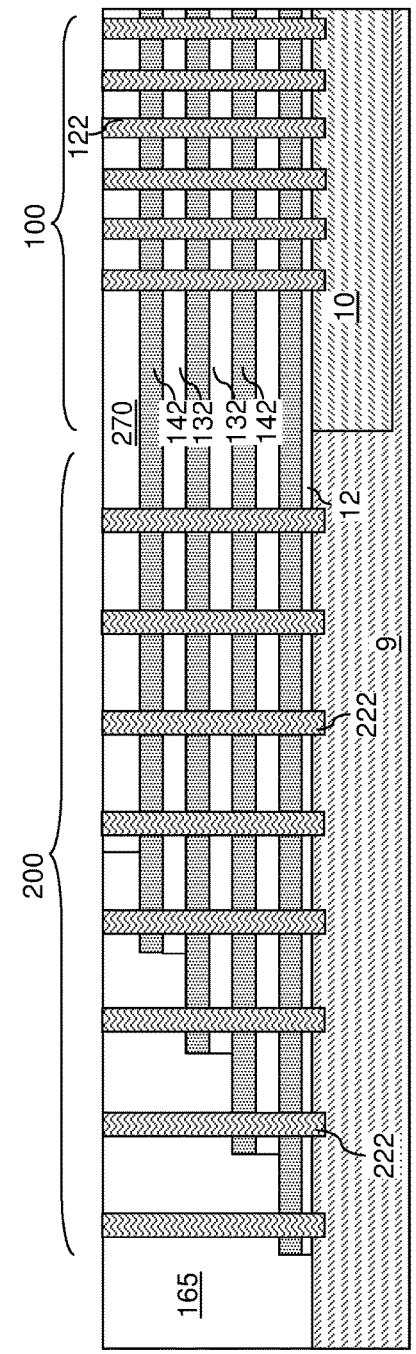
FIG. 4B is a vertical cross-sectional view of the first exemplary structure of FIG. 4A along the vertical plane B-B'.

Referring to FIGS. 4A and 4B, a sacrificial fill material can be deposited in the first support openings 221 and in the first memory openings 121 simultaneously. The sacrificial fill material can be an insulating material, a semiconducting material, or a conductive material. Non-limiting examples of the sacrificial fill material includes amorphous silicon, polycrystalline silicon, an amorphous silicon-germanium alloy, and a polycrystalline silicon-germanium alloy. In case a semiconductor material is employed, the semiconductor material (such as amorphous silicon) is undoped (i.e., intrinsic). Excess portions of the deposited sacrificial fill material can be removed from above the horizontal plane including the topmost surface of the first tier structure (132, 142, 270, 165). Remaining portions of the deposited sacrificial fill material in the first openings (121, 221) are herein referred to as sacrificial fill material portions (122, 222).

The sacrificial fill material portions (122, 222) include sacrificial memory opening fill material portions 122 that fill the first memory openings 121 and sacrificial support opening fill material portions 222 that fill the first support openings 221. A subset of the sacrificial support opening fill material portions 222 extends through the first retro-stepped dielectric material portion 165 and the first stepped surfaces on the first alternating stack (132, 142). Each instance of the sacrificial support opening fill material portions 222 can include a material having a composition different from the material of the first insulating layers 132 and from the material of the first sacrificial material layers 142. For example, the sacrificial fill material portions (122, 222) can include amorphous silicon, a silicon-germanium alloy, amorphous carbon, an organic polymer, or an inorganic polymer.

Figure 5A:
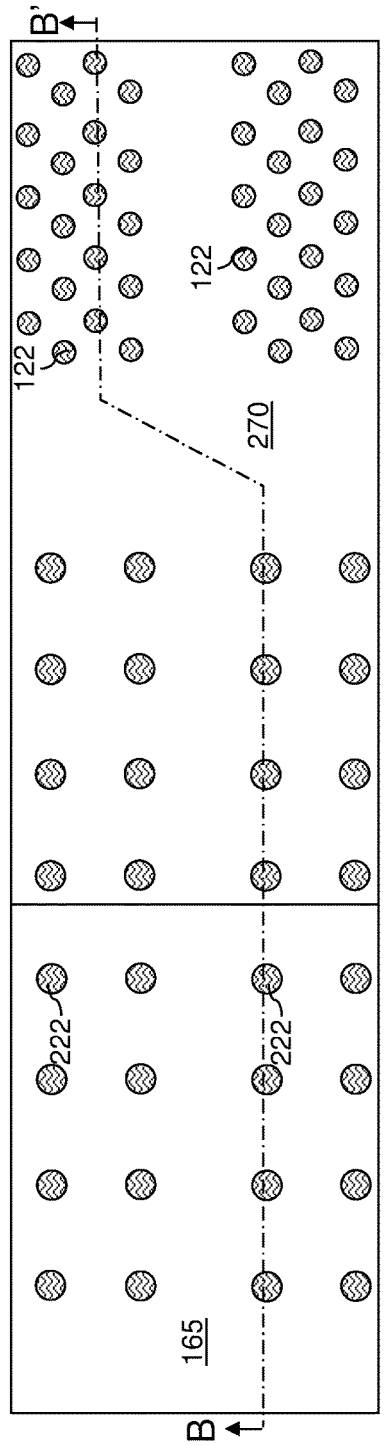
FIG. 5A is a top-down view of the first exemplary structure after vertically recessing the sacrificial fill material portions and lateral expansion of top regions of the first support openings and the first memory openings according to the first embodiment of the present disclosure.
Figure 5B:
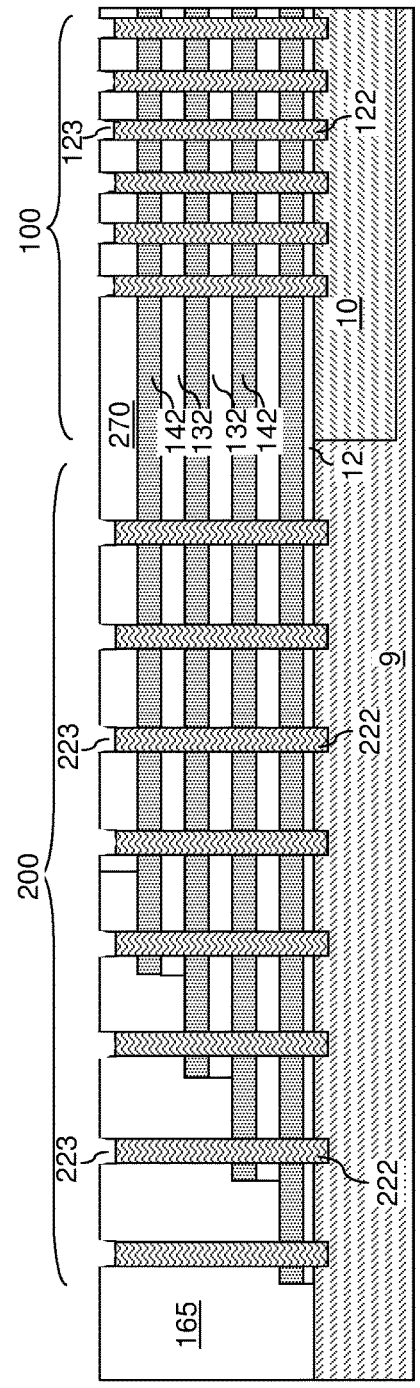
FIG. 5B is a vertical cross-sectional view of the first exemplary structure of FIG. 5A along the vertical plane B-B'.

Referring to FIGS. 5A and 5B, top regions of the sacrificial fill material portions (122, 222) can be optionally removed, for example, by a recess etch that removes the sacrificial fill material of the sacrificial fill material portions (122, 222) selective to the material of the first-tier dielectric cap layer 270. The recess etch can be an isotropic etch such as a wet etch or an anisotropic etch such as a reactive ion etch. For example, if the sacrificial fill material portions (122, 222) include undoped silicon material, a wet etch employing KOH can be employed to recess the undoped semiconductor material of the sacrificial fill material portions (122, 222) selective to the material of the first-tier dielectric cap layer 270. The duration of the recess etch can be selected such that the recessed top surfaces of the sacrificial fill material portions (122, 222) are formed between a first horizontal plane including the top surface of the first-tier dielectric cap layer 270 and a second horizontal plane including the bottom surface of the first-tier dielectric cap layer 270.

Figure 6A:
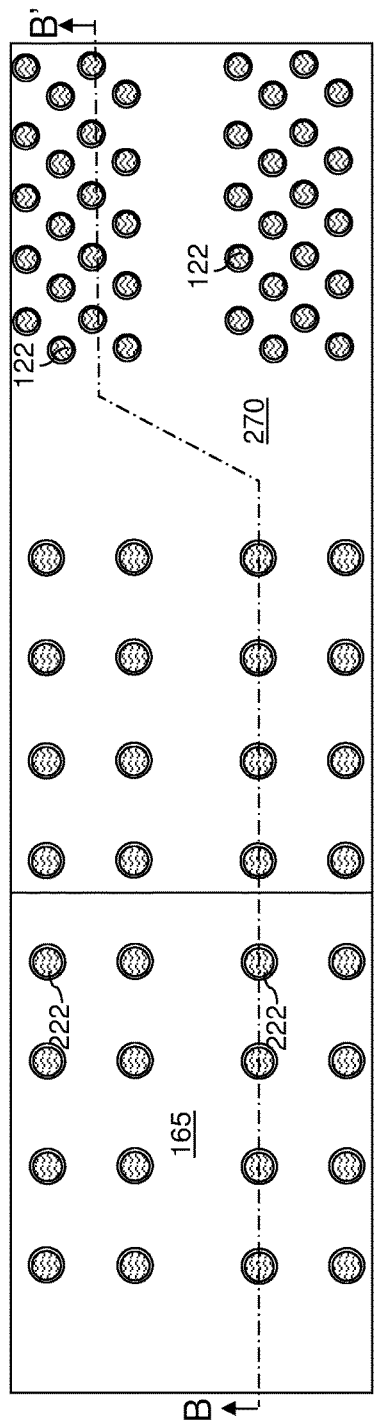
FIG. 6A is a top-down view of the first exemplary structure after laterally expanding top regions of the first support openings and the first memory openings according to the first embodiment of the present disclosure.
Figure 6B:
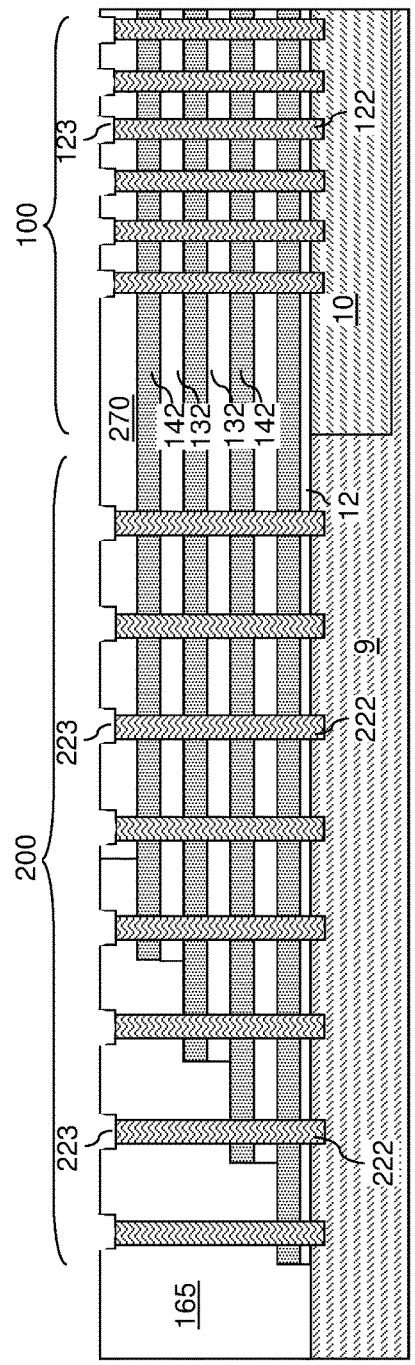
FIG. 6B is a vertical cross-sectional view of the first exemplary structure of FIG. 6A along the vertical plane B-B'.

Referring to FIGS. 6A-6C, an isotropic etch can be performed to recess the dielectric material of the first-tier dielectric cap layer 270 selective to the sacrificial fill material of the sacrificial fill material portions (122, 222). The volume of each cavity overlying the sacrificial fill material portions (122, 222) as recessed can be laterally expanded to increase the horizontal cross-sectional area of each cavity overlying a respective sacrificial fill material portion (122, 222). In one embodiment, a concave surface having a uniform curvature with a radius of curvature R can be formed around each sacrificial fill material portions (122, 222). A closed bottom periphery of the concave surface can be adjoined to a periphery of a respective sacrificial fill material portion (122 or 222). A closed top periphery of the concave surface can be adjoined to a substantially cylindrical sidewall of first-tier dielectric cap layer 270 that extends to the top surface of the first-tier dielectric cap layer 270.

Figure 7A:
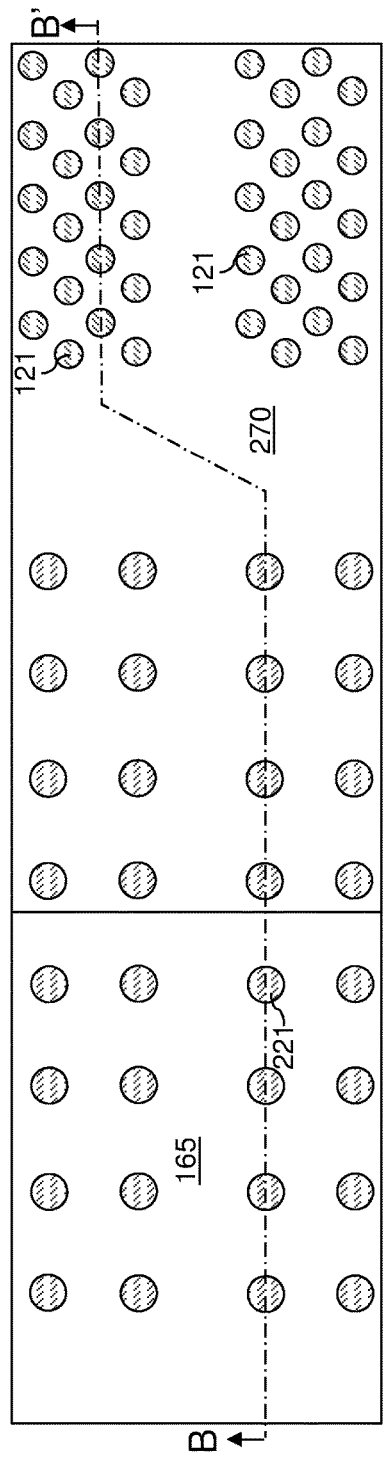
FIG. 7A is a top-down view of the first exemplary structure after removing the sacrificial fill material portions from the first support openings and the first memory openings according to the first embodiment of the present disclosure.
Figure 7B:
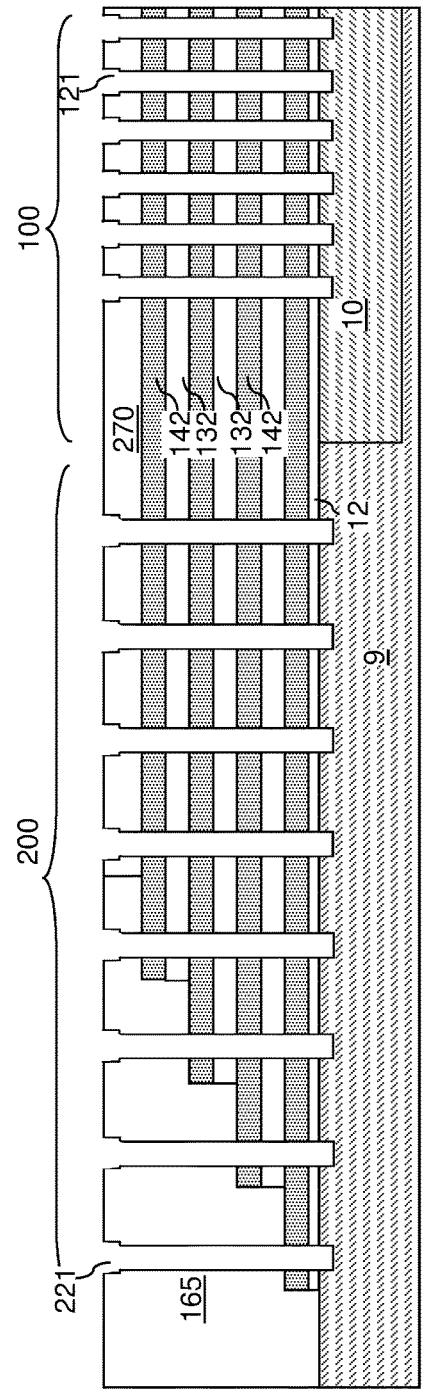
FIG. 7B is a vertical cross-sectional view of the first exemplary structure of FIG. 7A along the vertical plane B-B'.

Referring to FIGS. 7A and 7B, the sacrificial fill materials of the sacrificial fill material portions (122, 222) can be removed by an etch process. An isotropic etch or an anisotropic etch may be performed to remove the materials of the sacrificial fill material portions (122, 222) selective to the materials of the first insulating layers 132, the first sacrificial material layers 142, and the first tier dielectric cap layer 270. In case a dielectric liner is formed at the processing steps of FIGS. 4A and 4B, the dielectric liner can function as an etch stop layer, and the etch process can be selective to the material of the dielectric liner, which can be subsequently removed by an isotropic etch (such as a wet etch). In case the sacrificial fill material portions (122, 222) include a semiconductor material such as silicon or a silicon-germanium alloy, a wet etch process employing a KOH solution can be employed to remove the materials of the sacrificial fill material portions (122, 222).

Referring to FIGS. 8A and 8B, epitaxial pedestals (11, 11') can be formed at the bottom portion of each first memory opening 121 and each first support opening 221, for example, by selective epitaxy. The epitaxial pedestals (11, 11') include first epitaxial pedestals 11 that are formed at the bottom of the first memory openings 121 and second epitaxial pedestals formed at the bottom of the first support openings 221. Each epitaxial pedestal (11, 11') comprises a single crystalline semiconductor material in epitaxial alignment with the single crystalline semiconductor material of the semiconductor material layer 10 or the substrate semiconductor layer 9. In one embodiment, the epitaxial pedestal (11, 11') can be doped with electrical dopants of the same conductivity type as the semiconductor material layer 10.

In one embodiment, the top surface of each epitaxial pedestal (11, 11') can be formed above a horizontal plane including the top surface of a set of at least one bottommost first sacrificial material layers 142. In this case, at least one source select gate electrode can be subsequently formed by replacing each first sacrificial material layer 142 located below the horizontal plane including the top surfaces of the epitaxial pedestals (11, 11') with a respective conductive material layer in subsequent processing steps. The first epitaxial pedestals 11 can be a portion of a transistor channel that extends between a source region to be subsequently formed in the substrate (9, 10) and a drain region to be subsequently formed in an upper portion of an inter-tier memory opening that includes a first memory opening 121 at a lower portion thereof. A cavity is present in the unfilled portion of each first memory opening 121 and in the unfilled portion of each first support opening 221 above the respective epitaxial pedestal (11, 11').

In one embodiment, each epitaxial pedestal (11, 11') can comprise single crystalline silicon. In one embodiment, each epitaxial pedestal (11, 11') can have a doping of the first conductivity type, which is the same as the conductivity type of the semiconductor material layer 10 that the epitaxial pedestal contacts. If a semiconductor material layer 10 is not present, the first epitaxial pedestals 11 can be formed directly on the substrate semiconductor layer 9, which can have a doping of the first conductivity type.

Referring to FIGS. 9A and 9B, a patterned implantation mask layer 67 is formed over the first exemplary structure to cover the first memory openings 121, while not covering the first support openings 221. The patterned implantation mask layer 67 can be a photoresist layer. In this case, the photoresist layer can be applied over the entire top surface of the first exemplary structure, and can be lithographically patterned (by exposure and development) to cover the first memory openings 121 while not covering the first support openings 221.

Ion implantation of dopants is performed into at least upper portions of second epitaxial pedestals 11' but not into the first epitaxial pedestals 11 because the patterned implantation mask layer 67 covers the first memory openings 121. In one embodiment, the dopants can be p-type electrical dopants (such as boron) or n-type electrical dopants (such as phosphorus or arsenic). The ions can impinge on the second epitaxial pedestals 11' at substantially normal incidence. The dose of the dopants during the ion implantation process can be selected such that the oxidation rate of the implanted region (i.e., a doped upper portion 16) of the second epitaxial pedestals 11' is enhanced relative to the oxidation rate of the material of the second epitaxial pedestals 11' prior to ion implantation. For example, the atomic concentration of the electrical dopants in the implanted regions of the second epitaxial pedestals 11' can be in a range from $5.0 \times 10^{19}/cm^3$ to $2.0 \times 10^{21}/cm^3$, although lesser and greater atomic concentrations of the electrical dopants can also be employed. Subsequently, the patterned implantation mask layer 67 can be removed, for example, by ashing.

Referring to FIGS. 10A and 10B, an oxidation process is performed to covert surface portions of each epitaxial pedestal (11, 11') into semiconductor oxide portions (21, 21'). A thermal oxidation process or a plasma oxidation process can be employed to form the semiconductor oxide portions (21, 21'). The semiconductor oxide portions (21, 21') include first semiconductor oxide portions 21 that are formed by conversion of an upper portion of the first epitaxial pedestals 11 into a semiconductor oxide material (such as silicon oxide), and second semiconductor oxide portions 21' that are formed by conversion of the doped upper portion 16 of the second epitaxial pedestals 11' into another semiconductor oxide material (such as doped or undoped silicon oxide).

The electrical dopants present in the upper portion of each second epitaxial pedestal 11' enhances the oxidation rate of the doped semiconductor material in the doped upper portion 16 of each second epitaxial pedestal 11'. As a consequence, the second semiconductor oxide portions 21' have a greater height (i.e., thickness) than the first semiconductor oxide portions 21. In one embodiment, the ratio of the height of the second semiconductor oxide portions 21' to the height of the first semiconductor oxide portions 21 can be in a range from 1.2 to 5, such as from 1.4 to 3, although lesser ratios which are greater than 1 and greater ratios can also be employed. In one embodiment, the height of the first semiconductor oxide portions 21 can be in a range from 5 nm to 30 nm, and the height of the second semiconductor oxide portions 21' can be in a range from 6 nm to 100 nm, although lesser and greater heights can be employed for each of the first and second semiconductor oxide portions (21, 21'). As a consequence, each remaining portion of the first epitaxial pedestals 11 has a greater height than each remaining portion of the second epitaxial pedestals 11'. In one embodiment, the second semiconductor oxide portions 21' can have a greater concentration of the electrical dopants than the first semiconductor oxide portions 21 due to the presence of the electrical dopants in the second semiconductor oxide portions 21'. Each second semiconductor oxide portion 21' within the first support openings 221 is a dielectric material portion.

Figure 11A:
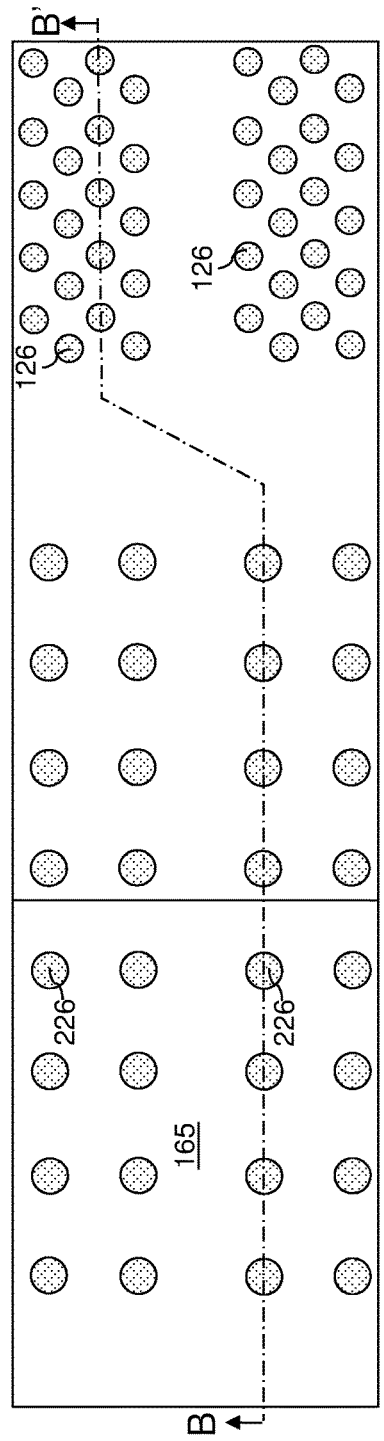
FIG. 11A is a top-down view of the first exemplary structure after formation of support opening fill material portions and memory opening fill material portions according to the first embodiment of the present disclosure.
Figure 11B:
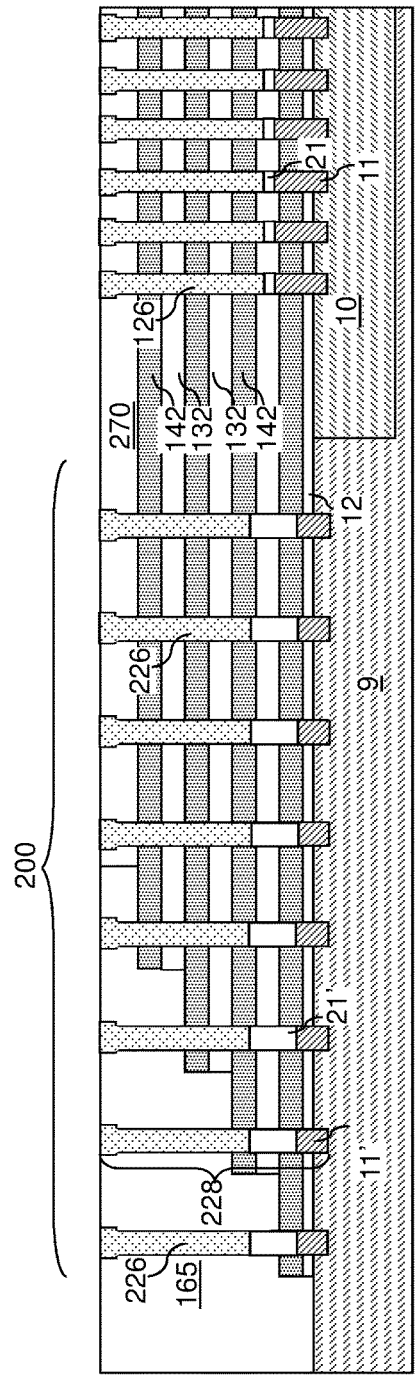
FIG. 11B is a vertical cross-sectional view of the first exemplary structure of FIG. 11A along the vertical plane B-B'.

Referring to FIGS. 11A and 11B, a fill material can be deposited in the first support openings 221 and in the first memory openings 121 simultaneously. The fill material can be an insulating material or a semiconducting material. The fill material has a composition different from the material of the first insulating layers 32, and can have electrical resistivity greater than 10 $\Omega$-cm. In one embodiment, the electrical resistivity of the fill material can be greater than 100 $\Omega$-cm. In one embodiment, the electrical resistivity of the fill material can be greater than 1,000 $\Omega$-cm, and may be in a range from 10,000 to $10^{20}$ $\Omega$-cm (such as $10^5$ to $10^{17}$ $\Omega$-cm). Non-limiting examples of the fill material includes amorphous silicon, polycrystalline silicon, an amorphous silicon-germanium alloy, and a polycrystalline silicon-germanium alloy. In case a semiconductor material is employed, the semiconductor material (such as amorphous silicon) is undoped (i.e., intrinsic). Excess portions of the deposited fill material can be removed from above the horizontal plane including the topmost surface of the first tier structure (132, 142, 270, 165). Remaining portions of the deposited first fill material in the first openings (121, 221) are herein referred to as fill material portions (126, 226).

The fill material portions (126, 226) include memory opening fill material portions 126 and support opening fill material portions 226. The fill material is simultaneously deposited within the first support openings 221 and the first memory openings 121 to form support opening fill material portions 226 overlying respective second semiconductor oxide portions 21' and memory opening fill material portions 126 overlying the respective first semiconductor oxide portion 21. Each first memory opening 121 is filled with a combination of a first epitaxial pedestal 11, a first semiconductor oxide portion 21, and a memory opening fill material portion 126, which collectively constitute a first memory opening fill stack structure (11, 21, 126). Each first support opening 221 is filled with a combination of a second epitaxial pedestal 11' (which can include a remaining unoxidized part of the doped upper portion 16), a second semiconductor oxide portion 21', and a support opening fill material portion 226, which collectively constitute a first support opening fill stack structure (11', 21', 226), which can be referred to as the sacrificial support pillar structures 228. The top surfaces of the fill material portions (126, 226) can be within the same horizontal plane as the top surface of the first tier dielectric cap layer 270.

Referring to FIGS. 12A and 12B, a second alternating stack (232, 242) of material layers is subsequently formed on the top surface of the first tier structure (132, 142, 270, 165). The second alternating stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers and the fourth material layers can be second insulating layers 232 and second sacrificial material layers 242, respectively. The third material of the second insulating layers 232 can be at least one insulating material. The fourth material of the second sacrificial material layers 242 is a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second alternating stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material. For example, the first and second sacrificial material layers (142, 242) can include silicon nitride, and the first and second insulating layers (132, 232) can include silicon oxide.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second alternating stack (232, 242) can have a uniform thickness that is substantially invariant within each respective second sacrificial material layer 242.

A second-tier dielectric cap layer 70 can be subsequently formed over the second alternating stack (232, 242). The second-tier dielectric cap layer 70 includes a dielectric material that is different from the material of the second sacrificial material layers 242. The second-tier dielectric cap layer 70 includes a dielectric material that may be the same as, or different from, the material of the second insulating layers 232. In one embodiment, the second-tier dielectric cap layer 70 can include silicon oxide.

The second alternating stack (232, 242) and the second-tier dielectric cap layer 70 constitute a second tier structure (232, 242, 70). The sacrificial support pillar structures 228 extend through the first tier structure (132, 142, 270, 165), and have respective topmost surfaces at an interface between the first tier structure (132, 142, 270, 165) and the second tier structure (232, 242, 70). The topmost surfaces of the sacrificial support pillar structure 228 are formed within the same horizontal plane as the interface between the first tier structure (132, 142, 270, 165) and the second tier structure (232, 242, 70).

Referring to FIGS. 13A and 13B, additional stepped surfaces are formed in the second alternating stack (232, 242) in the contact region 200. The additional stepped surfaces are herein referred to as second stepped surfaces. The second stepped surfaces are formed in a second stepped area, which is adjacent to, and does not overlie, the first stepped area of the first stepped surfaces within the first tier structure (132, 142, 270, 165). The second stepped surfaces can be adjacent to, and do not overlie, the stepped interface between the first alternating stack (132, 142) and the first retro-stepped dielectric material portion 165. The second stepped surfaces overlie a subset of the sacrificial support pillar structures 228 that do not extend through the first stepped surfaces within the first tier structure (132, 142, 270, 165).

The second stepped surfaces can be formed, for example, by forming a mask layer with an opening therein, etching a cavity within the levels of the topmost second sacrificial material layer 242 and the topmost second insulating layer 232, and iteratively expanding the etched area and vertically recessing the cavity by etching a pair of a second insulating layer 232 and a second sacrificial material layer 242 located directly underneath the bottom surface of the etched cavity within the etched area. The second alternating stack (232, 242) is patterned such that each underlying second sacrificial material layer 242 laterally protrudes farther than any overlying second sacrificial material layer 242 in the etched region, and each underlying second insulating layer 232 laterally protrudes farther than any overlying second insulating layer 232 in the etched region. The etched area includes the area of the contact region 200, which includes the contact area for the second alternating stack (232, 242) and a contact area for the first alternating stack (132, 142).

Thus, the second alternating stack (232, 242) is patterned to form the second stepped surfaces thereupon. The cavity formed by removal of portions of the second alternating stack (232, 242) is herein referred to as a second stepped cavity. The area of the second stepped cavity includes the area of the first retro-stepped first dielectric material portion 165, from which all layers of the second alternating stack (232, 242) are removed. The area of the second stepped cavity further includes the area of the second stepped surfaces of the second alternating stack (232, 242).

Dielectric material is deposited to fill the second stepped cavity. Excess portions of the dielectric material overlying the topmost surface of the second alternating stack (232, 242) are removed, for example, by chemical mechanical planarization. The remaining portion of the deposited dielectric material is retro-stepped, and thus, forms a second dielectric material portion, which is herein referred to as a second retro-stepped dielectric material portion 265. The second retro-stepped dielectric material portion 265 is located on, and over, the second stepped surfaces of the second alternating stack (232, 242). The second retro-stepped dielectric material portion 265 is formed on the second stepped surfaces. The contact region 200 comprises a region of the first stepped surfaces and a region of the second stepped surfaces. Upon formation of the second retro-stepped dielectric material portion 265, the second retro-stepped dielectric material portion 265 is incorporated into the second tier structure (232, 242, 70, 265), i.e., becomes an element of the second tier structure (232, 242, 70, 265).

The first stepped surfaces and the second stepped surfaces are collectively referred to as "stepped surfaces." A first portion of the stepped surfaces is the first stepped surfaces located in the first tier structure (132, 142, 270, 165). As second portion of the stepped surfaces is the second stepped surfaces located in the second tier structure (232, 242, 70, 265). The first stepped surfaces and the second stepped surfaces are located within the contact region 200.

The region of the stepped surfaces is herein referred to as a terrace region. Each sacrificial material layer (142, 242) among the first and second sacrificial material layers (142, 242) that is not a bottommost first sacrificial material layer 142 laterally extends less than any underlying layer among the first and second sacrificial material layers (142, 242). The terrace region includes stepped surfaces of the first and second alternating stacks (132, 142, 232, 242) that continuously extend from a bottommost layer within the first alternating stack (132, 142) to a topmost layer within the second alternating stack (232, 242).

Figure 14A:
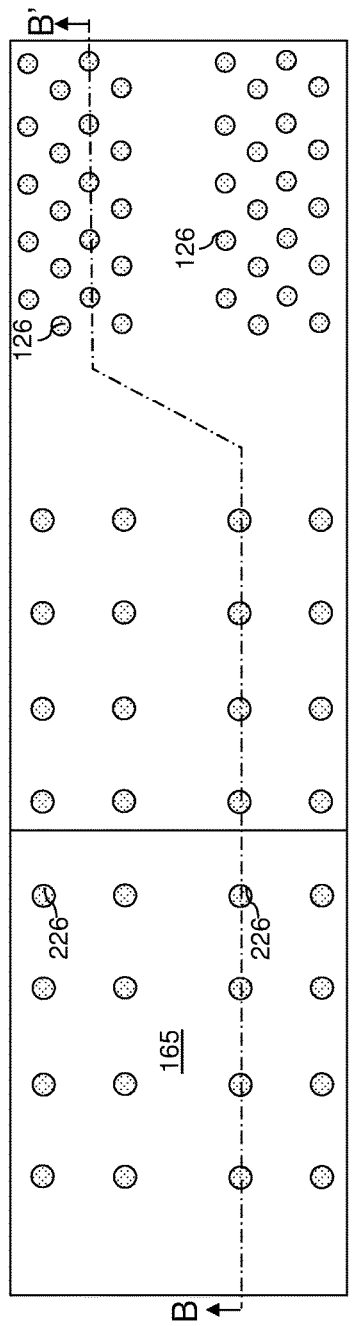
FIG. 14A is a top-down view of the first exemplary structure after formation of second memory openings and second support openings according to the first embodiment of the present disclosure.
Figure 14B:
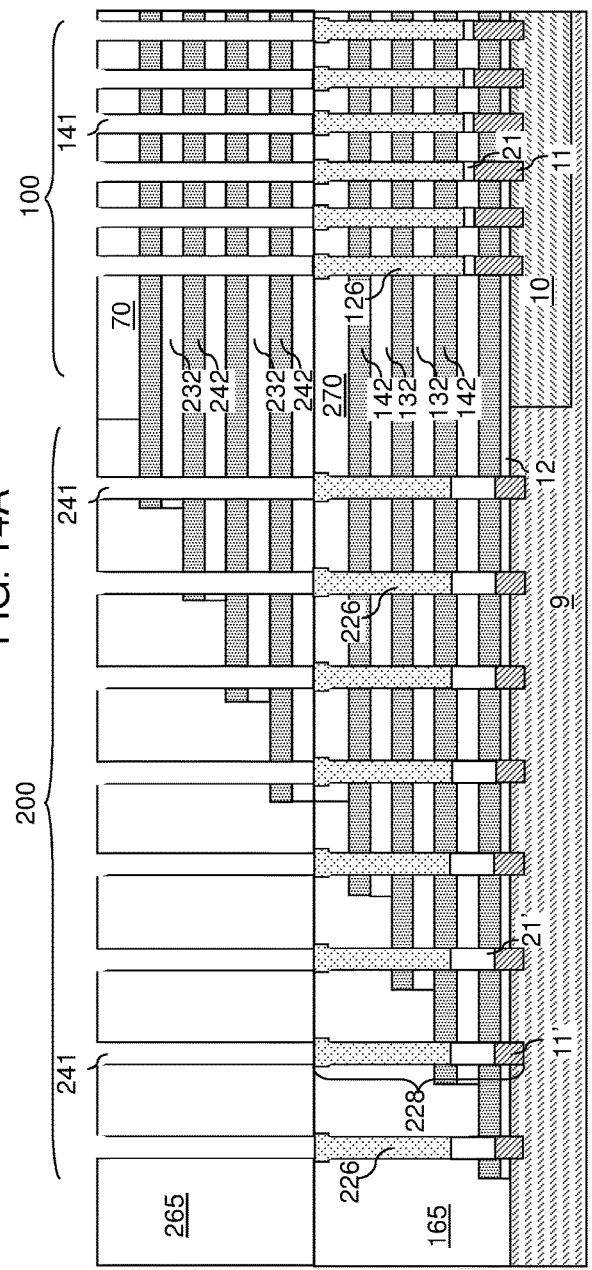
FIG. 14B is a vertical cross-sectional view of the first exemplary structure of FIG. 14A along the vertical plane B-B'.

Referring to FIGS. 14A and 14B, second openings (141, 241) are formed through the second tier structure (232, 242, 265, 70) to the top surface of the first tier structure (132, 142, 270, 165). The second openings (141, 241) include second memory openings 141 that are formed in the memory array region 100 and second support openings 241 that are formed in the contact region 200.

The second memory openings 241 are formed through the second tier structure (232, 242, 70, 265) in areas that overlap with the first memory openings 121, i.e., with the memory opening fill material portions 126. Thus, each second memory opening 141 can be formed on top of a respective memory opening fill material portion 126 (which is present in a first memory opening 121). In one embodiment, the bottom surface of each second memory opening 141 can be formed within a periphery of a top surface of an underlying memory opening fill material portion 126, i.e., can have an areal overlap with the top surface of the underlying memory opening fill material portion 126.

The second support openings 241 are formed through the second tier structure (232, 242, 70, 265) in areas that overlap with the first support openings 221, i.e., with the support opening fill material portions 226. Thus, each second support opening 241 can be formed on top of a respective support opening fill material portion 226 (which is present in a first support opening 221). In one embodiment, the bottom surface of each second support opening 241 can be formed within a periphery of a top surface of an underlying support opening fill material portion 226, i.e., can have an areal overlap with the top surface of the underlying support opening fill material portion 226.

The second openings (141, 241) can be formed by a combination of lithographic patterning and an anisotropic etch. For example, a lithographic material stack (not shown) including at least a photoresist layer can be formed over the second tier structure (232, 242, 265, 70), and can be lithographically patterned to form openings within the lithographic material stack. The pattern in the lithographic material stack can be transferred through the entirety of the second tier structure (232, 242, 265, 70) by at least one anisotropic etch that employs the patterned lithographic material stack as an etch mask. Portions of the second tier structure (232, 242, 265, 70) underlying the openings in the patterned lithographic material stack are etched to form the second openings (141, 241). In other words, transfer of the pattern in the patterned lithographic material stack through the second tier structure (232, 242, 265, 70) forms the second openings (141, 241).

In one embodiment, the chemistry of the anisotropic etch process employed to etch through the materials of the second alternating stack (232, 242) can alternate to optimize etching of the third and fourth materials in the second alternating stack (232, 242) while providing a comparable average etch rate for the second dielectric material portion 265. The anisotropic etch can be, for example, a series of reactive ion etches. The sidewalls of the second openings (141, 241) can be substantially vertical, or can be tapered.

A subset of the second support openings 241 can be formed through the second portion of the stepped surfaces (i.e., the second stepped surfaces) located on the second alternating stack (232, 242). The second support opening 241 and the second memory openings 141 can be simultaneously formed employing at least one anisotropic etch process.

The lateral dimensions (e.g., a diameter) of the second openings (141, 241) can be comparable to the lateral dimensions of the first openings (121, 221). The second openings (141, 241) can be wider than the respective first openings (121, 221). For example, the lateral dimensions of the second openings (141, 241) can be from about 20 nm to 200 nm at an upper portion of each second opening (141, 241), and can be about 10 nm to 150 nm at a lower portion of each second opening (141, 241). In one embodiment, the second memory openings 141 and the first memory openings 121 can be formed as an array of openings, which can be a periodic two-dimensional array of openings. The second support openings 241 and the first support openings 221 can be formed as discrete openings that are mutually separated from one another, and may, or may not, form a periodic two-dimensional array pattern. Subsequently, the patterned lithographic material stack can be subsequently removed, for example, by ashing.

Referring to FIGS. 15A and 15B, the fill materials of the fill material portions (126, 226) can be removed from underneath the second memory openings 141 and from underneath the second support openings 241 without removing the semiconductor oxide portions (21, 21'). An isotropic etch or an anisotropic etch may be performed to remove the material of the fill material portions (126, 226) selective to the materials of the insulating layers (132, 232), the sacrificial material layers (142, 242), the second tier dielectric cap layer 70, the first tier dielectric cap layer 270, and the semiconductor oxide portions (21, 21'). In case the fill material portions (126, 226) include a semiconductor material such as silicon or a silicon-germanium alloy, a wet etch process employing a KOH solution can be employed to remove the material of the fill material portions (126, 226).

Each vertically adjoined pair of a first memory opening 121 and a second memory opening 141 constitutes an inter-tier memory opening (121, 141). Each vertically adjoined pair of a first support opening 221 and a second support opening 241 constitutes an inter-tier support opening (221, 241). A stack of a first epitaxial pedestal 11 and a first semiconductor oxide portion 21 is located at a bottom portion of each inter-tier memory opening (121, 141). A stack of a second epitaxial pedestal 11' and a second semiconductor oxide portion 21' is located at a bottom portion of each inter-tier support opening (221, 241).

Each inter-tier memory opening (121, 141) extends through the entirety of the first alternating stack (132, 142, 270, 165) and the second alternating stack (232, 242, 70, 265). Likewise, each inter-tier support opening (221, 241) extends through the entirety of the first alternating stack (132, 142, 270, 165) and the second alternating stack (232, 242, 70, 265). Unfilled portions of the inter-tier memory openings (121, 141) are herein referred to as memory cavities 49. Unfilled portions of the inter-tier support openings (221, 241) are herein referred to as support cavities 149. Thus, simultaneous removal of the support opening fill material portions 226 and the memory opening fill material portions 126 from underneath the second memory openings 141 and the second support opening 241 forms the memory cavities 49 and the support cavities 149.

Each memory cavity 49 extends through a respective second memory opening 141 and an upper portion of an underlying first memory opening 121, while each support cavity 149 extends through a second support opening 241 and upper portion of an underlying first support opening 221 and bounded by a top surface of a respective second semiconductor oxide portion 21', which is a dielectric material portion. A bottommost surface of each memory cavity 49 is more proximal to a horizontal plane including the top surface of the substrate (9, 10) than a bottommost surface of the support cavity 149 is to the horizontal plane including the top surface of the substrate (9, 10) because the second semiconductor oxide portion 21' is thicker than the first semiconductor oxide portion 21.

FIG. 16A shows a vertical cross-sectional view of an memory cavity 49 in the inter-tier memory opening (121, 141) after the processing steps of FIGS. 15A and 15B. FIG. 16B shows a vertical cross-sectional view of support cavity 149 in an inter-tier support opening (221, 241) after the processing steps of FIGS. 15A and 15B.

Referring to FIGS. 17A and 17B, a stack of material layers for forming a memory film and a first semiconductor channel layer 601 can be deposited within each of the inter-tier memory openings (121, 141) and the inter-tier support opening (221, 241). For example, the stack of material layers can include an optional blocking dielectric layer 52, a memory material layer 54, a tunneling dielectric layer 56, and an optional first semiconductor channel layer 601.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the memory material layer 54 includes a silicon nitride layer. In one embodiment, the sacrificial material layers (142, 242) and the insulating layers (132, 232) can have vertically coincident sidewalls, and the memory material layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49 is present in the volume of each inter-tier memory opening (121, 141) that is not filled with the deposited material layers (52, 54, 56, 601). A support cavity 149 can be present within each volume of the second support opening 241 that is not filled with the deposited material layers (52, 54, 56, 601).

Referring to FIGS. 18A and 18B, the optional first semiconductor channel layer 601, the tunneling dielectric layer 56, the memory material layer 54, the blocking dielectric layer 52 are sequentially anisotropically etched employing at least one anisotropic etch process. The portions of the first semiconductor channel layer 601, the tunneling dielectric layer 56, the memory material layer 54, and the blocking dielectric layer 52 located above the top surface of the second tier dielectric cap layer 70 can be removed by the at least one anisotropic etch process. Further, the horizontal portions of the first semiconductor channel layer 601, the tunneling dielectric layer 56, the memory material layer 54, and the blocking dielectric layer 52 at a bottom of each memory cavity 49 and each support cavity 149 can be removed to form openings in remaining portions thereof. Each of the first semiconductor channel layer 601, the tunneling dielectric layer 56, the memory material layer 54, and the blocking dielectric layer 52 can be etched by anisotropic etch process.

The memory material layer 54 can comprise a charge trapping material or a floating gate material. In one embodiment, each memory material layer 54 can include a vertical stack of charge storage regions that store electrical charges upon programming. In one embodiment, the memory material layer 54 can be a memory material layer in which each portion adjacent to the sacrificial material layers (142, 242) constitutes a charge storage region.

The duration of the anisotropic etch process after the blocking dielectric layer 52 is etched through is selected such that the first semiconductor oxide portions 21 are etched through to physically expose a surface of an underlying first epitaxial pedestal 11, while second semiconductor oxide portions 21' are not etched through. In other words, the duration of the portion of the anisotropic etch process that is employed to etch the first and second semiconductor material portions (21, 21') is selected such that the vertical etch distance is greater than the thickness of the first semiconductor oxide portion 21, and is less than the thickness of the second semiconductor oxide portion 21'. Within each inter-tier memory opening (121, 141), a surface of a respective first epitaxial pedestal 11 can be physically exposed underneath the opening through the first semiconductor channel layer 601, the tunneling dielectric layer 56, the memory material layer 54, and the blocking dielectric layer 52. Within each inter-tier support opening (221, 241), sidewall surfaces and a recessed horizontal surface of a respective second epitaxial pedestal 11' is not physically exposed through an opening that extends through the first semiconductor channel layer 601, the tunneling dielectric layer 56, the memory material layer 54, and the blocking dielectric layer 52.

A set of a blocking dielectric layer 52, a memory material layer 54, and a tunneling dielectric layer 56 in each of the inter-tier memory openings (121, 141) constitutes a memory film 50, which includes a plurality of charge storage regions (as embodied as the memory material layer 54) that are insulated from surrounding materials by the blocking dielectric layer 52 and the tunneling dielectric layer 56. A set of a blocking dielectric layer 52, a memory material layer 54, and a tunneling dielectric layer 56 in each of the inter-tier support openings (221, 241) constitutes a dielectric layer stack 150, which includes an instance of a same set of layers as an instance of the memory film 50. In one embodiment, the first semiconductor channel layer 601, the tunneling dielectric layer 56, the memory material layer 54, and the blocking dielectric layer 52 can have vertically coincident sidewalls.

Referring to FIGS. 19A and 19B, a second semiconductor channel layer 602 can be deposited directly on the semiconductor surface of the epitaxial pedestal 11, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49 in each inter-tier memory opening (121, 141), or may fully fill the memory cavity 49 in each inter-tier memory opening (121, 141).

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

In case the memory cavity 49 in each inter-tier memory opening (121, 141) and/or the support cavity 149 in each second support opening 241 are not completely filled by the second semiconductor channel layer 602, a dielectric core layer 62L can be deposited in the memory cavities 49 and/or the support cavities 249. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIGS. 20A and 20B, the horizontal portion of the dielectric core layer 62L can be removed, for example, by a recess etch from above the top surface of the second tier dielectric cap layer 70. Remaining portions of the dielectric core layer 62L constitute dielectric cores (62, 162), which include first dielectric cores 62 formed in the inter-tier memory openings (121, 141) and second dielectric cores 162 formed in the inter-tier support openings (221, 241). Further, the horizontal portion of the second semiconductor channel layer 602 located above the top surface of the second tier dielectric cap layer 70 can be removed by a planarization process, which can employ a recess etch or chemical mechanical planarization (CMP).

Each adjoining pair of a first semiconductor channel layer 601 and a second semiconductor channel layer 602 in an inter-tier memory opening (121, 141) collectively form a vertical semiconductor channel 60. Each adjoining pair of a first semiconductor channel layer 601 and a second semiconductor channel layer 602 in an inter-tier support opening (221,241) collectively form a vertical semiconductor layer 160. The vertical semiconductor channel 60 with each inter-tier memory opening (121, 141) is subsequently electrically connected to a respective contact via structure (e.g., electrically connected to a respective bit line by a bit line contact via). The vertical semiconductor layer 160 with each inter-tier support opening (221, 241) is not subsequently electrically connected to any contact via structure (and not electrically connected to any bit line), and remains electrically floating. Within each inter-tier memory opening (121, 141), electrical current can flow through a vertical semiconductor channel 60 when a vertical NAND device including the vertical semiconductor channel 60 is turned on.

Within each inter-tier memory opening (121, 141) and each inter-tier support opening (221, 241), a tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 within the inter-tier memory openings (121, 141) collectively constitute a memory film 50. Each adjoining set of a blocking dielectric layer 52, a memory material layer 54, and a tunneling dielectric layer 56 within the inter-tier support openings (221, 241) collectively constitute a dielectric layer stack 150. Each memory film 50 within an inter-tier memory opening (121, 141) can store electrical charges with a macroscopic retention time. Each a dielectric layer stack 150 within an inter-tier support opening (221, 241) is an inactive component that functions merely as an insulating film. In some embodiments, a blocking dielectric layer 52 may not be present in the memory film 50 and the dielectric layer stack 150 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

In one embodiment, a first epitaxial pedestal 11 can be formed at a bottom portion of each first memory opening 121 and directly on the substrate (9, 10), and a vertical semiconductor channel 60 can be formed directly on a portion of the first epitaxial pedestal 11. A second epitaxial pedestal 11' can be formed at a bottom portion of each first support opening 221 concurrently with formation of the first epitaxial pedestals 11, and a bottommost surface of a vertical semiconductor layer 160 can be formed above, and is vertically spaced from, any material of the second epitaxial pedestal 11' by the dielectric material of the second semiconductor oxide portion 21'. Thus, the vertical semiconductor layer 160 does not electrically contact the semiconductor substrate (9, 10).

Figures 21A, 21B:
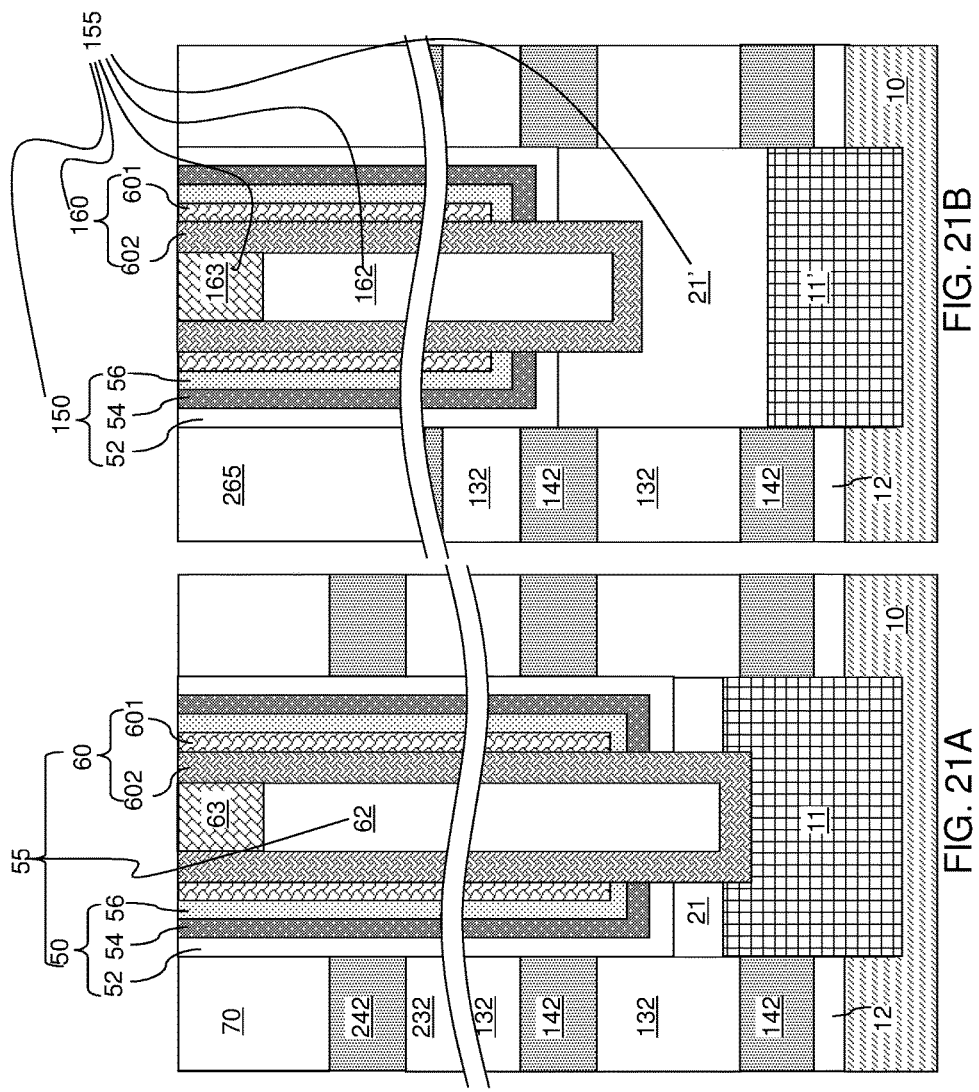
FIG. 21A is a vertical cross-sectional view of the inter-tier memory opening after formation of a drain region according to the first embodiment of the present disclosure.
FIG. 21B is a vertical cross-sectional view of the inter-tier support opening at the processing step of FIG. 21A.

Referring to FIGS. 21A and 21B, the top surface of each dielectric core (62, 162) can be further recessed within each inter-tier memory opening (121, 141) and within inter-tier support opening (221, 241), for example, by a recess etch to a depth that is located between the top surface of the second tier dielectric cap layer 70 and the bottom surface of the second tier dielectric cap layer 70. A doped semiconductor material can be deposited within each recessed region above the dielectric cores (62, 162). The doped semiconductor material can be, for example, doped polysilicon. Excess portions of the deposited semiconductor material can be removed from above the top surface of the second tier dielectric cap layer 70, for example, by chemical mechanical planarization (CMP) or a recess etch. Within the inter-tier memory openings (121, 141), each remaining portion of the doped semiconductor material overlying a respective first dielectric core 62 constitutes a drain region 63. Within the inter-tier support opening (221, 241), each remaining portion of the doped semiconductor material overlying a respective second dielectric core 162 constitutes a dummy drain region 163.

Each drain region 63 within an inter-tier memory opening (121, 141) is a top active region of a vertical field effect transistor including a respective vertical semiconductor channel 60. Each dummy drain region 163 within an inter-tier support opening (221, 241) is electrically inactive. Each dummy drain region 163 in the inter-tier support openings (221, 241) is not subsequently contacted by any contact via structure. The drain regions 63 and the dummy drain regions 163 can have the same material composition. In one embodiment, the drain regions 63 and the dummy drain regions 163 can be heavily doped. In one embodiment, the drain regions 63 and the dummy drain regions 163 can include electrical dopants (p-type dopants or n-type dopants) at an atomic concentration greater than $5.0 \times 10^{19}/cm^3$.

Each contiguous set of a memory film 50, a vertical semiconductor channel 60, and an optional first dielectric core 62 formed within an inter-tier memory opening (121, 141) constitutes a memory stack structure 55. Each contiguous set of a second semiconductor oxide portion 21', a dielectric layer stack 150, a vertical semiconductor layer 160, an optional second dielectric core 162, and a dummy drain region 163 formed within an inter-tier support opening (221, 241) constitutes a support pillar structure 155.

Each support pillar structure 155 can be located within a respective support opening, i.e., an inter-tier support opening (221, 241). The support pillar structure 155 comprises a vertical semiconductor layer 160 comprising the same material as a vertical semiconductor channel 60, and a dielectric material portion as embodied as a second semiconductor oxide portion 21' that electrically isolates the vertical semiconductor layer 160 from the substrate (9, 10).

In one embodiment, each support cavity 149 as formed at the processing steps of FIGS. 15A and 15B can extend through the entirety of the second tier structure (232, 242, 70, 265), and each dielectric material portion can be a second semiconductor oxide portion 21' that is more proximal to a horizontal plane including the bottom surface of the first tier structure (132, 142, 270, 165) than to the horizontal plane including the top surface of the first tier structure (132, 142, 270, 165), and the vertical semiconductor layer 160 protrudes into an upper region of the second semiconductor oxide portion 21' and does not extend through the second semiconductor oxide portion 21'.

Figures 22A, 22B:
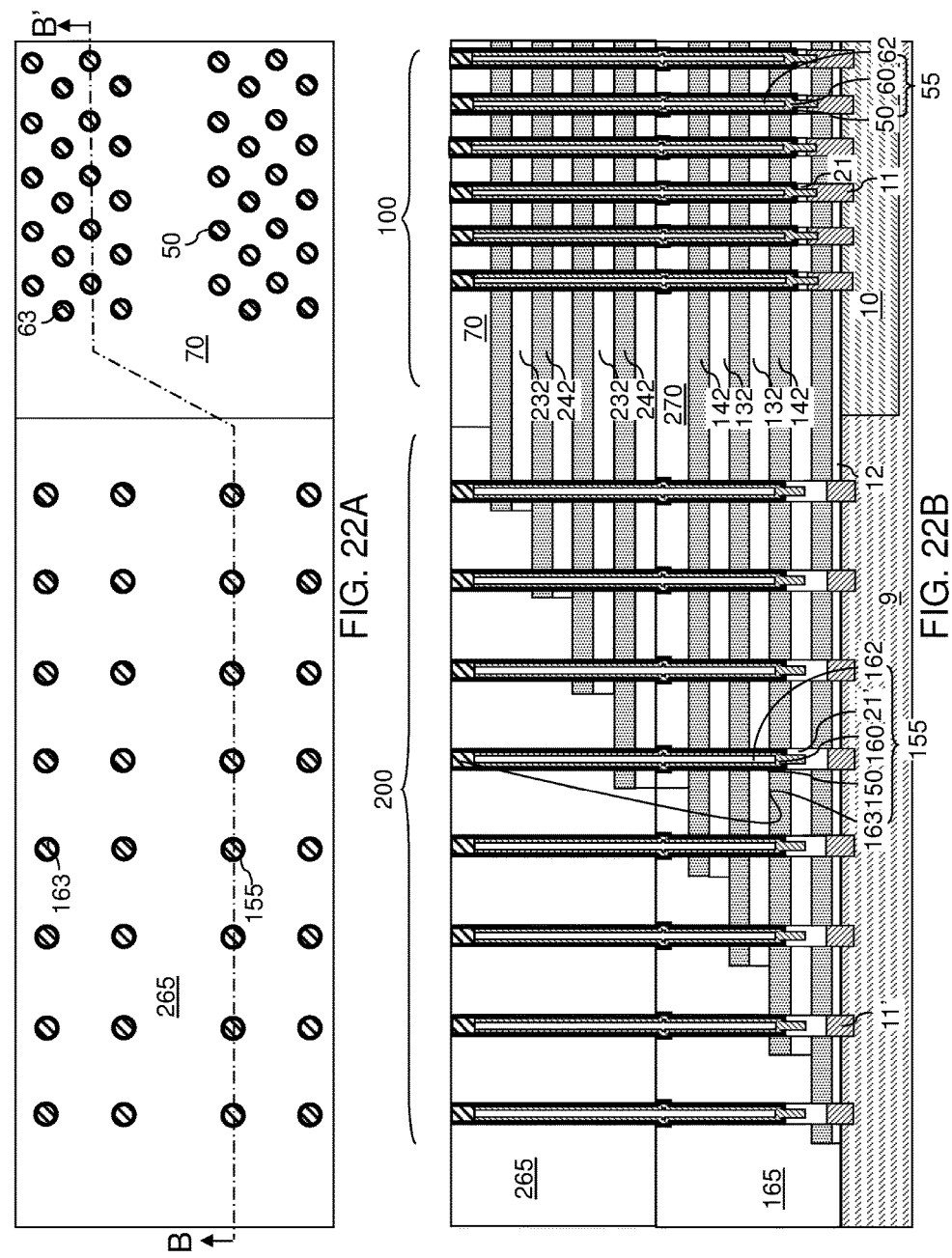
FIG. 22A is a top-down view of the first exemplary structure after formation of memory stack structures, support pillar structures, drain regions, and dummy drain regions according to the first embodiment of the present disclosure.
FIG. 22B is a vertical cross-sectional view of the first exemplary structure of FIG. 22A along the vertical plane B-B'.

Referring to FIGS. 22A and 22B, the first exemplary structure is illustrated after formation of memory stack structures 55 and support pillar structures 155, drain regions 63, and dummy drain regions 163. Each memory stack structure 55 is formed in a respective memory cavity 49 while elements of the support pillar structures 155 are formed in the support cavities 149.

Figure 23A:
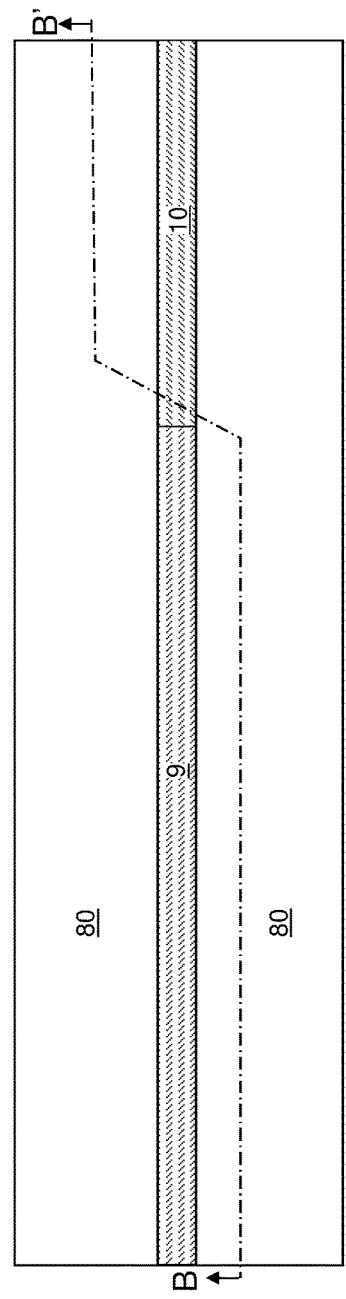
FIG. 23A is a top-down view of the first exemplary structure after formation of a contact level dielectric layer and a backside contact trench according to the first embodiment of the present disclosure.
Figure 23B:
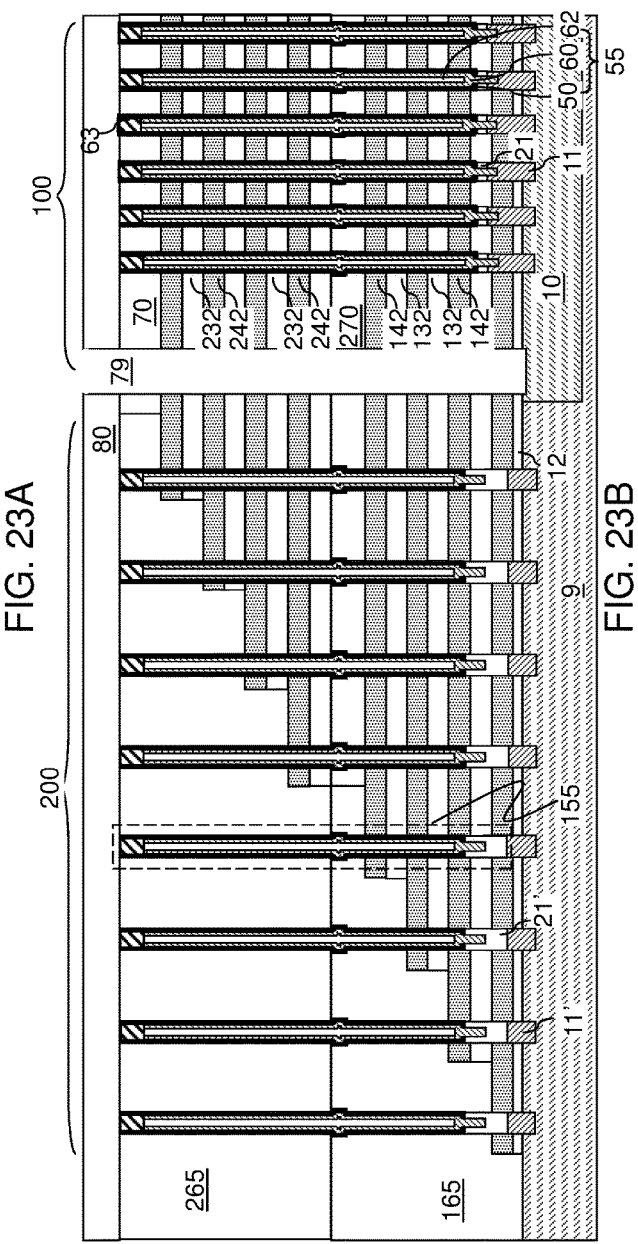
FIG. 23B is a vertical cross-sectional view of the first exemplary structure of FIG. 23A along the vertical plane B-B'.

Referring to FIGS. 23A and 23B, a contact level dielectric layer 80 can be formed over the second tier structure (232, 242, 265, 70). The contact level dielectric layer 80 includes a dielectric material such as silicon oxide, a dielectric metal oxide, and/or organosilicate glass. In one embodiment, the contact level dielectric layer 80 can be composed primarily of a silicon oxide material. The thickness of the contact level dielectric layer 80 can be in a range from 50 nm to 500 nm, although lesser and greater thicknesses can also be employed.

A photoresist layer (not shown) can be applied over the contact level dielectric layer 80, and is lithographically patterned to form at least one elongated opening in each area in which formation of a backside contact via structure is desired. The pattern in the photoresist layer can be transferred through the contact level dielectric layer 80, the second tier structure (232, 242, 265, 70), and the first tier structure (132, 142, 270, 165) employing an anisotropic etch to form the at least one backside trench 79, which extends at least to the top surface of the substrate (9, 10). In one embodiment, the at least one backside trench 79 can include a source contact opening in which a source contact via structure can be subsequently formed.

Referring to FIGS. 24A and 24B, an etchant that selectively etches the second material of the sacrificial material layers (142, 242) with respect to the materials of the insulating layers (132, 232) and the semiconductor material(s) of the substrate (9, 10) can be introduced into the at least one backside trench 79, for example, employing an etch process. Backside recesses (143, 243) are formed in volumes from which the sacrificial material layers (142, 242) are removed. Specifically, first backside recesses 143 are formed in the volumes from which the first sacrificial material layers 142 are removed, and second backside recesses 243 are formed in the volumes from which the second sacrificial material layers 242 are removed.

The removal of the second material of the sacrificial material layers (142, 242) can be selective to the materials of the insulating layers (132, 232), the materials of the retro-stepped dielectric material portions (165, 265), the semiconductor material(s) of the substrate (9, 10), and the material of the outermost layer of the memory films 50. Each backside recess (143, 243) can be a laterally extending cavity having a lateral dimension that is greater than the vertical extent of the cavity. In other words, the lateral dimension of each backside recess (143, 243) can be greater than the height of the backside recess (143, 243). The inter-tier memory openings containing the memory cavity 49, the first support openings 221, and the second support openings 241 are herein referred to as front side openings or front side cavities in contrast with the backside recesses (143, 243). In one embodiment, the memory array region 100 comprises an array of monolithic three-dimensional NAND strings having a plurality of device levels disposed above the substrate (9, 10). In this case, each backside recess (143, 243) can define a space for receiving a respective word line of the array of monolithic three-dimensional NAND strings.

Each of the plurality of backside recesses (143, 243) can extend substantially parallel to the top surface of the substrate (9, 10). A backside recess (143, 243) can be vertically bounded by a top surface of an underlying insulating layer 32 and a bottom surface of an overlying insulating layer 32. In one embodiment, each backside recess (143, 243) can have a uniform height throughout.

Subsequently, physically exposed surface portions of the optional epitaxial pedestals (11, 11') and the semiconductor material layer 10 may be converted into dielectric material portions by thermal conversion and/or plasma conversion of the semiconductor materials into dielectric materials. For example, thermal conversion and/or plasma conversion can be employed to convert a surface portion of each epitaxial pedestal (11, 11') into a tubular dielectric spacer 116, and to convert each physically exposed surface portion of the semiconductor material layer 10 into a planar dielectric portion 616.

Referring to FIGS. 25A and 25B, a backside blocking dielectric layer (not shown) can be optionally formed. The backside blocking dielectric layer, if present, comprises a dielectric material that functions as a control gate dielectric for the control gates to be subsequently formed in the backside recesses (143, 243). In case the blocking dielectric layer 52 is present within each memory opening, the backside blocking dielectric layer is optional. In case the blocking dielectric layer 52 is omitted, the backside blocking dielectric layer is present.

The backside blocking dielectric layer can be formed in the backside recesses (143, 243) and on a sidewall of the backside trench 79. The backside blocking dielectric layer can be formed directly on horizontal surfaces of the insulating layers (132, 232) and physically exposed sidewalls of the blocking dielectric layer 52 within the backside recesses (143, 243). If the backside blocking dielectric layer is formed, formation of the tubular dielectric spacers and the planar dielectric portion prior to formation of the backside blocking dielectric layer is optional.

The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. A backside cavity is present within the portion of each backside trench 79 that is not filled with the backside blocking dielectric layer.

At least one conducive material can be deposited to form electrically conductive layers (146, 246). The at least one conductive material can include a metallic liner and a conductive fill material layer. The metallic liner can include a metallic nitride material such as TiN, TaN, WN, an alloy thereof, or a stack thereof. The metallic liner functions as a diffusion barrier layer and an adhesion promotion layer. The metallic liner can be deposited by a conformal deposition method such as chemical vapor deposition (CVD) or atomic layer deposition (ALD), and can have a thickness in a range from 1 nm to 6 nm, although lesser and greater thicknesses can also be employed. The conductive fill material layer can be deposited directly on the metallic liner by a conformal deposition method such as chemical vapor deposition or atomic layer deposition. The conductive fill material layer includes a conductive material. The conductive material can include at least one elemental metal such as W, Cu, Co, Mo, Ru, Au, and Ag. Additionally or alternatively, the conductive fill material layer (146, 246) can include at least one intermetallic metal alloy material. Each intermetallic metal alloy material can include at least two metal elements selected from W, Cu, Co, Mo, Ru, Au, Ag, Pt, Ni, Ti, and Ta.

In one embodiment, the conductive fill material layer can consist essentially of W, Co, Mo, or Ru.

Each portion of the at least one conducive material that fills a backside recess (143 or 243) constitutes an electrically conductive layer (146 or 246). The electrically conductive layers (146, 246) include first electrically conductive layers 146 that are formed in the first backside recesses 143 in the first tier structure, and second electrically conductive layers 246 that are formed in the second backside recesses 243 in the second tier structure. The portion of the at least one conductive material that excludes the electrically conductive layers (146, 246) constitutes continuous metallic material layer 46L. A plurality of electrically conductive layers (146, 246) can be formed in the plurality of backside recesses (143, 243), and the continuous metallic material layer 46L can be formed on the sidewalls of each backside trench 79 and over the contact level dielectric layer 80. A backside cavity is present in the portion of each backside trench 79 that is not filled with the backside blocking dielectric layer and the continuous metallic material layer 46L.

Each first sacrificial material layer 142 can be replaced with a respective first electrically conductive layer 146, and each second sacrificial material layer 242 can be replaced with a respective second electrically conductive layer 246, while the support pillar structures 155 and the memory stack structures 55 provide structural support to the first and second insulating layers (132, 232).

Referring to FIGS. 26A and 26B, the deposited metallic material of the continuous electrically conductive material layer 46L is etched back from the sidewalls of each backside trench 79 and from above the contact level dielectric layer 80, for example, by an isotropic wet etch, an anisotropic dry etch, or a combination thereof. The electrically conductive layers (146, 246) in the backside recesses are not removed by the etch process. In one embodiment, the sidewalls of each electrically conductive layer (146 or 246) can be vertically coincident after removal of the continuous electrically conductive material layer 46L.

Each electrically conductive layer (146 or 246) can function as a combination of a plurality of control gate electrodes located at a same level and a word line electrically interconnecting, i.e., electrically shorting, the plurality of control gate electrodes located at the same level. The plurality of control gate electrodes within each electrically conductive layer (146 or 246) are the control gate electrodes for the vertical memory devices including the memory stack structures 55. In other words, each electrically conductive layer (146 or 246) can be a word line that functions as a common control gate electrode for the plurality of vertical memory devices.

Referring to FIGS. 27A and 27B, an insulating material layer can be formed in the at least one backside trench 79 and over the contact level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 80 and at the bottom of each backside trench 79. Each remaining portion of the insulating material layer constitutes an insulating spacer 74. The anisotropic etch can continue to etch through physically exposed portions of the planar dielectric portion, if present, in each backside trench 79. Thus, an insulating spacer 74 is formed in each backside trench 79 directly on physically exposed sidewalls of the electrically conductive layers (146, 246).

A source region 61 can be formed underneath each backside trench 79 by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74. A surface portion of the semiconductor material layer 10 adjoining a source region 61 and continuously extending to the epitaxial pedestals (11, 11') constitutes a horizontal semiconductor channel 59, which is a common portion of a plurality of semiconductor channels (59, 11, 60) that include the vertical semiconductor channels 60 within the memory stack structures 55.

A backside contact via structure 76 can be formed within each cavity. Each contact via structure 76 can fill a respective cavity. The backside contact via structures 76 can be formed by depositing at least one conductive material in the remaining unfilled volume (i.e., the backside cavity) of the backside trench 79. For example, the at least one conductive material can include a conductive liner (not expressly shown) and a conductive fill material portion (not expressly shown). The conductive liner can include a metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 80 overlying the alternating stacks (132, 146, 232, 246) as a stopping layer. If chemical mechanical planarization (CMP) process is employed, the contact level dielectric layer 80 can be employed as a CMP stopping layer. Each remaining continuous portion of the at least one conductive material in the backside trenches 79 constitutes a backside contact via structure 76. Each backside contact via structure 76 can be formed directly on a top surface of a source region 61. Each backside contact via structure 76 can contact a respective source region 61, and can be laterally surrounded by a respective insulating spacer 74.

Referring to FIGS. 28A and 28B, additional contact via structures (88, 86) can be formed through the contact level dielectric layer 80 and through the retro-stepped dielectric material portions (165, 265). For example, drain contact via structures 88 can be formed through the contact level dielectric layer 80 on each drain region 63. Each drain contact via structure 88 can be formed through the contact level dielectric layer 80 on each of the drain regions 63, while not forming any conductive structure through the contact level dielectric layer 80 over the doped semiconductor material portions of the dummy drain regions 163. Subsequently, bit lines (not shown) are formed in electrical contact with the drain contact via structures 88.

Control gate contact via structures 86 can be formed in the terrace region on the electrically conductive layers (146, 246) through the contact level dielectric layer 80, and through the retro-stepped dielectric material portions (165, 265). The control gate contact via structures 86 vertically extend at least through a dielectric material portion (i.e., the second retro-stepped dielectric material portion 265) within the second tier structure (232, 246, 265, 70), and contact a respective electrically conductive layer selected from the first and second electrically conductive layers (146, 246). Peripheral gate contact via structures (not shown) and peripheral active region contact via structures (not shown) can be formed through the retro-stepped dielectric material portions (165, 265) directly on respective nodes of the peripheral devices 700 illustrated in FIG. 1.

Each memory stack structure 55 comprises a vertical semiconductor channel 60 that is electrically shorted to a horizontal semiconductor channel 59 located within the substrate (9, 10), and each of the support pillar structures 155 comprises a vertical semiconductor layer 160 comprising the same material as the vertical semiconductor channel 60 that is electrically isolated from the substrate (9, 10) by a respective dielectric material portion as embodied as a second semiconductor oxide portion 21'.

Referring to FIGS. 29A and 29B, a second exemplary structure according to a second embodiment of the present disclosure can be the same as the first exemplary structure illustrated in FIGS. 8A and 8B. Thus, a first epitaxial pedestal 11 is formed at a bottom portion of each first memory opening 121 directly on the substrate (9, 10), and a second epitaxial pedestal 11' is formed at a bottom portion of each first support opening 221 directly on the substrate (9, 10) concurrently with formation of the first epitaxial pedestals 11.

Figure 30A:
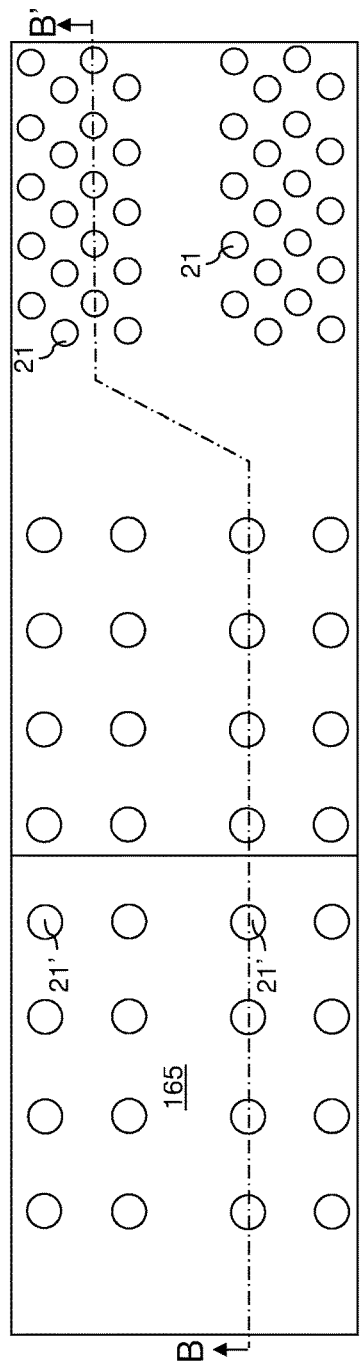
FIG. 30A is a top-down view of the second exemplary structure after formation of semiconductor oxide portions according to the second embodiment of the present disclosure.
Figure 30B:
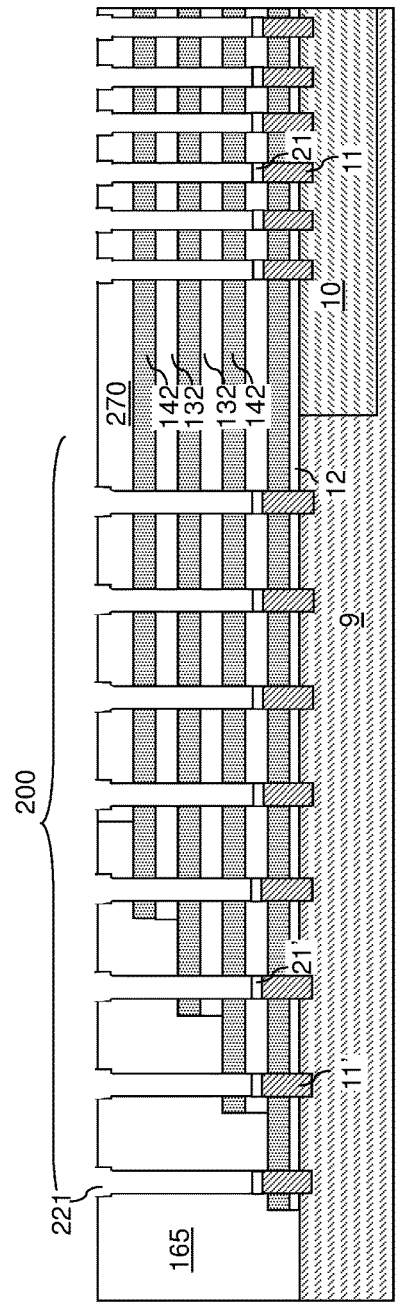
FIG. 30B is a vertical cross-sectional view of the second exemplary structure of FIG. 30A along the vertical plane B-B'.

Referring to FIGS. 30A and 30B, semiconductor oxide portions (21, 21') are formed by oxidation of upper portions of the epitaxial pedestals (11, 11'). The processing steps of FIGS. 10A and 10B can be performed to form the semiconductor oxide portions (21, 21'). The semiconductor oxide portions (21, 21') include first semiconductor oxide portions 21 and second semiconductor oxide portions 21'. Each first semiconductor oxide portion 21 is formed by conversion of an upper portion of a respective first epitaxial pedestal 11, and each second semiconductor oxide portion 21' is formed by conversion of an upper portion of a respective second epitaxial pedestal 11'. The first semiconductor oxide portions 21 and the second semiconductor oxide portions 21' can have the same thickness. Each remaining portion of the first epitaxial pedestal 11 and each remaining portion of the second epitaxial pedestal 11' can have the same thickness and the same height.

Figure 31A:
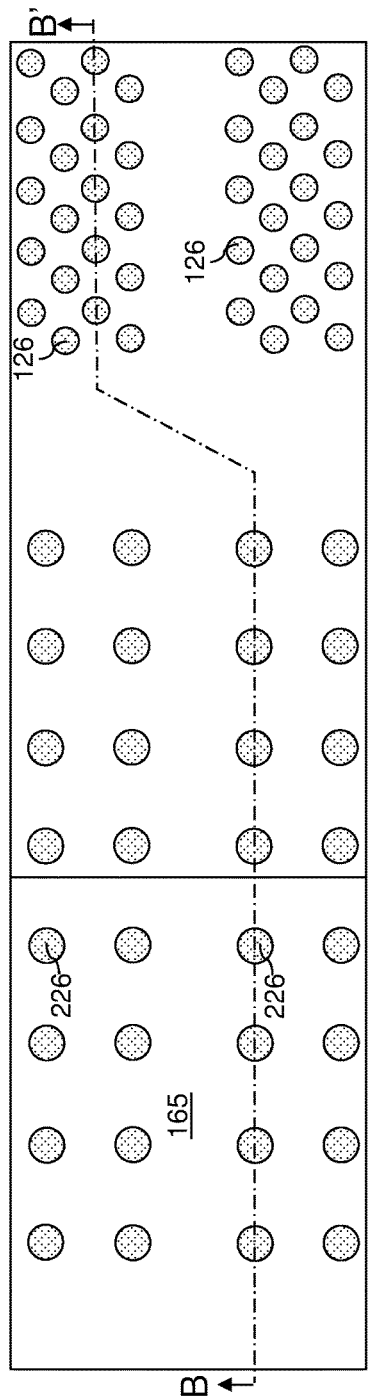
FIG. 31A is a top-down view of the second exemplary structure after formation of support opening fill material portions and memory opening fill material portions according to the second embodiment of the present disclosure.
Figure 31B:
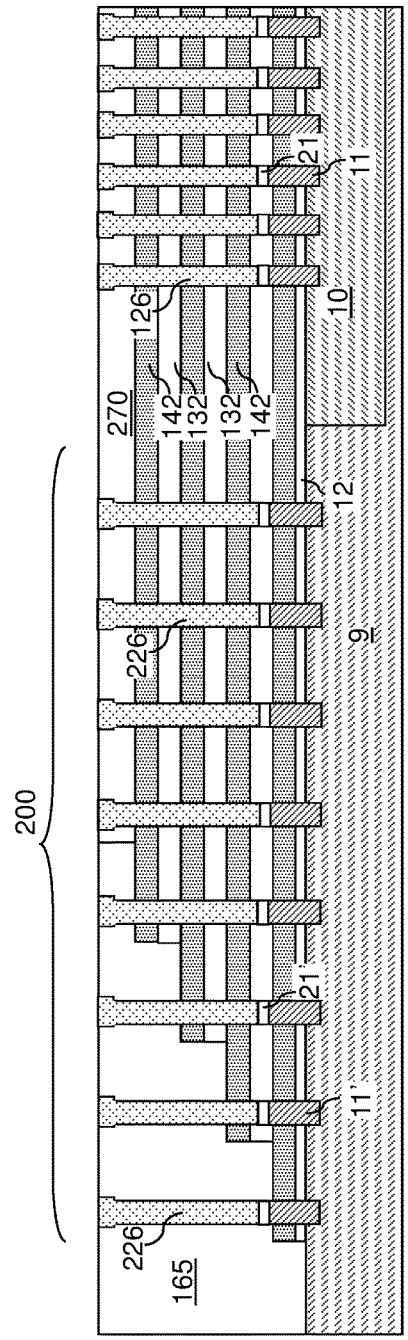
FIG. 31B is a vertical cross-sectional view of the second exemplary structure of FIG. 31A along the vertical plane B-B'.

Referring to FIGS. 31A and 31B, a fill material can be simultaneously deposited within the remaining volumes of the first memory openings 121 and the remaining volumes of the first support openings 221 to form memory opening fill material portions 126 and support opening fill material portions 226, respectively. The processing steps of FIGS. 11A and 11B can be performed to form the fill material portions (126, 226). In one embodiment, the memory opening fill material portions 126 and the support opening fill material portions 226 can have the same height.

Figure 32A:
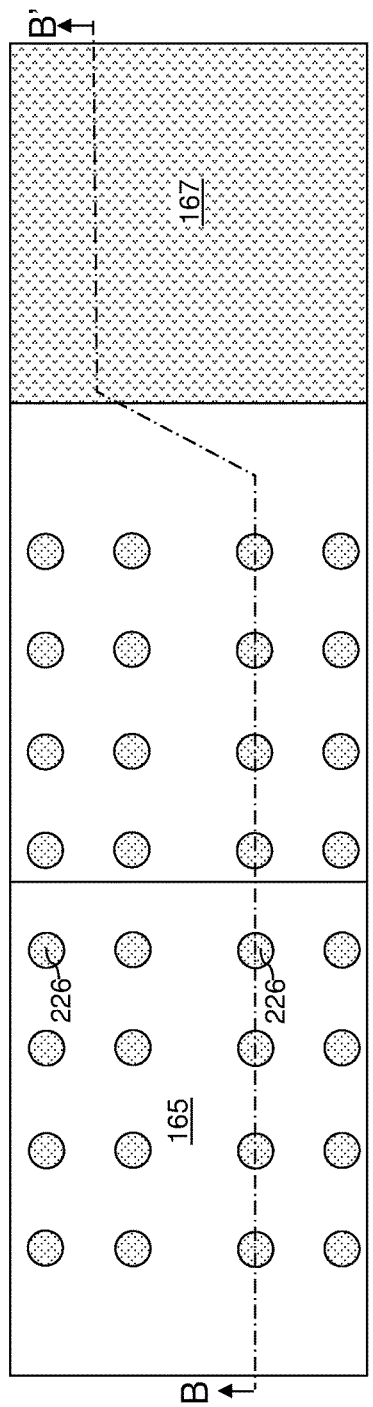
FIG. 32A is a top-down view of the second exemplary structure after recessing the support opening fill material portions while masking the memory opening fill material portions according to the second embodiment of the present disclosure.
Figure 32B:
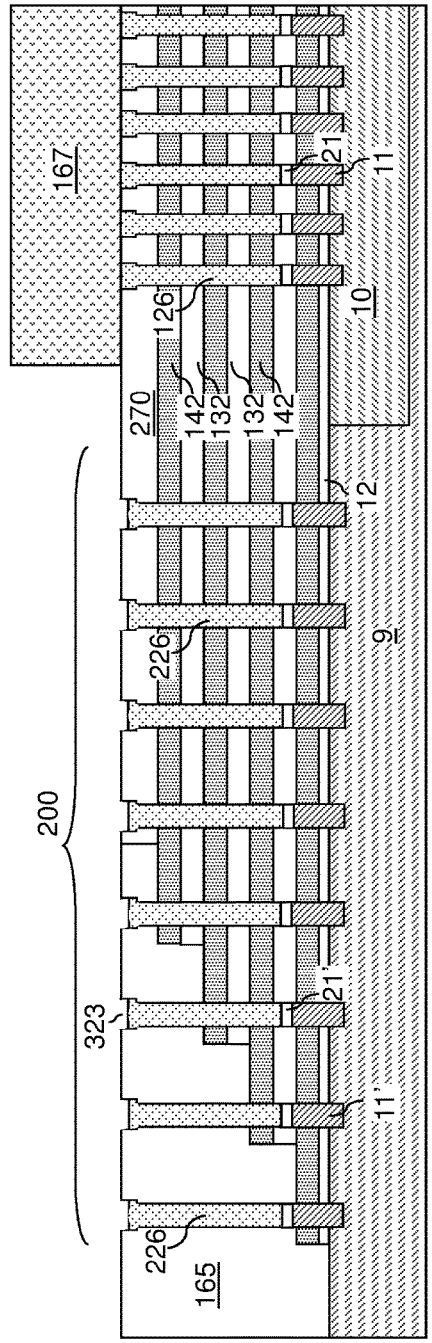
FIG. 32B is a vertical cross-sectional view of the second exemplary structure of FIG. 32A along the vertical plane B-B'.

Referring to FIGS. 32A and 32B, a mask layer 167 is formed over the second exemplary structure to cover the memory opening fill material portions 126, while not covering the support opening fill material portions 226. The mask layer 167 can be a patterned photoresist layer. In this case, the photoresist layer can be applied over the entire top surface of the second exemplary structure, and can be lithographically patterned (by exposure and development) to cover the memory opening fill material portions 126 in the first memory openings 121 while not covering the support opening fill material portions 226 in the first support openings 221.

A recess etch process is performed to vertically recess the top portions of the support opening fill material portions 226 selective to the first-tier dielectric cap layer 270 and the first retro-stepped dielectric material portion 165 while the memory opening fill material portions 126 are masked by the mask layer 167. The depth of the formed recesses can be selected such that each cavity 323 formed by the recess etch process has a lesser depth than the thickness of the first-tier dielectric cap layer 270. The mask layer 167 can be subsequently removed, for example, by ashing.

Figure 33A:
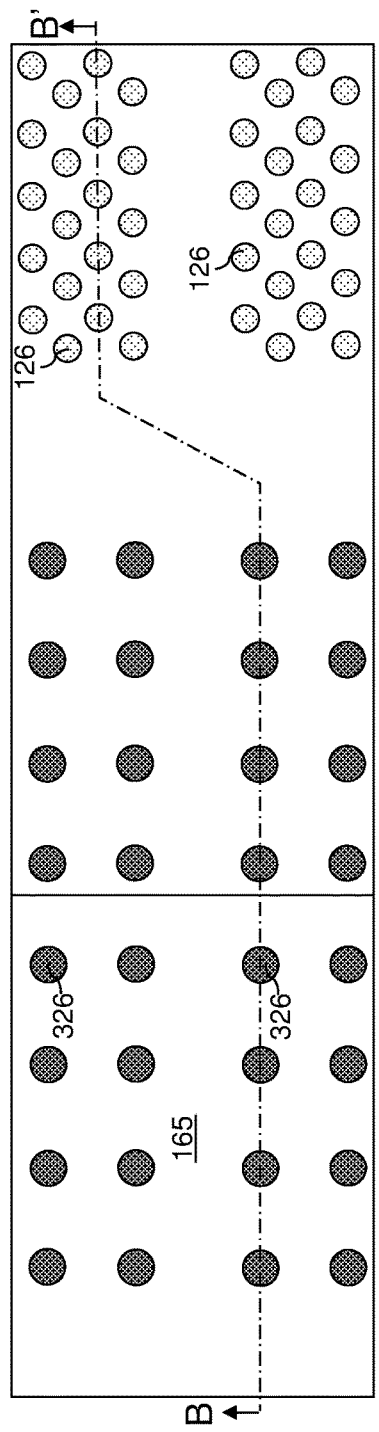
FIG. 33A is a top-down view of the second exemplary structure after forming dielectric material portions according to the second embodiment of the present disclosure.
Figure 33B:
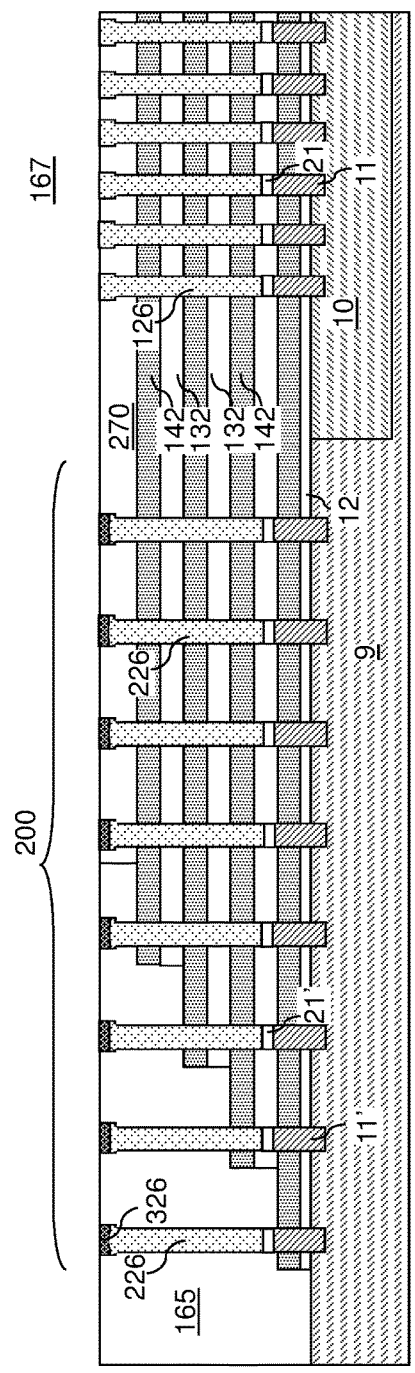
FIG. 33B is a vertical cross-sectional view of the second exemplary structure of FIG. 33A along the vertical plane B-B'.
Figure 33C:
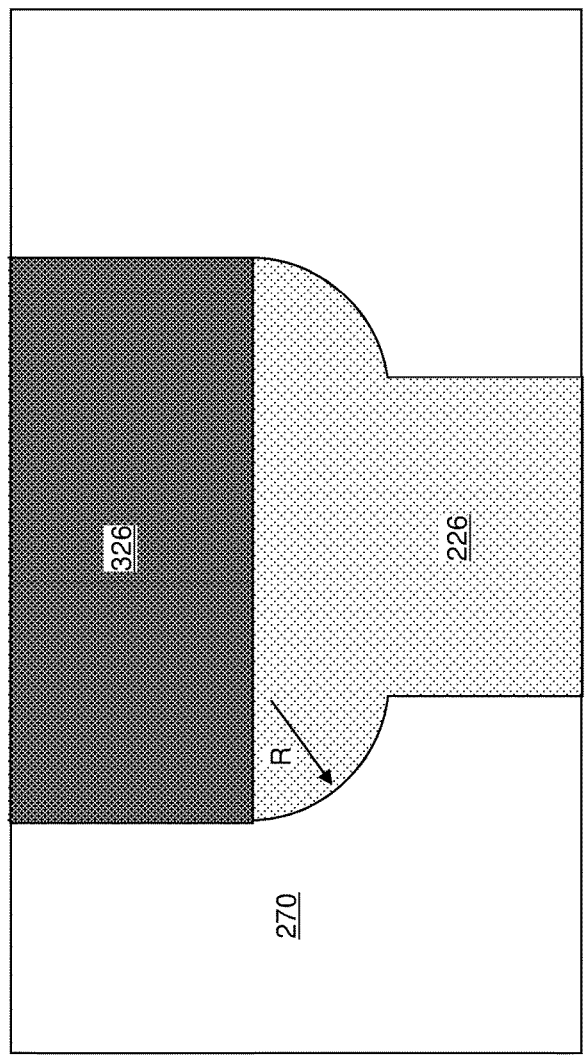
FIG. 33C is a magnified vertical cross-sectional view of a dielectric material portion.

Referring to FIGS. 33A-33C, a dielectric material portion 326 can be deposited within each cavity 323 formed by the recess etch process. The dielectric material portion 326 includes a dielectric material that is more etch resistance to silicon oxide to an etch process to be subsequently employed to etch memory films. In one embodiment, the dielectric material portions 326 can include a dielectric metal oxide such as aluminum oxide, hafnium oxide, tantalum pentoxide, etc. The dielectric material portions 326 can be formed, for example, by depositing a dielectric material to fill the recessed cavities overlying remaining portions of the support opening fill material portions 226, and by performing a planarization process such as CMP or etch back, i.e., by removing excess portions of the deposited dielectric material from above the horizontal plane including the top surface of the first-tier dielectric cap layer 270. In one embodiment, an optional anneal process can be performed after the planarization process to enhance etch resistivity of the material of the dielectric material portions 326. For example, the dielectric material of the dielectric material portions can be deposited as an amorphous material (such as amorphous aluminum oxide) and can be converted into a polycrystalline material (such as polycrystalline aluminum oxide) by an anneal process after the planarization process.

Each dielectric material portion 326 can be formed within a recess cavity 323 in a respective first support opening 221, and directly on a remaining portion of a respective support opening fill material portion 226. In one embodiment, the top surfaces of the dielectric material portions 326 and the top surfaces of the memory opening fill material portion 126 can be within the same horizontal plane as the top surfaces of the first tier structure (132, 142, 270, 165). In one embodiment, the dielectric material portions 326 can comprise a dielectric metal oxide.

Figure 34A:
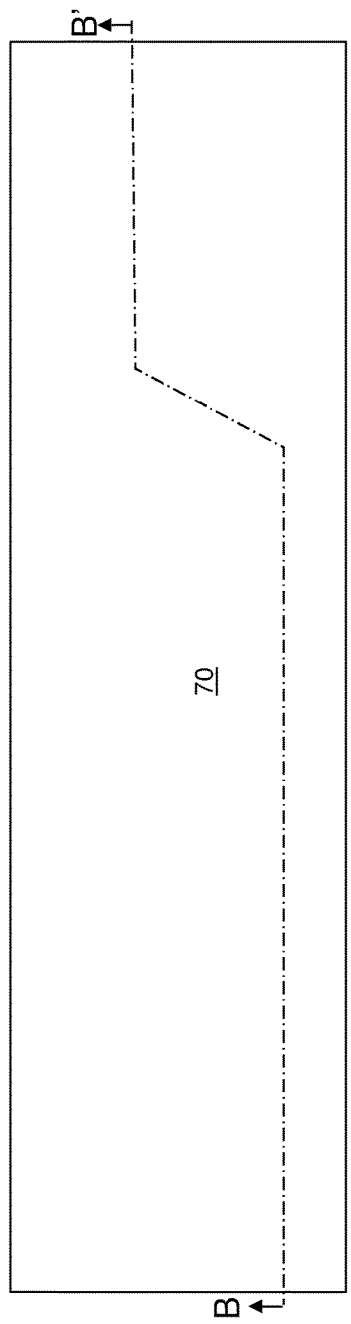
FIG. 34A is a top-down view of the second exemplary structure after formation of a second alternating stack of second insulating layers and second sacrificial material layers according to the second embodiment of the present disclosure.
Figure 34B:
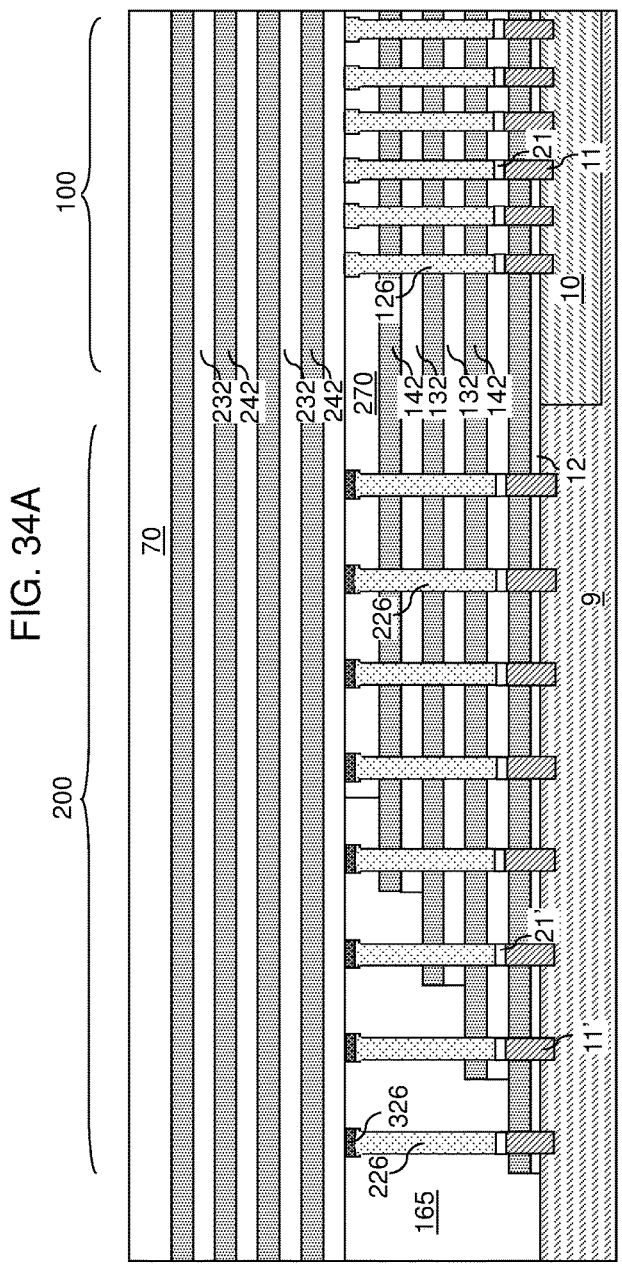
FIG. 34B is a vertical cross-sectional view of the second exemplary structure of FIG. 34A along the vertical plane B-B'.

Referring to FIGS. 34A and 34B, the processing steps of FIS. 12A and 12B can be performed to form a second alternating stack of second insulating layers 232 and second sacrificial material layers 242 and a second-tier dielectric cap layer 70 as in the first embodiment.

Referring to FIGS. 35A and 35B, the processing steps of FIGS. 13A and 13B can be performed to form second stepped surfaces and a second retro-stepped dielectric material portion 265 as in the first embodiment. A second tier structure (232, 242, 70, 265) is formed, which includes a second alternating stack of the second insulating layers 232 and the second sacrificial material layers 242, a second-tier dielectric cap layer 70, and the second retro-stepped dielectric material portion 265.

Referring to FIGS. 36A and 36B, the processing steps of FIGS. 14A and 14B can be formed to form second memory openings 141 and second support openings 241 as in the first embodiment. The second support openings 241 overlie the first support openings 221 and the dielectric material portions 326 therein, and the second memory openings overlies the first memory openings 121 and the memory opening fill material portions 126 therein.

Referring to FIGS. 37A and 37B, the memory opening fill material portions 126 can be removed from underneath the second memory openings 141 without removing the dielectric material portions 326. An isotropic etch or an anisotropic etch may be performed to remove the memory opening fill material portions 126 selective to the materials of the insulating layers (132, 232), the sacrificial material layers (142, 242), the second tier dielectric cap layer 70, the first tier dielectric cap layer 270, and the dielectric material portions 326. In case the memory opening fill material portions 126 include a semiconductor material such as silicon or a silicon-germanium alloy, a wet etch process employing a KOH solution can be employed to remove the memory opening fill material portions 126.

Each vertically adjoined pair of a first memory opening 121 and a second memory opening 141 constitutes an inter-tier memory opening (121, 141). Each vertically adjoined pair of a first support opening 221 and a second support opening 241 constitutes an inter-tier support opening (221, 241). A stack of a first epitaxial pedestal 11 and a first semiconductor oxide portion 21 is located at a bottom portion of each inter-tier memory opening (121, 141). A stack of a second epitaxial pedestal 11', a second semiconductor oxide portion 21', a support opening fill material portion 226, and a dielectric material portion 326 is located in each first support opening 221, which is a lower portion of a respective inter-tier support opening (221, 241).

Each inter-tier memory opening (121, 141) extends through the entirety of the first alternating stack (132, 142, 270, 165) and the second alternating stack (232, 242, 70, 265). Likewise, each inter-tier support opening (221, 241) extends through the entirety of the first alternating stack (132, 142, 270, 165) and the second alternating stack (232, 242, 70, 265). Unfilled portions of the inter-tier memory openings (121, 141) are herein referred to as memory cavities 49. Unfilled portions of the inter-tier support openings (221, 241) coincide with the second support openings 241. Thus, removal of the support opening fill material portions 226 from underneath the second memory openings 141 forms the memory cavities 49, while the volume of each second memory opening 241 remains unchanged. The unfilled volume of each inter-tier support opening (221, 241) is herein referred to as a support cavity 149. In one embodiment, the dielectric material of the dielectric material portions 326 can act as etch stop portions that provide sufficient etch resistivity to the etch processes that form the second memory openings 141 and that remove the fill material of the memory opening fill material portions 126 so that collateral etch of the dielectric material portions 326 is negligible. In this case, the volume of each support cavity 149 can substantially coincide with the volume of a respective second support opening 241.

Each memory cavity 49 extends through a respective second memory opening 141 and an upper portion of an underlying first memory opening 121, while each support cavity 149 is bounded by a top surface of a respective dielectric material portion 326. A bottommost surface of each memory cavity 49 is more proximal to a horizontal plane including the top surface of the substrate (9, 10) than a bottommost surface of each support cavity 149 is to the horizontal plane including the top surface of the substrate (9, 10).

FIG. 38A shows a vertical cross-sectional view of the memory cavity 49 in the inter-tier memory opening (121, 141) after the processing steps of FIGS. 37A and 37B. FIG. 38B shows a vertical cross-sectional view of the support cavity 149 in the inter-tier support opening (221, 241) after the processing steps of FIGS. 37A and 37B.

Referring to FIGS. 39A and 39B, the processing steps of FIGS. 17A and 17B can be performed to form a layer stack of material layers (52, 54, 56) for forming a memory film and a first semiconductor channel layer 601 as in the first embodiment. The layer stack of material layers (52, 54, 56) can include a blocking dielectric layer 52, a memory material layer 54, and a tunneling dielectric layer 56 as in the first embodiment.

Referring to FIGS. 40A and 40B, the processing steps of FIGS. 18A and 18B can be performed to remove horizontal portions of the first semiconductor channel layer 601 and the layer stack of the material layers (52, 54, 56). The dielectric material portions 326 can be etch stop portions which are more etch-resistant to the anisotropic etch employed to remove horizontal portions of the first semiconductor channel layer 601 and the layer stack of the material layers (52, 54, 56) than the first semiconductor oxide portions 21. Additionally or alternatively, the dielectric material portions 326 can be thicker than the first semiconductor oxide portions 21. The duration of the anisotropic etch process after the blocking dielectric layer 52 is etched through is selected such that the first semiconductor oxide portions 21 are etched through to physically expose a surface of an underlying first epitaxial pedestal 11, while dielectric material portions 326 are not etched through.

A set of a blocking dielectric layer 52, a memory material layer 54, and a tunneling dielectric layer 56 in each of the inter-tier memory openings (121, 141) constitutes a memory film 50, which includes a plurality of charge storage regions (as embodied as the memory material layer 54) that are insulated from surrounding materials by the blocking dielectric layer 52 and the tunneling dielectric layer 56. A set of a blocking dielectric layer 52, a memory material layer 54, and a tunneling dielectric layer 56 in each of the inter-tier support openings (221, 241) constitutes a dielectric layer stack 150, which includes an instance of a same set of layers as an instance of the memory film 50. In one embodiment, the first semiconductor channel layer 601, the tunneling dielectric layer 56, the memory material layer 54, and the blocking dielectric layer 52 can have vertically coincident sidewalls.

Referring to FIGS. 41A and 41B, the processing steps of FIGS. 19A and 19B can be performed to form a second semiconductor channel layer 602 and a dielectric core layer 62L.

Referring to FIGS. 42A and 42B, the processing steps of FIGS. 20A and 20B can be performed to remove portions of the dielectric core layer 62L and the second semiconductor channel layer 602 located above the horizontal plane including the top surface of the second-tier dielectric cap layer 70.

Each adjoining pair of a first semiconductor channel layer 601 and a second semiconductor channel layer 602 in an inter-tier memory opening (121, 141) collectively form a vertical semiconductor channel 60. Each adjoining pair of a first semiconductor channel layer 601 and a second semiconductor channel layer 602 in an inter-tier support opening (221, 241) collectively form a vertical semiconductor layer 160. The vertical semiconductor channel 60 with each inter-tier memory opening (121, 141) is subsequently electrically connected to a respective contact via structure. The vertical semiconductor layer 160 with each inter-tier support opening (221, 241) is not subsequently electrically connected to any contact via structure, and remains electrically floating. Within each inter-tier memory opening (121, 141), electrical current can flow through a vertical semiconductor channel 60 when a vertical NAND device including the vertical semiconductor channel 60 is turned on.

Within each inter-tier memory opening (121, 141) and each inter-tier support opening (221, 241), a tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 within the inter-tier memory openings (121, 141) collectively constitute a memory film 50. Each adjoining set of a blocking dielectric layer 52, a memory material layer 54, and a tunneling dielectric layer 56 within the inter-tier support openings (221, 241) collectively constitute a dielectric layer stack 150. Each memory film 50 within an inter-tier memory opening (121, 141) can store electrical charges with a macroscopic retention time. Each dielectric layer stack 150 within an inter-tier support opening (221, 241) is an inactive component that functions merely as an insulating film. In some embodiments, a blocking dielectric layer 52 may not be present in the memory film 50 and the dielectric layer stack 150 at this step, and a blocking dielectric layer may be subsequently formed after formation of backside recesses.

In one embodiment, a first epitaxial pedestal 11 can be formed at a bottom portion of each first memory opening 121 and directly on the substrate (9, 10), and a vertical semiconductor channel 60 can be formed directly on a portion of the first epitaxial pedestal 11. A second epitaxial pedestal 11' can be formed at a bottom portion of each first support opening 221 concurrently with formation of the first epitaxial pedestals 11, and a bottommost surface of a vertical semiconductor layer 160 can be formed above, and is vertically spaced from, any material of the second epitaxial pedestal 11' by the second semiconductor oxide portion 21', the support opening fill material portion 226, and the dielectric material portion (i.e., etch stop) 326.

In one embodiment, each memory stack structure 55 comprises a memory film 50 including a first layer stack (52, 54, 56), and each support pillar structure comprises a second layer stack (52, 54, 56) such that each layer within the second layer stack (52, 54, 56) has a same thickness and a same material composition as a corresponding layer within the first layer stack (52, 54, 56). Each second layer stack (52, 54, 56) can be formed directly on a top surface of a respective dielectric material portion 326.

Referring to FIGS. 43A and 43B, the processing steps of FIGS. 21A and 21B can be performed to form first dielectric cores 62, second dielectric cores 162, drain regions 63, and dummy drain regions 163. Each drain region 63 within an inter-tier memory opening (121, 141) is a top active region of a vertical field effect transistor including a respective vertical semiconductor channel 60. Each dummy drain region 163 within an inter-tier support opening (221, 241) is electrically inactive. Each dummy drain region 163 in the inter-tier support openings (221, 241) is not subsequently contacted by any contact via structure. The drain regions 63 and the dummy drain regions 163 can have the same material composition. In one embodiment, the drain regions 63 and the dummy drain regions 163 can be heavily doped. In one embodiment, the drain regions 63 and the dummy drain regions 163 can include electrical dopants (p-type dopants or n-type dopants) at an atomic concentration greater than $5.0 \times 10^{19}/cm^3$.

Each contiguous set of a memory film 50, a vertical semiconductor channel 60, and an optional first dielectric core 62 formed within an inter-tier memory opening (121, 141) constitutes a memory stack structure 55. Each contiguous set of a second semiconductor oxide portion 21', a support opening fill material portion 226, a dielectric material portion 326, a dielectric layer stack 150, a vertical semiconductor layer 160, an optional second dielectric core 162, and a dummy drain region 163 formed within an inter-tier support opening (221, 241) constitutes a support pillar structure 155.

Each support pillar structure 155 can be located within a respective support opening, i.e., an inter-tier support opening (221, 241). The support pillar structure 155 comprises a vertical semiconductor layer 160 comprising the same material as a vertical semiconductor channel 60, and a dielectric material portion 326 that electrically isolates the vertical semiconductor layer 160 from the substrate (9, 10). In one embodiment, the dielectric material portions 326 can be dielectric metal oxide portions that are embedded within a topmost layer within the first tier structure (132, 142, 270, 165) such as the first-tier dielectric cap layer 270.

In one embodiment, each support cavity 149 as formed at the processing steps of FIGS. 37A and 37B can extend through the entirety of the second tier structure (232, 242, 270, 265) but not below the horizontal plane including the top surface of the topmost first sacrificial material layer 142 (i.e., the horizontal plane including the bottom surface of the first-tier dielectric cap layer 270), and each vertical semiconductor layer 160 does not extend through an underlying dielectric material portion 326. The vertical semiconductor layers 160 may, or may not, protrude into the dielectric material portions 326.

Referring to FIGS. 44A and 44B, the second exemplary structure is illustrated after formation of memory stack structures 55 and support pillar structures 155, drain regions 63, and dummy drain regions 163. Each memory stack structure 55 is formed in a respective memory cavity 49 while elements of the support pillar structures 155 are formed in the support cavities 149.

Figures 45A, 45B:
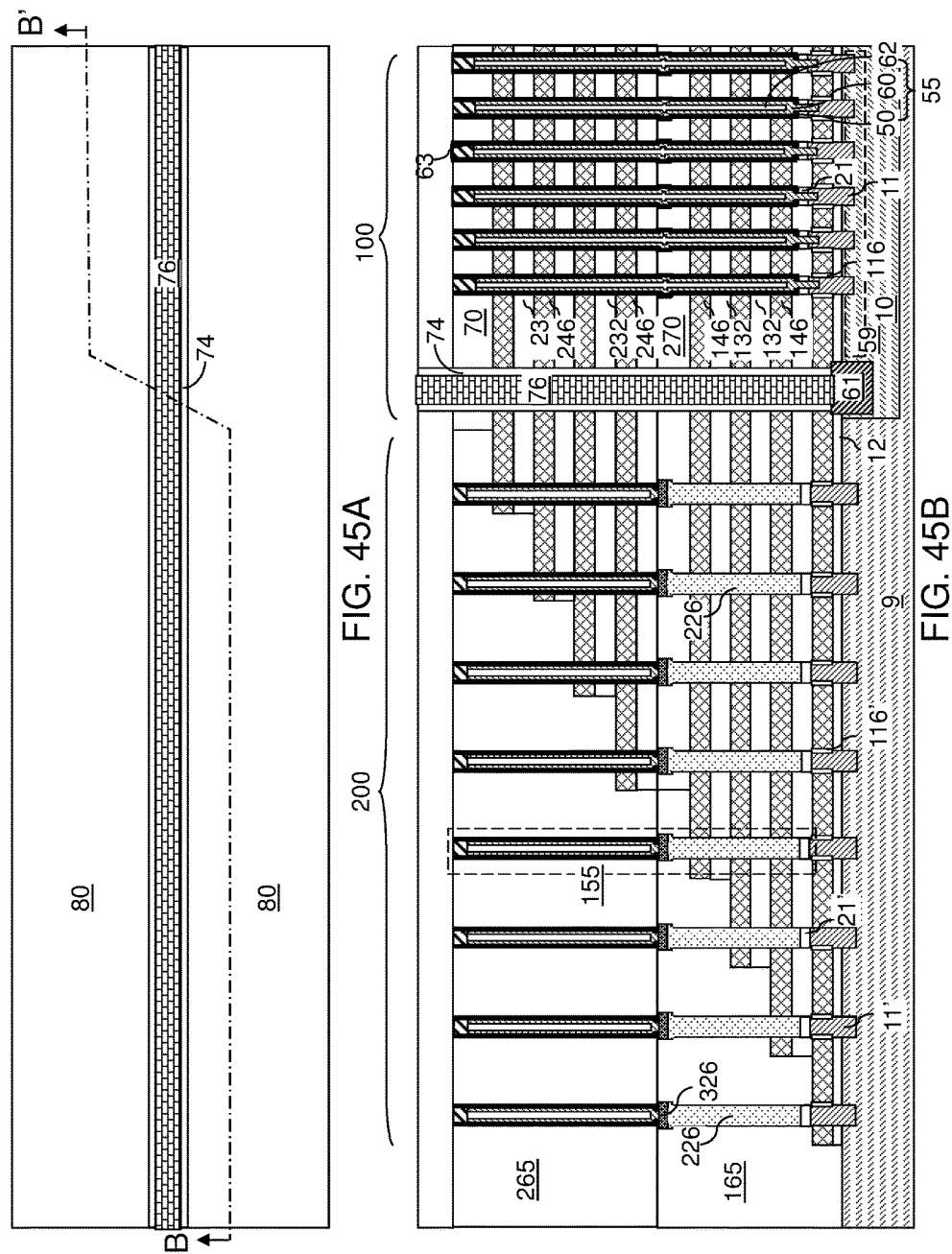
FIG. 45A is a top-down view of the second exemplary structure after formation of first and second electrically conductive layers, an insulating spacer, a source region, and a backside contact via structure according to the second embodiment of the present disclosure.
FIG. 45B is a vertical cross-sectional view of the second exemplary structure of FIG. 45A along the vertical plane B-B'.

Referring to FIGS. 45A and 45B, the processing steps of FIGS. 23A, 23B, 24A, 24B, 25A, 25B, 26A, 26B, 27A, and 27B are performed to replace the first and second sacrificial material layers (142, 242) with first and second electrically conductive layers (146, 246), and to form a contact level dielectric layer 80, a source region 61, an insulating spacer 74, and a backside contact via structure 76 as in the first embodiment.

Referring to FIGS. 46A and 46B, the processing steps of FIGS. 28A and 28B can be performed to form additional contact via structures (86, 88) as in the first embodiment.

The various exemplary structures of the present disclosure can include a three-dimensional memory device. The three-dimensional memory device can include a first tier structure (132, 146, 270, 165) comprising a first alternating stack of first insulating layers 132 and first electrically conductive layers 146 and located over a substrate (9, 10); a second tier structure (232, 246, 70, 265) comprising a second alternating stack of second insulating layers 232 and second electrically conductive layers 246 and located over the first tier structure (132, 1466, 270, 165); a memory opening (121, 141) vertically extending through an entirety of the first tier structure (132, 146, 270, 165) and the second tier structure (232, 246, 70, 265) to a top surface of the substrate (9, 10); a support opening (221, 241) vertically extending through the entirety of the first tier structure (132, 146, 270, 165) and the second tier structure (232, 246, 70, 265) to the top surface of the substrate (9, 10) and laterally offset from the memory openings (121, 141); a memory stack structure 55 located within the memory opening (121, 141) and comprising a vertical semiconductor channel 60 that is electrically connected (i.e., directly or indirectly shorted) to a horizontal semiconductor channel 59 located within the substrate (9, 10); and a support pillar structure 155 located within the support opening (221, 241) and comprising a vertical semiconductor layer 160 comprising a same material as the vertical semiconductor channel 60 and a dielectric material portion (21' or 326) that electrically isolates the vertical semiconductor layer 160 from the substrate (9, 10) (e.g., from the a horizontal semiconductor channel 59 in the substrate (9, 10)).

In one embodiment, a bottommost surface of the vertical semiconductor channel 60 is more proximal to a horizontal plane including to the top surface of the substrate (9, 10) than a bottommost surface of the vertical semiconductor layer 160 is to the horizontal plane including to the top surface of the substrate (9, 10).

In one embodiment, the three-dimensional memory device can further include a first epitaxial pedestal 11 located at a bottom portion of the memory opening (121, 141) and contacting the vertical semiconductor channel 60 and the substrate (9, 10), and a second epitaxial pedestal 11' located at a bottom portion of the support opening (221, 241) and comprising a same material as the first epitaxial pedestal 11 and vertically spaced from a bottommost surface of the vertical semiconductor layer 160.

In one embodiment, the first epitaxial pedestal 11 has a greater height than the second epitaxial pedestal 11', and the vertical semiconductor layer 160 vertically extends through each of the second electrically conductive layers 246 and a subset of the first electrically conductive layers 146 as illustrated in the first exemplary structure. In one embodiment, the vertical semiconductor layer 160 does not extend through all of the first electrically conductive layers 146.

In one embodiment, the first epitaxial pedestal 11 can have a substantially same height as the second epitaxial pedestal 11', and the vertical semiconductor layer 160 vertically extends through each of the second electrically conductive layers 246 and does not extend below a horizontal plane including a top surface of a topmost first electrically conductive layer 146 as illustrated in the second exemplary structure.

In one embodiment, the three-dimensional memory device can include a first semiconductor oxide portion 21 having an annular shape and laterally surrounding a bottom portion of the vertical semiconductor channel 60 that extends through the opening in the first semiconductor oxide portion 21. The dielectric material portion (21', 326) in this embodiment comprises the second semiconductor oxide portion 21' underlying the vertical semiconductor layer 160 and having a same composition as the first semiconductor oxide portion 21 and embodied as, or underlies, the dielectric material portion (21' or 326).

In the first exemplary structure, the dielectric material portion 21' has a greater height than the first semiconductor oxide portion 21, and the vertical semiconductor layer 160 vertically extends through each of the second electrically conductive layers 246 and a subset of the first electrically conductive layers 146.

In some embodiments, the top surface of the dielectric material portion (as embodied as a second semiconductor oxide portion 21') is located between a topmost layer among the first electrically conductive layers 146 and a bottommost layer among the first electrically conductive layers 146 as in the first exemplary structure. In one embodiment, the dielectric material portion 21' comprises a semiconductor oxide material doped with electrical dopants.

In the second exemplary structure, the dielectric material portion (21', 326) comprises the dielectric metal oxide etch stop portion 326. In this embodiment, the second semiconductor oxide portion 21' underlies the dielectric material portion 326 and has a substantially same height as the first semiconductor oxide portion 21, and the vertical semiconductor layer 160 vertically extends through each of the second electrically conductive layers 246 and does not extend below a horizontal plane including a top surface of a topmost first electrically conductive layer 146, which can be the horizontal plane including the bottom surface of the first-tier dielectric cap layer 270.

In one embodiments, the memory stack structure 55 comprises a memory film 50 including a first layer stack ((52, 54, 56), and the support pillar structure 155 comprises a second layer stack (52, 54, 56). Each layer within the second layer stack (52, 54, 56) has a same thickness and a same material composition as a corresponding layer within the first layer stack (52, 54, 56). In one embodiment, a bottommost surface of the second layer stack (52, 54, 56) contacts a top surface of the dielectric material portion 326.

In some embodiments, the top surface of the dielectric material portion (as embodied as a dielectric material portion 326 of the second exemplary structure) is within a same horizontal plane as an interface between the first tier structure (132, 146, 275, 165) and the second tier structure (232, 246, 75, 265). In one embodiment, the dielectric material portion 326 comprises a dielectric metal oxide, such as aluminum oxide. A support opening fill material portion 226 (which can include an undoped semiconductor material, i.e., a semiconductor material that is not intentionally doped) and an epitaxial pedestal 11' can underlie the dielectric material portion 326, and can be located within the support opening (221, 241).

In one embodiment, a terrace region can be provided, in which each electrically conductive layer (146, 246) other than a topmost electrically conductive layer within the first and second alternating stacks (132, 146, 232, 246) laterally extends farther than any overlying electrically conductive layer within the first and second alternating stacks (132, 146, 232, 246). The terrace region includes stepped surfaces of the first and second alternating stacks (132, 146, 232, 246) that continuously extend from a bottommost layer within the first and second alternating stacks (132, 146, 232, 246) to a topmost layer within the first and second alternating stacks (132, 146, 232, 246). Each of the support pillar structures 155 can extend through the stepped surfaces and through a respective retro-stepped dielectric material portion (165 or 265) that overlies the stepped surfaces. Each of the word line contact via structures 86 can contact a respective electrically conductive layer among the first and second electrically conductive layers (146, 246) in the terrace region.

Each of the first and second exemplary structures can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a memory material layer 54 at a level of an electrically conductive layer 46) in a first device level of the array of monolithic three-dimensional NAND strings can be located over another memory cell (as embodied as another portion of the memory material layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as portions of the memory material layer located at levels of the electrically conductive layers 46). Each charge storage element can be located adjacent to a respective one of the plurality of semiconductor channels (59, 11, 60).

The exemplary structures of the present disclosure electrically isolates the vertical semiconductor layers 160 of the support pillar structures 155 from the substrate (9, 10) by dielectric material portions (21' or 326), thereby eliminating, or reducing, leakage current from the electrically conductive layers (146, 246) to the substrate (9, 10) through the support pillar structures 155. Thus, the exemplary structures of the present disclosure can be advantageously employed to enhance device performance and/or to increase yield and/or reliability of a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a first tier structure comprising a first alternating stack of first insulating layers and first electrically conductive layers and located over a substrate;
a second tier structure comprising a second alternating stack of second insulating layers and second electrically conductive layers and located over the first tier structure;
a memory opening vertically extending through an entirety of the first tier structure and the second tier structure to a top surface of the substrate;
a support opening vertically extending through the entirety of the first tier structure and the second tier structure to the top surface of the substrate and laterally offset from the memory openings;

a memory stack structure located within the memory opening and comprising a vertical semiconductor channel that is electrically shorted to a horizontal semiconductor channel located within the substrate;

a support pillar structure located within the support opening and comprising a vertical semiconductor layer comprising a same material as the vertical semiconductor channel and a dielectric material portion that electrically isolates the vertical semiconductor layer from the substrate; and a first epitaxial pedestal located at a bottom portion of the memory opening and contacting the vertical semiconductor channel and the substrate; and a second epitaxial pedestal located at a bottom portion of the support opening and comprising a same material as the first epitaxial pedestal and vertically spaced from a bottommost surface of the vertical semiconductor layer, wherein:

the first epitaxial pedestal has a greater height than the second epitaxial pedestal; and the three-dimensional memory device comprises a feature selected from:

a first feature that the vertical semiconductor layer vertically extends through each of the second electrically conductive layers and a subset of the first electrically conductive layers; and a second feature that the first epitaxial pedestal has a substantially same height as the second epitaxial pedestal, and the vertical semiconductor layer vertically extends through each of the second electrically conductive layers and does not extend below a horizontal plane including a top surface of a topmost first electrically conductive layer.

2. The three-dimensional memory device of claim 1, wherein:

the dielectric material portion electrically isolates the vertical semiconductor layer from horizontal semiconductor channel located within the substrate; and a bottommost surface of the vertical semiconductor channel is more proximal to a horizontal plane including the top surface of the substrate than a bottommost surface of the vertical semiconductor layer is to the horizontal plane.

3. The three-dimensional memory device of claim 1, wherein the three-dimensional memory device comprises the first feature.

4. The three-dimensional memory device of claim 1, wherein the three-dimensional memory device comprises the second feature.

5. The three-dimensional memory device of claim 1, further comprising a first semiconductor oxide portion having an annular shape and laterally surrounding a bottom portion of the vertical semiconductor channel, wherein the dielectric material portion comprises a second semiconductor oxide portion underlying the vertical semiconductor layer having a same composition as the first semiconductor oxide portion.

6. The three-dimensional memory device of claim 5, wherein:

the second semiconductor oxide portion has a greater height than the first semiconductor oxide portion; and the vertical semiconductor layer vertically extends through each of the second electrically conductive layers and a subset of the first electrically conductive layers.

7. The three-dimensional memory device of claim 5, further comprising a metal oxide etch stop portion located above the second semiconductor oxide portion, wherein:

the second semiconductor oxide portion underlies the metal oxide etch stop portion; and the vertical semiconductor layer vertically extends through each of the second electrically conductive layers and does not extend below a horizontal plane including a top surface of a topmost first electrically conductive layer.

8. The three-dimensional memory device of claim 5, wherein the second semiconductor oxide portion comprises boron, phosphorus or arsenic doped silicon oxide.

9. The three-dimensional memory device of claim 1, wherein:

the memory stack structure comprises a memory film including a first layer stack;

the support pillar structure comprises a second layer stack, wherein each layer within the second layer stack has a same thickness and a same material composition as a corresponding layer within the first layer stack; and a bottommost surface of the second layer stack contacts a top surface of the dielectric material portion.

10. The three-dimensional memory device of claim 9, wherein the top surface of the dielectric material portion is located between a topmost layer among the first electrically conductive layers and a bottommost layer among the first electrically conductive layers.

11. The three-dimensional memory device of claim 9, wherein:

the top surface of the dielectric material portion is within a same horizontal plane as an interface between the first tier structure and the second tier structure; and the dielectric material portion comprises a dielectric metal oxide etch stop portion.

12. The three-dimensional memory device of claim 11, further comprising a support opening fill material portion and an epitaxial pedestal located within the support opening and underlying the dielectric material portion.

13. The three-dimensional memory device of claim 1, wherein:

the three-dimensional memory device comprises a monolithic three-dimensional NAND memory device;

the first and second electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the first and second electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:
- a plurality of semiconductor channels, wherein at least one end portion of each of the plurality of semiconductor channels extends substantially perpendicular to a top surface of the substrate; and
- a plurality of charge storage elements, each charge storage element located adjacent to a respective one of the plurality of semiconductor channels.

14. A three-dimensional memory device comprising:
a first tier structure comprising a first alternating stack of first insulating layers and first electrically conductive layers and located over a substrate;
a second tier structure comprising a second alternating stack of second insulating layers and second electrically conductive layers and located over the first tier structure;
a memory opening vertically extending through an entirety of the first tier structure and the second tier structure to a top surface of the substrate;
a support opening vertically extending through the entirety of the first tier structure and the second tier structure to the top surface of the substrate and laterally offset from the memory openings;
a memory stack structure located within the memory opening and comprising a vertical semiconductor channel that is electrically shorted to a horizontal semiconductor channel located within the substrate;
a support pillar structure located within the support opening and comprising a vertical semiconductor layer comprising a same material as the vertical semiconductor channel and a dielectric material portion that electrically isolates the vertical semiconductor layer from the substrate;
a first semiconductor oxide portion having an annular shape and laterally surrounding a bottom portion of the vertical semiconductor channel, wherein the dielectric material portion comprises a second semiconductor oxide portion underlying the vertical semiconductor layer having a same composition as the first semiconductor oxide portion;
a metal oxide etch stop portion located above the second semiconductor oxide portion, wherein:
the second semiconductor oxide portion underlies the metal oxide etch stop portion; and
the vertical semiconductor layer vertically extends through each of the second electrically conductive layers and does not extend below a horizontal plane including a top surface of a topmost first electrically conductive layer.

15. The three-dimensional memory device of claim 14, wherein:
the dielectric material portion electrically isolates the vertical semiconductor layer from horizontal semiconductor channel located within the substrate; and
a bottommost surface of the vertical semiconductor channel is more proximal to a horizontal plane including the top surface of the substrate than a bottommost surface of the vertical semiconductor layer is to the horizontal plane.

16. The three-dimensional memory device of claim 14, further comprising:

a first epitaxial pedestal located at a bottom portion of the memory opening and contacting the vertical semiconductor channel and the substrate; and
a second epitaxial pedestal located at a bottom portion of the support opening and comprising a same material as the first epitaxial pedestal and vertically spaced from a bottommost surface of the vertical semiconductor layer, wherein:
the first epitaxial pedestal has a greater height than the second epitaxial pedestal; and
the vertical semiconductor layer vertically extends through each of the second electrically conductive layers and a subset of the first electrically conductive layers.

17. The three-dimensional memory device of claim 14, further comprising:
a first epitaxial pedestal located at a bottom portion of the memory opening and contacting the vertical semiconductor channel and the substrate; and
a second epitaxial pedestal located at a bottom portion of the support opening and comprising a same material as the first epitaxial pedestal and vertically spaced from a bottommost surface of the vertical semiconductor layer, wherein:
the first epitaxial pedestal has a substantially same height as the second epitaxial pedestal; and
the vertical semiconductor layer vertically extends through each of the second electrically conductive layers and does not extend below a horizontal plane including a top surface of a topmost first electrically conductive layer.

18. The three-dimensional memory device of claim 14, wherein:
the second semiconductor oxide portion has a greater height than the first semiconductor oxide portion; and
the vertical semiconductor layer vertically extends through each of the second electrically conductive layers and a subset of the first electrically conductive layers.

19. The three-dimensional memory device of claim 14, wherein:
the memory stack structure comprises a memory film including a first layer stack;
the support pillar structure comprises a second layer stack, wherein each layer within the second layer stack has a same thickness and a same material composition as a corresponding layer within the first layer stack; and
a bottommost surface of the second layer stack contacts a top surface of the dielectric material portion.

20. The three-dimensional memory device of claim 14, wherein:
the three-dimensional memory device comprises a monolithic three-dimensional NAND memory device;
the first and second electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the first and second electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate; and a plurality of charge storage elements, each charge storage element located adjacent to a respective one of the plurality of semiconductor channels.

21. A three-dimensional memory device comprising:

a first tier structure comprising a first alternating stack of first insulating layers and first electrically conductive layers and located over a substrate;

a second tier structure comprising a second alternating stack of second insulating layers and second electrically conductive layers and located over the first tier structure;

a memory opening vertically extending through an entirety of the first tier structure and the second tier structure to a top surface of the substrate;

a support opening vertically extending through the entirety of the first tier structure and the second tier structure to the top surface of the substrate and laterally offset from the memory openings;

a memory stack structure located within the memory opening and comprising a vertical semiconductor channel that is electrically shorted to a horizontal semiconductor channel located within the substrate; and a support pillar structure located within the support opening and comprising a vertical semiconductor layer comprising a same material as the vertical semiconductor channel and a dielectric material portion that electrically isolates the vertical semiconductor layer from the substrate, wherein:

the memory stack structure comprises a memory film including a first layer stack;

the support pillar structure comprises a second layer stack, wherein each layer within the second layer stack has a same thickness and a same material composition as a corresponding layer within the first layer stack; and a bottommost surface of the second layer stack contacts a top surface of the dielectric material portion, wherein the top surface of the dielectric material portion is located between a topmost layer among the first electrically conductive layers and a bottommost layer among the first electrically conductive layers.

22. The three-dimensional memory device of claim 21, wherein:

the top surface of the dielectric material portion is within a same horizontal plane as an interface between the first tier structure and the second tier structure; and the dielectric material portion comprises a dielectric metal oxide etch stop portion.

23. The three-dimensional memory device of claim 22, further comprising a support opening fill material portion and an epitaxial pedestal located within the support opening and underlying the dielectric material portion.

24. The three-dimensional memory device of claim 21, wherein:

the dielectric material portion electrically isolates the vertical semiconductor layer from horizontal semiconductor channel located within the substrate; and a bottommost surface of the vertical semiconductor channel is more proximal to a horizontal plane including the top surface of the substrate than a bottommost surface of the vertical semiconductor layer is to the horizontal plane.

25. The three-dimensional memory device of claim 21, further comprising a first semiconductor oxide portion having an annular shape and laterally surrounding a bottom portion of the vertical semiconductor channel, wherein:

the dielectric material portion comprises a second semiconductor oxide portion underlying the vertical semiconductor layer having a same composition as the first semiconductor oxide portion.

26. The three-dimensional memory device of claim 25, wherein:

the second semiconductor oxide portion has a greater height than the first semiconductor oxide portion; and the vertical semiconductor layer vertically extends through each of the second electrically conductive layers and a subset of the first electrically conductive layers.

* * * * *